US008193076B2

(12) United States Patent
Moslehi et al.

(10) Patent No.: US 8,193,076 B2
(45) Date of Patent: Jun. 5, 2012

(54) METHOD FOR RELEASING A THIN SEMICONDUCTOR SUBSTRATE FROM A REUSABLE TEMPLATE

(75) Inventors: Mehrdad M. Moslehi, Los Altos, CA (US); David Xuan-Qi Wang, Fremont, CA (US); Sam Tone Tor, Pleasanton, CA (US); Karl-Josef Kramer, San Jose, CA (US)

(73) Assignee: Solexel, Inc., Milpitas, CA (US)

( * ) Notice: Subject to any disclaimer, the term of this patent is extended or adjusted under 35 U.S.C. 154(b) by 1 day.

(21) Appl. No.: 12/826,641

(22) Filed: Jun. 29, 2010

(65) Prior Publication Data

US 2011/0021006 A1    Jan. 27, 2011

Related U.S. Application Data

(63) Continuation-in-part of application No. 12/473,811, filed on May 28, 2009, now Pat. No. 7,745,313, which is a continuation-in-part of application No. 11/868,489, filed on Oct. 6, 2007.

(60) Provisional application No. 61/056,722, filed on May 28, 2008, provisional application No. 60/828,678, filed on Oct. 9, 2006, provisional application No. 61/327,563, filed on Apr. 23, 2010.

(51) Int. Cl.
*H01L 21/20* (2006.01)
(52) U.S. Cl. ............... 438/479; 438/458; 257/E21.568; 257/E21.569; 257/E21.57
(58) Field of Classification Search .................. 438/479, 438/458; 257/E21.568, E21.569, E21.57
See application file for complete search history.

(56) References Cited

U.S. PATENT DOCUMENTS

| | | | |
|---|---|---|---|
| 3,641,648 A * | 2/1972 | Kalberman | 228/6.2 |
| 4,043,894 A | 8/1977 | Gibbs | |
| 4,070,206 A | 1/1978 | Kressel et al. | |
| 4,082,570 A | 4/1978 | House et al. | |
| 4,165,252 A | 8/1979 | Gibbs | |

(Continued)

FOREIGN PATENT DOCUMENTS

JP     06-260670 A    9/1994
(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Matthew Landau
*Assistant Examiner* — Robert Bachner
(74) *Attorney, Agent, or Firm* — Hulsey, P.C.; William N. Hulsey, III; Loren T. Smith

(57) ABSTRACT

The present disclosure relates to methods and apparatuses template. The method involves forming a mechanically weak layer conformally on a semiconductor template. Then forming a thin for releasing a thin semiconductor substrate from a reusable semiconductor substrate conformally on the mechanically weak layer. The thin semiconductor substrate, the mechanically weak layer and the template forming a wafer. Then defining the border of the thin-film semiconductor substrate to be released by exposing the peripheral of the mechanically weak layer. Then releasing the thin-film semiconductor substrate by applying a controlled air flow parallel to said mechanically weak layer wherein the controlled air flow separates the thin semiconductor substrate and template according to lifting forces.

7 Claims, 41 Drawing Sheets

U.S. PATENT DOCUMENTS

| | | | |
|---|---|---|---|
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,409,423 A | 10/1983 | Holt |
| 4,427,839 A | 1/1984 | Hall |
| 4,461,922 A | 7/1984 | Gay et al. |
| 4,479,847 A | 10/1984 | McCaldin et al. |
| 4,626,613 A | 12/1986 | Wenham et al. |
| 4,672,023 A | 6/1987 | Leung |
| 4,922,277 A | 5/1990 | Carlson |
| 5,024,953 A | 6/1991 | Uematsu et al. |
| 5,073,230 A | 12/1991 | Maracas et al. |
| 5,112,453 A | 5/1992 | Behr et al. |
| 5,208,068 A | 5/1993 | Davis |
| 5,248,621 A | 9/1993 | Sano |
| 5,316,593 A | 5/1994 | Olson et al. |
| 5,348,618 A | 9/1994 | Canham et al. |
| 5,397,400 A | 3/1995 | Matsuno et al. |
| 5,459,099 A | 10/1995 | Hsu |
| 5,494,832 A | 2/1996 | Lehmann et al. |
| 5,538,564 A | 7/1996 | Kaschmitter |
| 5,645,684 A | 7/1997 | Keller |
| 5,660,680 A | 8/1997 | Keller |
| 5,681,392 A | 10/1997 | Swain |
| 5,882,988 A | 3/1999 | Haberern et al. |
| 5,928,438 A | 7/1999 | Salami |
| 6,058,945 A | 5/2000 | Fujiyama et al. |
| 6,091,021 A | 7/2000 | Ruby |
| 6,096,229 A | 8/2000 | Shahid |
| 6,114,046 A | 9/2000 | Hanoka |
| 6,127,623 A | 10/2000 | Nakamura et al. |
| 6,204,443 B1 | 3/2001 | Kiso et al. |
| 6,225,193 B1 | 5/2001 | Simpson et al. |
| 6,294,725 B1 | 9/2001 | Hirschberg et al. |
| 6,331,208 B1 | 12/2001 | Nishida et al. |
| 6,399,143 B1 | 6/2002 | Sun et al. |
| 6,416,647 B1 | 7/2002 | Dordi et al. |
| 6,429,037 B1 | 8/2002 | Wenham et al. |
| 6,441,297 B1 | 8/2002 | Keller et al. |
| 6,448,155 B1 | 9/2002 | Iwasaki et al. |
| 6,461,932 B1 | 10/2002 | Wang |
| 6,524,880 B2 | 2/2003 | Moon et al. |
| 6,534,336 B1 | 3/2003 | Iwane |
| 6,555,443 B1 | 4/2003 | Artmann et al. |
| 6,566,235 B2 | 5/2003 | Nishida et al. |
| 6,602,760 B2 | 8/2003 | Poortmans et al. |
| 6,602,767 B2 | 8/2003 | Nishida et al. |
| 6,613,148 B1 | 9/2003 | Rasmussen |
| 6,624,009 B1 | 9/2003 | Green et al. |
| 6,645,833 B2 * | 11/2003 | Brendel ... 438/458 |
| 6,649,485 B2 | 11/2003 | Solanki et al. |
| 6,653,722 B2 | 11/2003 | Blalock |
| 6,664,169 B1 | 12/2003 | Iwasaki et al. |
| 6,756,289 B1 | 6/2004 | Nakagawa et al. |
| 6,881,644 B2 | 4/2005 | Malik et al. |
| 6,946,052 B2 | 9/2005 | Yanagita et al. |
| 6,964,732 B2 | 11/2005 | Solanki |
| 7,022,585 B2 | 4/2006 | Solanki et al. |
| 7,026,237 B2 | 4/2006 | Lamb |
| 7,309,658 B2 | 12/2007 | Lazovsky et al. |
| 7,368,756 B2 | 5/2008 | Bruhns et al. |
| 7,402,523 B2 | 7/2008 | Nishimura |
| 2002/0153039 A1 | 10/2002 | Moon et al. |
| 2002/0168592 A1 | 11/2002 | Vezenov |
| 2002/0179140 A1 | 12/2002 | Toyomura |
| 2003/0017712 A1 | 1/2003 | Brendel |
| 2003/0039843 A1 | 2/2003 | Johnson |
| 2003/0124761 A1 | 7/2003 | Baert |
| 2004/0028875 A1 | 2/2004 | Van Rijn |
| 2004/0173790 A1 | 9/2004 | Yeo |
| 2004/0259335 A1 | 12/2004 | Narayanan |
| 2004/0265587 A1 | 12/2004 | Koyanagi |
| 2005/0160970 A1 | 7/2005 | Niira |
| 2005/0172998 A1 | 8/2005 | Gee et al. |
| 2005/0176164 A1 | 8/2005 | Gee et al. |
| 2005/0177343 A1 | 8/2005 | Nagae |
| 2005/0199279 A1 | 9/2005 | Yoshimine et al. |
| 2005/0272225 A1 | 12/2005 | Weber et al. |
| 2005/0274410 A1 | 12/2005 | Yuuki et al. |
| 2005/0281982 A1 | 12/2005 | Li |
| 2006/0021565 A1 | 2/2006 | Zahler et al. |
| 2006/0043495 A1 | 3/2006 | Uno |
| 2006/0054212 A1 | 3/2006 | Fraas et al. |
| 2006/0070884 A1 | 4/2006 | Momoi et al. |
| 2006/0105492 A1 | 5/2006 | Veres et al. |
| 2006/0177988 A1 | 8/2006 | Shea et al. |
| 2006/0196536 A1 | 9/2006 | Fujioka |
| 2006/0231031 A1 | 10/2006 | Dings et al. |
| 2006/0266916 A1 | 11/2006 | Miller et al. |
| 2006/0283495 A1 | 12/2006 | Gibson |
| 2007/0077770 A1 | 4/2007 | Wang et al. |
| 2007/0082499 A1 | 4/2007 | Jung et al. |
| 2008/0047601 A1 | 2/2008 | Nag et al. |
| 2008/0128641 A1 | 6/2008 | Henley et al. |
| 2008/0157283 A1 | 7/2008 | Moslehi |
| 2008/0210294 A1 | 9/2008 | Moslehi |
| 2008/0264477 A1 | 10/2008 | Moslehi |
| 2008/0289684 A1 | 11/2008 | Moslehi |
| 2008/0295887 A1 | 12/2008 | Moslehi |
| 2009/0042320 A1 | 2/2009 | Wang et al. |
| 2009/0107545 A1 | 4/2009 | Moslehi |
| 2009/0301549 A1 | 12/2009 | Moslehi |
| 2010/0022074 A1 | 1/2010 | Wang et al. |
| 2010/0116316 A1 | 5/2010 | Moslehi et al. |

FOREIGN PATENT DOCUMENTS

| | | |
|---|---|---|
| JP | 2002-2299661 A | 10/2002 |
| WO | PCT/EP1999/008573 | 5/2000 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, Jul. 8, 2005, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovoalic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

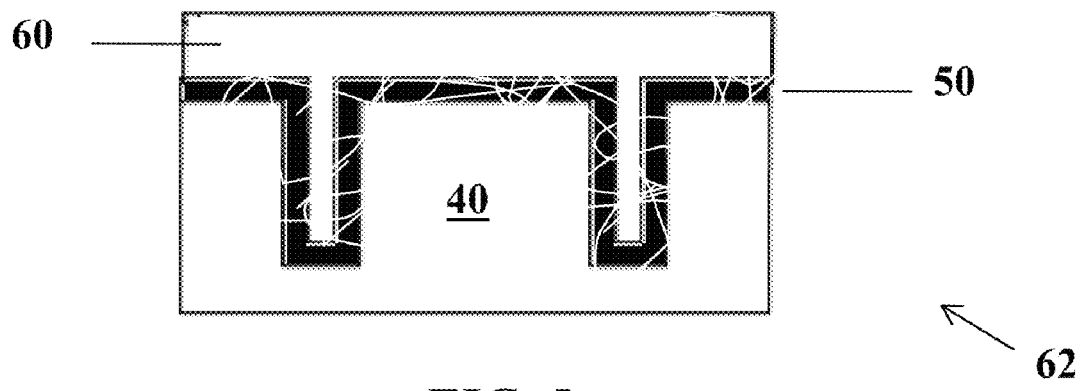
*FIG. 5*
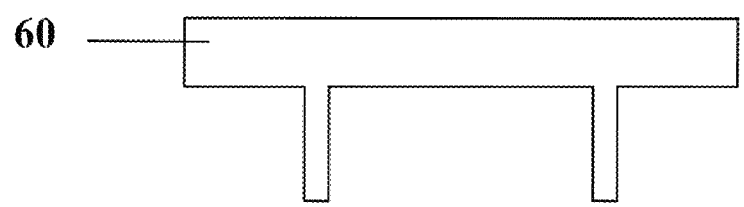
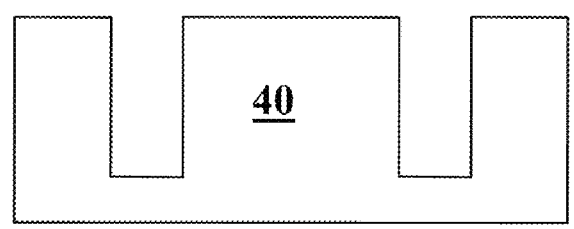
*FIG. 6*

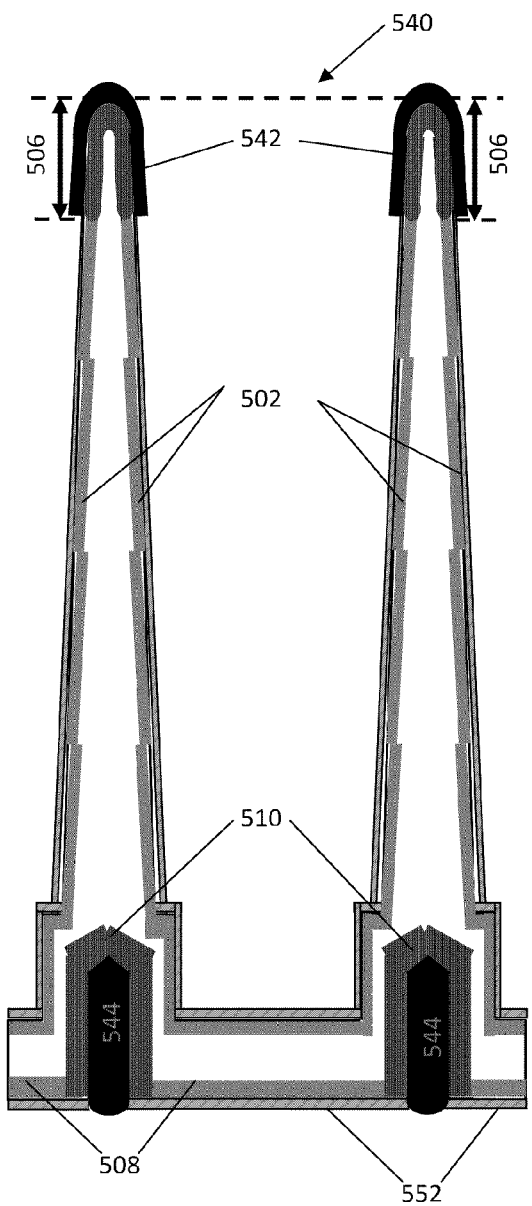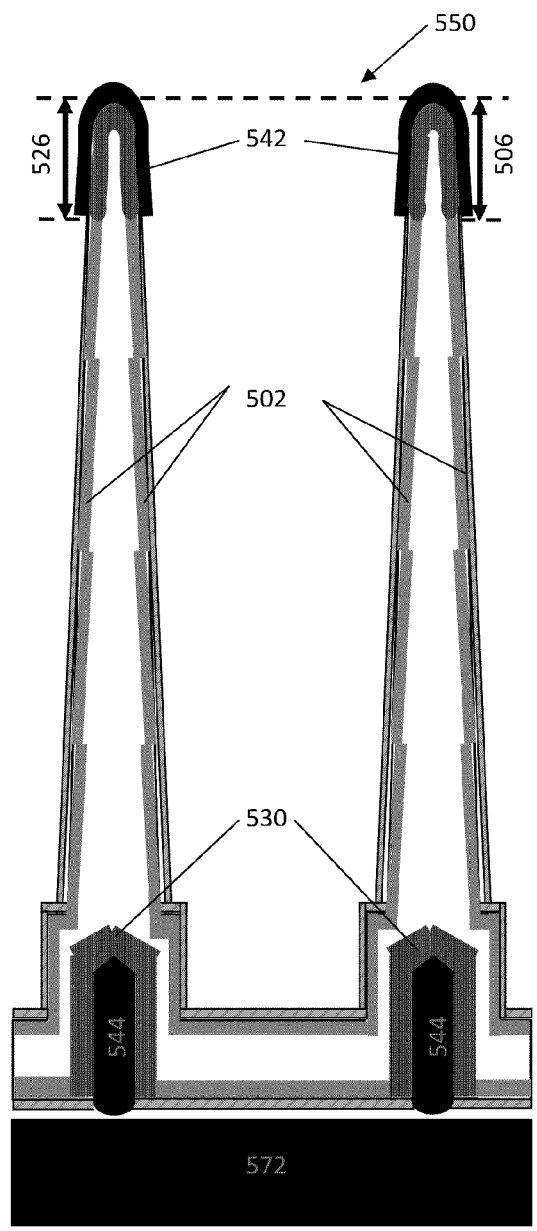
*FIG. 34A*  *FIG. 34B*

METHOD FOR RELEASING A THIN SEMICONDUCTOR SUBSTRATE FROM A REUSABLE TEMPLATE

CROSS-REFERENCE TO RELATED APPLICATIONS

This application claims priority to and is a continuation in part of pending U.S. patent application Ser. No. 12/473,811 "SUBSTRATE RELEASE METHODS AND APPARATUSES", filed on May 28, 2009, which is incorporated herein by reference in its entirety and made part of the present U.S. Utility patent application for all purposes.

This application claims priority to and is a continuation in part of pending U.S. patent application Ser. No. 11/868,489 "METHODS FOR MANUFACTURING THREE-DIMENSIONAL THIN-FILM SOLAR CELLS", (U.S. Patent Pub. No. 2008/0264477A1) by Mehrdad Moslehi and filed on Oct. 6, 2007, which is incorporated herein by reference in its entirety and made part of the present U.S. Utility patent application for all purposes.

This application also claims the benefit of provisional patent application 61/327,563 filed on Apr. 23, 2010, which is hereby incorporated by reference in its entirety.

FIELD OF THE INVENTION

This disclosure relates in general to the field of photovoltaic and electronic device manufacturing. More specifically, releasing a thin film semiconductor substrate from a re-usable template utilizing a controlled air flow.

BACKGROUND OF THE INVENTION

Separating one silicon layer from another silicon layer by fracturing a thin and mechanically weak/fragile intermediate silicon layer has been widely known in making silicon-on-insulator (SOI) wafers for producing semiconductor devices. However, prior methods have several drawbacks. For example, most prior art methods require a planar intermediate layer separating the device layer and the substrate layer. U.S. application Ser. No. 11/868,489 having common inventor, Mehrdad Moslehi, of the present disclosure discloses a 3-D thin-film semiconductor device where prior art manufacturing methods may not be suitable.

Instead of having a flat porous silicon layer, the honeycomb 3-D TFSS and the template wafer comprise three-dimensional microstructures with high-aspect-ratio deep trenches made into the silicon template. As a result, the effective interface area between porous silicon layer and nonporous silicon layers is at least five times larger than that of a flat substrate. The large interface area per unit volume increases the magnitude of external energy/force that is required for fracturing the porous silicon layer. Prior art methods may not be suited to fracture the porous silicon, while mitigating damage to both the template and 3-D TFSS.

In addition, most release methods in the prior arts require a mechanical supporting plate bonded or attached by adhesive on top of the thin epitaxial silicon layer to be released. In addition to serving as a mechanical support, the bonded top plate may also absorb the external energy and generate a stress on the layer to be released. Without the top supporting plate, many of the prior art release methods are either less effective or cause mechanical damage to the released thin-film. U.S. patent application Ser. No. 11/868,489, entitled "METHODS FOR MANUFACTURING THREE-DIMENSIONAL THIN-FILM SOLAR CELLS" by Mehrdad Moslehi and incorporated by reference herein, discloses a 3-D TFSS which is not conducive to the use of a top supporting plate for release and post-release processes because: (i) it is not convenient to bond a supporting plate on top of the square 3-D TFSS to be released while preventing the supporting plate from attaching to the wafer surface outside of the 3-D TFSS square; (ii) it is difficult to de-bond the supporting plate from the released 3-D TFSS. In the case that the bonding adhesive has to be wet removed, extensive cleaning may need to be performed to prevent adhesive contaminations to the honeycomb surfaces.

Further, most of the release methods in the prior arts initiate a single separation front in the porous silicon layer at the beginning of release that propagates through the entire wafer to complete the release. In most cases, the separation front starts from the wafer perimeter and the released portion of the epitaxial silicon layer curves upward as the separation progresses towards to the wafer center. Such a release mechanism works well for a planar release, however it does not work for the 3-D TFSS release for the following reasons: (i) because of its three dimensional structural design, the early released portion of honey-comb structure can not be tilted. A slight out-of-plane curving by an external force or an intrinsic stress will have the 3-D TFSS locked into the template and prevent a full release; (ii) larger external energy/force applied unevenly to the partially released and locked-in 3-D TFSS could cause mechanical damages. Therefore, the release energy/force should be uniform and applied in a well controlled manner for the 3-D TFSS release.

It is known that the mechanical strength of porous silicon depends on the porosity of the layer, and that porous silicon mechanical strength is sufficiently lower than that of nonporous silicon. As an example, a porous silicon layer having a porosity of 50% may have a mechanical strength about one-half of that of a corresponding bulk silicon layer. When a porous silicon layer is subjected to compressive, tensile, or shearing forces, it can be fractured, collapsed, or mechanically destroyed. A porous silicon layer, which has higher porosity, can be fractured with less applied stress.

One method for collapsing the mechanically weak porous silicon layer employs injecting the porous layer with a fluid. This method not only succumbs to the difficulties of the prior art method mentioned above, but is also complex and requires precise alignment of the fluid injection nozzle with the porous silicon layer so as not to damage the thin-film layer.

In another prior art method, a process of manufacturing a SOI wafer includes separating a wafer assembly into two wafers at a fragile silicon layer containing a high amount of hydrogen. The separation energy source can be selected from a group consisting of: ultrasound, infrared, hydrostatic pressure, hydrodynamic pressure, or mechanical energy. Also, yet another prior art method applies a force to a laminating material separating a nonporous silicon and porous silicon layer to separate the two layers.

Besides succumbing to the disadvantages mentioned previously, these methods may often damage the template layer which is undesirable for releasing TFSS substrate of U.S. application Ser. No. 11/868,489. Other advantages of the present disclosure may be apparent to those skilled in the art.

Patent applications U.S. Pat. Pub. No. 2008/0264477 and U.S. Pat. Pub. No. 2009/0107545 by common inventor Mehrdad M. Moslehi disclose methods of making solar cells using thin crystalline silicon substrates that require releasing/separation of the thin crystalline silicon substrates from reusable silicon templates. The purpose of the present disclosure is to provide methods and apparatus for releasing/separation of the said substrates from the corresponding templates.

According to the disclosed patent application, there exists a thin mechanically-weak layer that physically connects the thin substrate and template across their lateral interface. Examples of the thin mechanically-weak layer include, but are not limited to, a porous silicon layer having a uniform or multiple-level porosities. The separation of the substrate and template requires cleaving through the mechanically-weak layer between the substrate and the template by breaking off the micro-structures in the mechanically-weak layer. Due to the large lateral interface area between the thin substrate and template, it usually requires a large vertical pulling force to separate the substrate from the template by direct vertical pulling, in which case the micro-structures that connect the substrate and the template within the mechanically-weak layer are broken simultaneously. In many cases, the required direct-vertical pulling force may be larger than the chucking forces that hold the substrate and the template on the opposite sides during pulling. For example, vacuum chucks are used for chucking the substrate and the template from their opposite sides for pulling, and the required pulling pressure (force/unit contact surface area) to separate the substrate and the template may be larger than the vacuum chucking pressure of maximum 100 kPa. In addition, large pulling forces may create mechanical shock waves and cause the thin substrate to break during the pulling. Because semiconductor thin substrates are fragile in nature, they have tendency to crack with small mechanical shock or shearing impacts. Furthermore, bending and deflection with large angles during the releasing/separation process may also cause cracking of the thin substrate.

Semiconductor thin substrates are fragile in nature and they have tendency to crack with small mechanical shock or shearing impacts. In addition, the cracking of thin semiconductor substrates most likely initiates from their defect regions, especially edge defects such as micro-cracking at substrate edges. Therefore the prevention of cracking initiation at substrate edges is critical. In order to prevent cracking of a thin semiconductor substrate during the said substrate releasing/separation process, the understanding of the micro-structural characteristics of the buried mechanically-weak layer is important:

The mechanical strength of the micro-structures within the mechanically-weak layer is not uniform across attached substrate and template. There exist some regions in the said layer that are weaker than its surrounding regions. For example, in the case the mechanically-weak layer is a bi-level porous silicon layers that has a high porosity (60% to 80%) porous silicon layer on the template side and a low porosity (10% to 30%) porous silicon layer on the substrate side, the porosity values are not uniform from center to edge of the template. In addition, after baking at elevated temperatures and epitaxial silicon growth around 1000° C., the porous silicon layers are coalesce and/or disintegrated to various degrees across template surface. Therefore the mechanical strength of the said thin layer is not uniform from locations to locations within a wafer and across the wafer. FIGS. 42A and 42B illustrate the top and cross-sectional schematic views of the various mechanical strength regions in the mechanically-weak layer; the mechanical strength non-uniformity of the mechanically-weak layer may vary from wafer to wafer and from batch to batch; and during the releasing process, new weaker portions may be generated and existing weaker portions may be enlarged or further weakened by the direct releasing forces and indirect energy waves from the releasing process. In other words, the weakest mechanical strength portions at any given moment of the releasing process are generated and varied dynamically. FIGS. 43A and 43B illustrate the top and cross-sectional schematic views of the various mechanical strength regions corresponding to FIGS. 42A and 42B with newly and dynamically generated weaker portions in the mechanically-weak layer during the releasing process.

Current thin substrate releasing methods assume the mechanical strength of the mechanically-weak layer is uniform across the entire wafer (substrate and template assembly) and along the periphery of the substrate and template interfaces. With this assumption, the initial cleaving/releasing is randomly chosen from the wafer edge and the continuation of the cleaving is forced to propagate from this randomly chosen starting point. As a result, any substrate or substrate region at any given moment may not be released from the locations and the directions that have the weakest local mechanical strength in the mechanically-weak layer. Therefore the release yields are low and cracking of the thin substrate often happens.

SUMMARY OF THE INVENTION

The following description is not to be taken in a limiting sense, but is made for the purpose of describing the general principles of the present disclosure. The scope of the present disclosure should be determined with reference to the claims. The methods of the present disclosure substantially reduce disadvantages of prior art methods, and are intended to separate a thin semiconductor substrate from a template using lifting forces by applying a controlled air flow. Further, the methods of the present disclosure aim to reduce damage to both the TFSS substrate and template while also minimizing complexity.

According to the present disclosure, controlled air flows that are mainly in the plane above and parallel to the substrate or template surface are applied to the thin semiconductor substrate or template surface. The air flows are controlled in continuous or cycling modes and their flow directions may also be changed during substrate releasing in a controlled manner. The lifting forces generated from the high-speed air flows are used to initiate and extend the thin substrate releasing from its weakest interface portions to strongest interface portions in a self-aligned releasing process. The self-aligned process is achieved by the mechanism that given a certain air flow on the substrate surfaces, the weakest portion of the mechanically-weak layer responses to the lifting forces more than the relatively stronger attached portions in any given moment of the releasing process. And the releasing front is automatically extended/propagated from the weakest portions to its surrounding regions until the thin substrate is fully released. Therefore, this releasing method that starts and continues from the weakest portions in the mechanically-weak layer is self-aligned. During releasing, the deflection of the partially released substrate or template is constrained so that cracking of the released portion is avoided.

According to the present disclosure, the wafer that consists of attached substrate and template is placed and chucked on a bottom plate by vacuum or electrostatic chucking forces. The substrate side of the wafer may face up or face down. A top plate is placed on top of the wafer surface while keeping a small gap between the bottom surface of the top plate and the top surface of the wafer. The dimension of said gap may be actively adjusted during the releasing process in a controlled manner for constraining the maximum deflection of the released substrate portions and for adjusting the air flows. The motion of the active gap adjustment may be achieved by hydraulic or motor driving. There may also be shallow grooves that are machined on the bottom surface of the top plate. And these shallow grooves are connected to a vacuum source so that the released substrate or template may be separated from its counterpart and vacuum chucked to the top plate. There is also single or plurality of through holes made into the top plate and these through holes are air inlets or outlets that are connected to vacuum or high pressure sources through flow controlling and regulating valves.

In one embodiment, the top plate and the bottom plate forms an enclosed high pressure chamber. There are also air inlets or outlets made on the bottom plate. In this case, air flows in the said gap will be generated when a compressed air pressure differential is made between the top plate and bottom plate air connections. Air flows can enter from the ports on the bottom plate, flow into the gap from wafer edge and exit from the ports on the top plate. Alternatively, air flows can enter from the ports on the top plate, flow out the gap at the wafer edge and exit from the ports on the bottom plate. Alternatively, the flow direction change may be applied during the releasing process. The purpose for the air flow control is to generate proper lifting force according to the requirement disclosed in the earlier section.

In yet another embodiment of the present disclosure, the sidewalls between the top and bottom plate are mainly open except the pillars to support the top plate and motion control units for the active gap control. In this case, the bottom plate is mainly served as a supporting plate and the wafer chucking plate. There are inlets or outlets holes made on the top plate and the top plate can be connected vacuum sources, high air pressure sources or both. In this open-system case, air flow can also be generated in the gap between the top plate and the wafer top surface for controlled releasing. And the released substrate and template will be vacuum chucked on the top and bottom plate separately.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages be included within this description and within the scope of the accompanying claims.

BRIEF DESCRIPTION OF DRAWINGS

The features, nature, and advantages of the disclosed subject matter may become more apparent from the detailed description set forth below when taken in conjunction with the drawings in which like reference characters identify correspondingly throughout and wherein:

FIGS. 2 through 6 show illustrative examples of the steps shown in the method of the present disclosure;

FIGS. 32A through 34B show Y-Y cross-sectional views of a unit cell within an embodiment of a single-aperture hexagonal-prism 3-D TFSS substrate including a rear base layer;

FIGS. 39A through 50 are not found in U.S. Pat. No. 7,745,313 of which the present disclosure is continuation-in-part application;

FIGS. 39A and 39B is a cross-sectional schematic drawing of embodiments of silicon wafers that consists of substantially planar thin film silicon substrate;

FIGS. 42A through 43B illustrate schematic views of a buried mechanically-weak layer under epitaxial silicon substrate layer;

FIG. 44 illustrates the schematic cross-sectional view of one of a thin-substrate releasing apparatus of the present disclosure;

FIG. 47 is a top schematic view of an embodiment of the bottom plate;

FIG. 48 is a top schematic view of an embodiment of the bottom vacuum chuck;

FIG. 49 illustrates the bottom schematic view of the top plate; and

FIG. 50 is a block diagram illustrating the major steps of releasing a thin substrate from a reusable template.

DETAILED DESCRIPTION OF THE PREFERRED EMBODIMENTS

Figure 1:
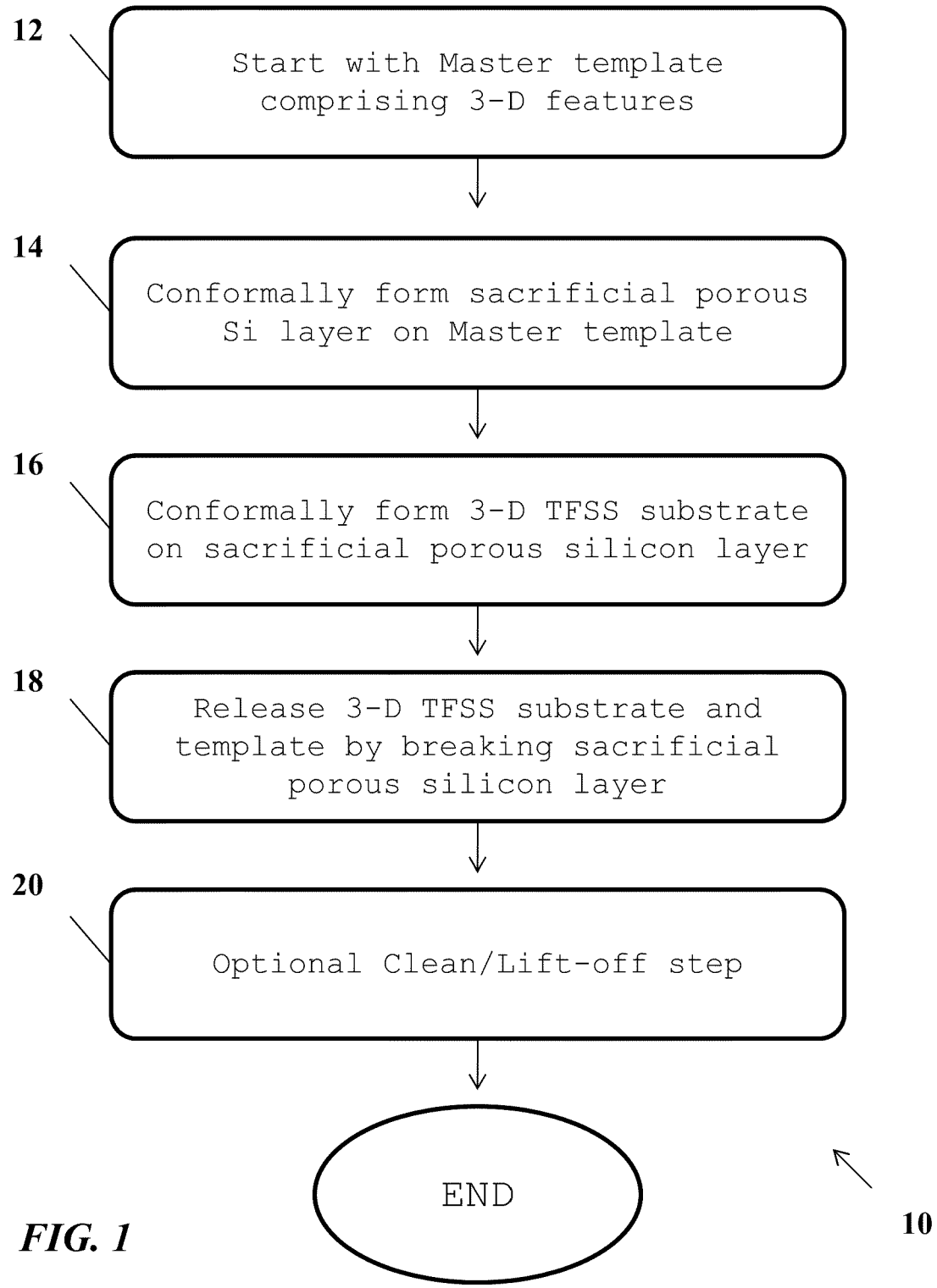
FIG. 1 shows an embodiment of a process flow for separating 3-D TFSS substrate from a 3-D crystalline silicon template.

The following description is not to be taken in a limiting sense, but is made for the purpose of describing the general principles of the present disclosure. The scope of the present disclosure should be determined with reference to the claims. And although described with reference to the manufacture and separation of three-dimensional thin-film semiconductor substrate (3-D TFSS), a person skilled in the art could apply the principles discussed herein to the manufacturing of any multi-dimensional substrate.

Preferred embodiments of the present disclosure are illustrated in the drawings, like numbers being used to refer to like and corresponding parts of the various drawings. The innovative 3-D TFSS substrate designs and technologies of the current disclosure are based on the use of a three-dimensional, self-supporting, semiconductor thin film, deposited on and released from a reusable crystalline (embodiments include, but are not limited to, monocrystalline or multicrystalline silicon) semiconductor template, and methods for separating a reusable crystalline semiconductor template and 3-D TFSS substrate.

A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials including but not limited to germanium, silicon germanium, silicon carbide, a crystalline compound semiconductor, or a combination thereof. Additional applications include copper indium gallium selenide (CIGS) and cadmium telluride semiconductor thin films.

Further, separation methods disclosed are intended to release a 3-D TFSS substrate from reusable crystalline silicon template through the use of a buried porous silicon layer. In particular, these methods fracture or break the buried porous silicon layer without damaging either the 3-D TFSS or reusable crystalline template. Additionally, a final lift-off or cleaning step may be applied to both the 3-D TFSS and reusable crystalline silicon template to diminish porous silicon residue on these layers. Although the separation methods of the present disclosure fracture a buried porous silicon layer to separate a 3-D TFSS substrate and a reusable crystalline silicon template, they may be used to separate any two layers, 3-D or planar, separated by a mechanically weak buried layer.

FIG. 1 shows example process flow 10 which realizes, at least partially, the embodiments of the present disclosure. Process flow 10 may be used to process one or more wafers at a time depending on cost, time, quality, and complexity considerations.

In step 12, a patterned 3-D template is provided. Step 14 of FIG. 1 involves forming a thin porous silicon sacrificial layer on template deep trenches (trench sidewalls and bottoms) using electrochemical hydrofluoric (HF) etching (also known as electrochemical anodization of silicon). The porous silicon layer may be formed by one of two primary techniques as follows: (i) deposit a thin conformal crystalline silicon layer (in one embodiment, a p-type boron-doped silicon layer in the range of 0.2 to 2 microns) on an n-type template substrate, using silicon epitaxy, followed by conversion of the p-type epitaxial layer to porous silicon using electrochemical HF etching; or (ii) convert a thin layer of the template substrate (in one embodiment, a p-type template) to porous silicon (in one embodiment, in the thickness range of 0.01 to 1 micron). The sacrificial porous silicon formed by one of these two techniques also serves as a seed layer for subsequent epitaxial silicon deposition of step 16.

TFSS substrate layer formation step 16 involves performing a hydrogen bake (at 950° to 1150° C.) to clean the surface and to form a continuous sealed monocrystalline surface layer on the surface of the porous silicon sacrificial layer, followed by depositing a blanket layer of doped silicon epitaxy (top only) in an epitaxial processing reactor. In one embodiment, the layer is p-type, boron-doped and has a thickness between 1 and 30 microns.

One aspect of the present disclosure concerns itself with improvements to release step 18 of FIG. 1. Improvements to release step 18 include minimal damage to TFSS substrate and template, ability to process 3-D features, and reduced need for a bonding plate traditionally used in the release process. These improvements follow from the methods and apparatuses to be described. Step 18 involves breaking the buried porous silicon layer to separate TFSS substrate and template. To facilitate complete porous silicon fracturing, step 18 may be repeated as necessary. Step 20 of FIG. 1 involves an optional lift-off step wherein the TFSS substrate and template are completely separated after porous silicon breaking step 18. In addition, step 20 could involve an optional cleaning step which removes porous silicon residue created on the TFSS substrate and the template by breaking step 18. Further, step 20 may be combined with step 18 to reduce processing time, cost, and complexity. Thus, process flow 20 produces an undamaged TFSS substrate and minimizes damage to the template.

Figure 2:
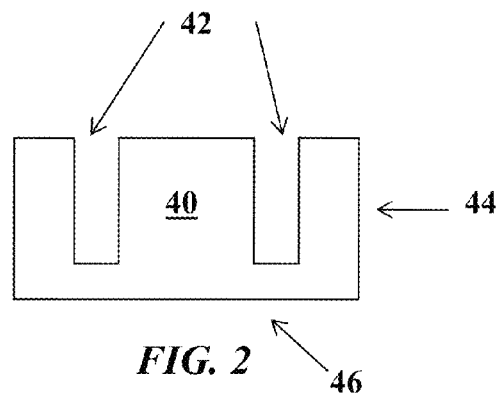
Figure 3:
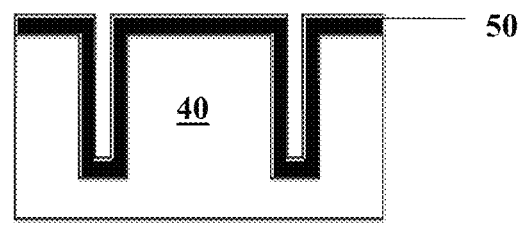
Figure 4:
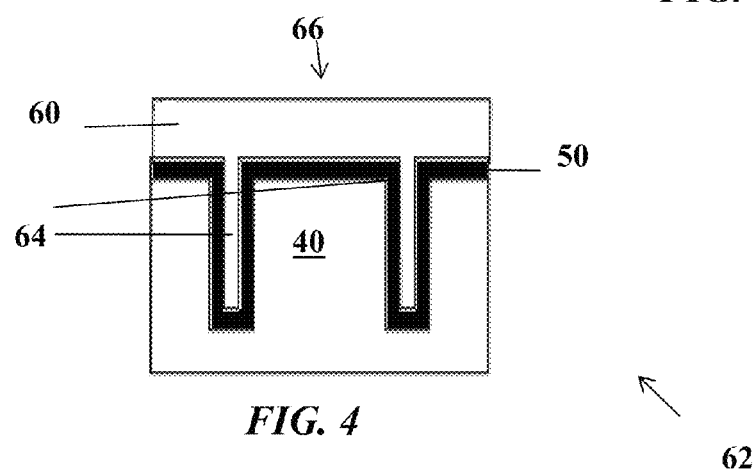

FIGS. 2 to 6 provide illustrative examples of process flow 10 (FIG. 1). FIG. 2 corresponds to step 12 of FIG. 1 and shows reusable crystalline silicon template 40. Template 40 comprises base 46, sidewalls 44, and 3-D features 42. The methods and apparatuses of the present disclosure minimize damage to template 40. FIG. 3, corresponding to step 14 of FIG. 1, shows porous silicon layer 50 formed conformal to template 40. FIG. 4 illustrates TFSS substrate 60 of step 16 (FIG. 1). TFSS substrate 60 comprises reverse 3-D features 64 of template 40, and may comprise base 64.

The term "Wafer" will be used to describe structure 62 herein, comprising buried porous silicon layer 50, template 40, and TFSS substrate 60. Additionally, TFSS substrate 60 and template 40 may be jointly referred to as "non-porous Si layers" herein.

FIG. 5 corresponds to step 18 of FIG. 2. The methods and apparatuses of the present disclosure are used to break porous silicon layer 50 without damaging TFSS substrate 60 and template 40. FIG. 6 illustrates the end products, released, undamaged TFSS substrate 60 and template 40, that result from step 20 of FIG. 1.

Figure 7:
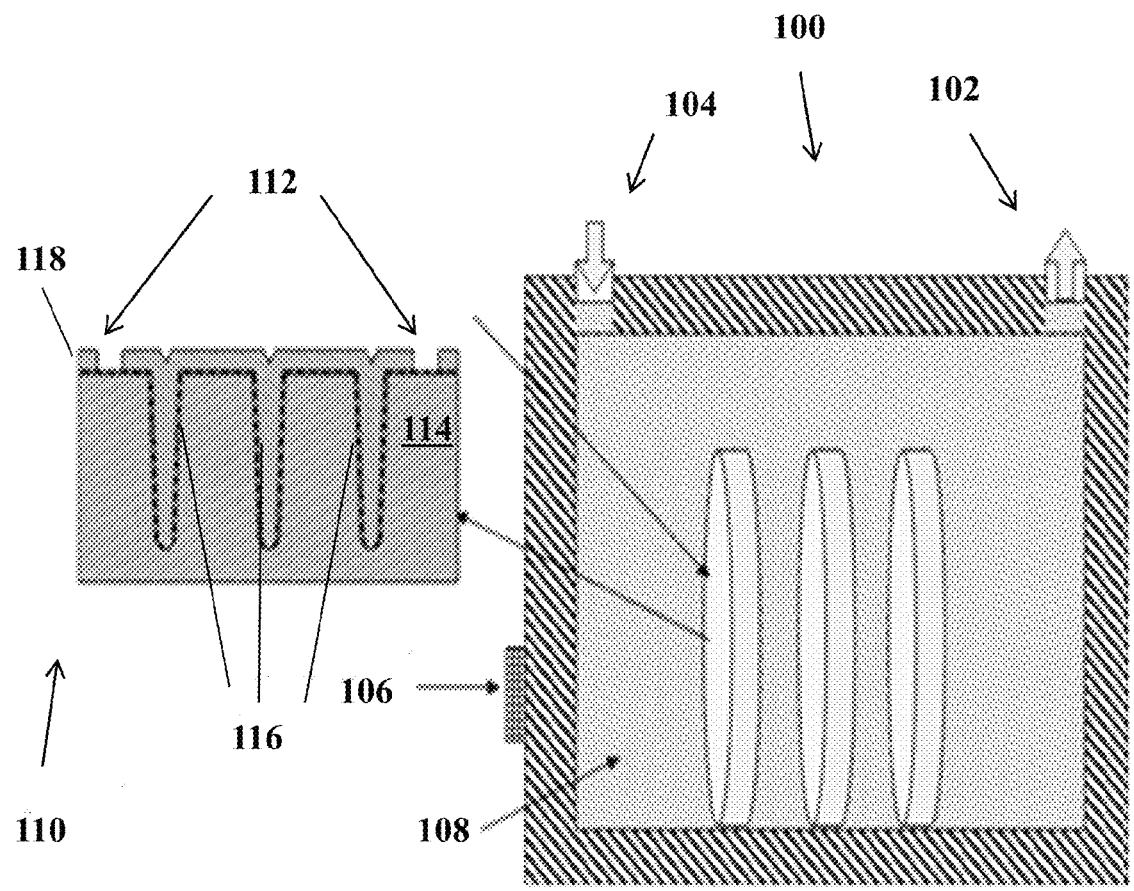
FIG. 7 presents an example of the Hydrostatic Pressure method of the present disclosure.

FIG. 7 illustrates one embodiment of release step (FIG. 1) of the present disclosure. Hydrostatic pressure vessel 100 subjects wafers 110 to large (0.1 GPa to 100 GPa) isostatic pressures. Hydrostatic pressure vessel 100 comprises inlet 104, outlet 102, fluidic medium 108, and may have sonic sensor 106. Wafers 110 comprise trenches 112 which ease lift-off step 20 of FIG. 1.

As shown in FIG. 7, wafers 110 to be released are loaded in hydrostatic pressure vessel 100. Fluidic medium 108 may comprise materials such as compressed air, liquid nitrogen, inert gases, or inert liquids. Controls regulate the temperature and pressure of fluidic medium 108.

Figure 8:
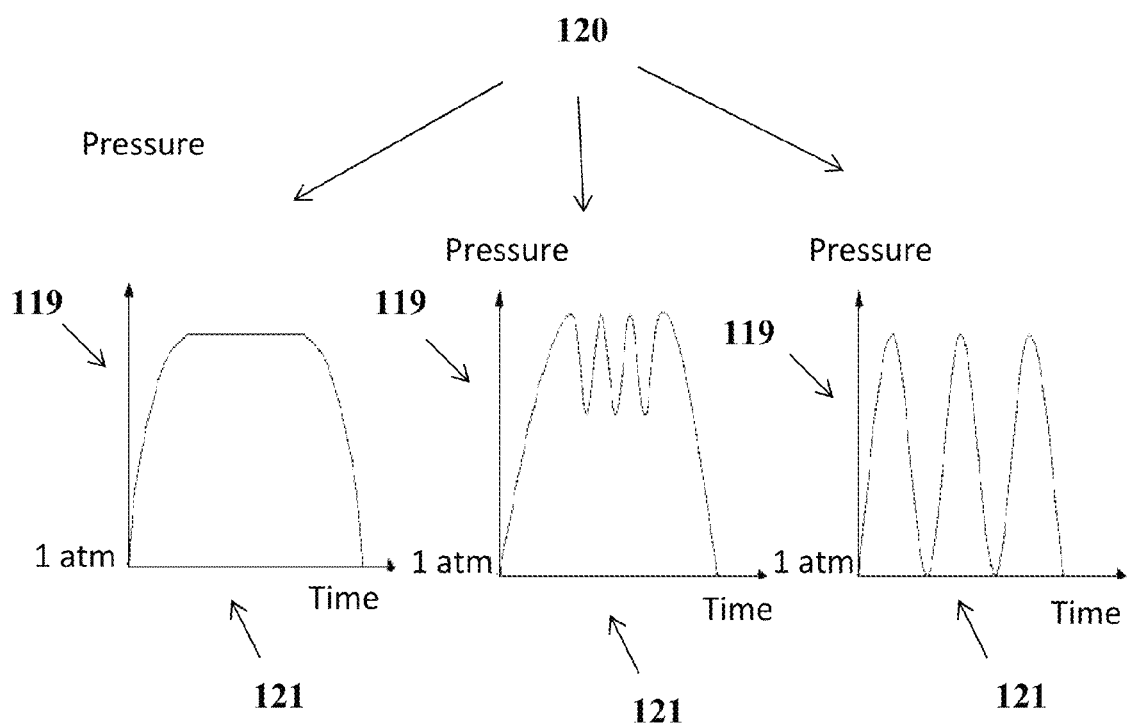
FIG. 8 shows examples of Hydrostatic Pressure cycles that may be used with the Hydrostatic Pressure method of the present disclosure.

FIG. 8 illustrates examples of pressure waveforms 120 which may be used to fracture the buried porous silicon layer. FIG. 8 shows the waveforms in terms of y-axis 119 representing pressure in atm and x-axis 121 representing time.

Hydrostatic pressure, in the range of 0.1 to 100 GPa, applied for a short time, such as a few minutes, breaks buried porous silicon layer 116 of FIG. 7. Controlled pressure value variations and cycling can be applied as needed. After the pressure is released, one high pressure treatment cycle is completed which could be repeated multiple times in order to facture porous silicon layer 116 partially or completely. Then, wafers 110 are unloaded and moved to final release step 20 of FIG. 1. Referring back to FIG. 7, Sonic sensor 106, attached to Hydrostatic pressure vessel 100 chamber wall or inner chamber space, detects porous silicon layer 116 collapse point (end point detection). Sonic sensor 106 may be implemented in a feedback loop controlling process parameters including pressure, time, temperature, and number of cycles. Extreme, instantaneous, and isostatic pressures make the hydrostatic pressure treatment of FIG. 7 a particularly attractive solution to current release problems.

Studies conducted in the past show mechanical properties of thin porous silicon layers including fracture strength, toughness, and elasticity are key process parameters. Further, not all porous silicon microstructures experience compressive stress as a result of hydrostatic pressure applied to the non-porous layers. Porous silicon on trench 112 sidewalls experiences both shear and compressive stresses at the same time. This combination of mechanical stresses effectively fractures local porous silicon layers without higher pressure. Also, reduced pressure levels caused by a combination of mechanical stresses mitigate damage to the non-porous silicon layers. A high porosity (50%-70%), heavily doped p++ porous silicon layer is preferred.

Additionally, the hydrostatic pressure method of FIG. 7 may be combined with other release method such as the ultrasonic wave energy method to be described later in the present disclosure. After the porous silicon layers inside the trench regions are fractured by the hydrostatic pressure, the ultrasonic method, which is described in the later section, will be more effective in fully fracturing the remaining porous silicon layers.

In another embodiment of the present disclosure, selectively heating the buried porous silicon layer generates thermal stresses which fracture the porous silicon layer and release the non-porous silicon layers. The following methods rely on the thermal conduction mismatch and thermal expansion/contraction coefficient mismatch of porous silicon and the non-porous silicon layers. Heating the wafer causes these mismatches to create shear stresses along the porous silicon and non-porous silicon interfaces as well as within the porous silicon layer. Thus, heating fractures the porous silicon layer once shear stresses exceed a critical value. The collapse of the porous silicon layer allows release of 3-D TFSS substrate and 3-D template. Further, controlling temperature and processing time fully fracture the buried porous silicon layer and reduce damage to the TFSS substrate and template.

Figure 9:
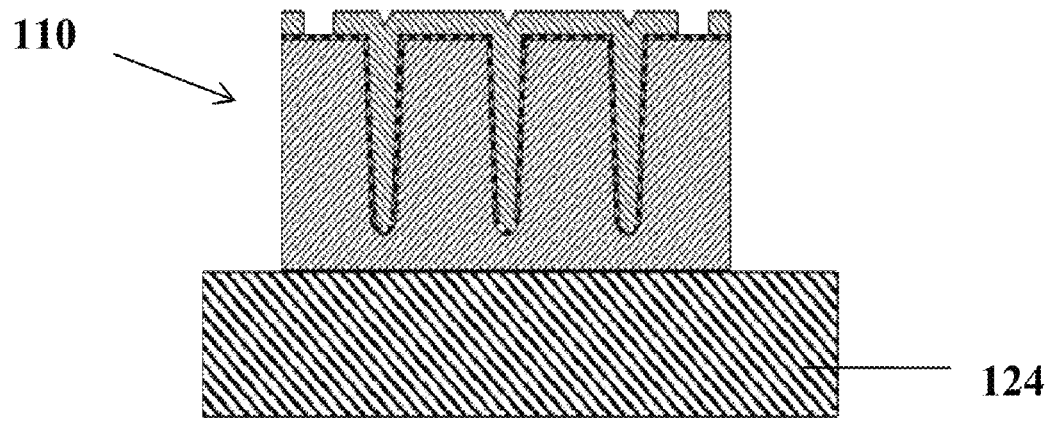
FIG. 9 illustrates an embodiment for separating a 3-D TFSS substrate from a crystalline template by thermally fracturing a porous silicon layer through the use of a temperature controlled wafer chuck.
Figure 10:
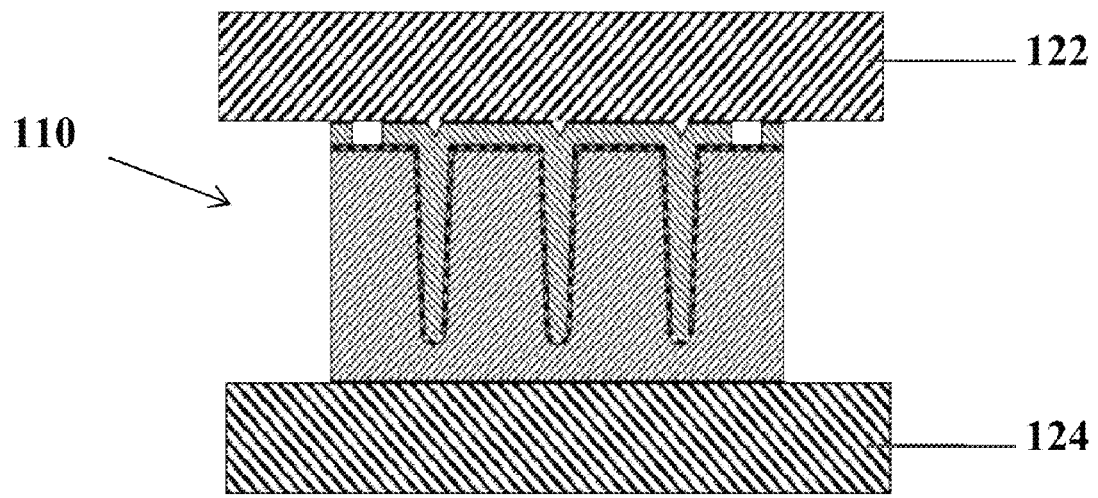
FIG. 10 illustrates an embodiment for separating a 3-D TFSS substrate from a crystalline template by thermally fracturing a porous silicon layer through the use of temperature controlled wafer chucks.
Figure 11:
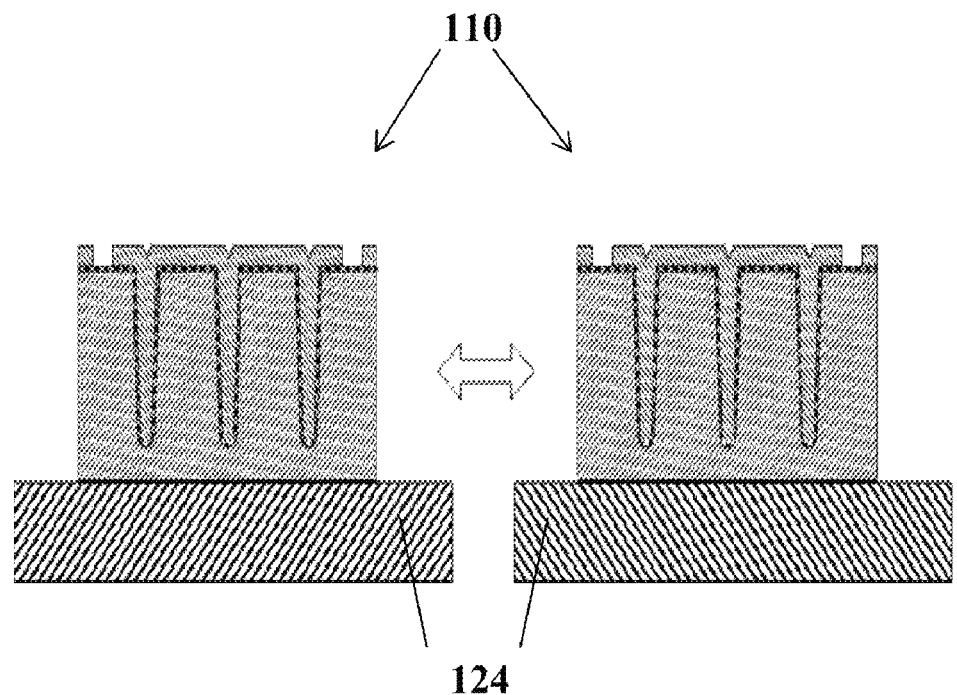
FIG. 11 illustrates an embodiment for separating a 3-D TFSS substrate from a crystalline template by thermally fracturing a porous silicon layer through the use of temperature controlled wafer chucks.

The embodiments of FIGS. 9 through 11 heat or cool a wafer by contacting the wafer to a temperature controlled chuck. A highly porous (50%-70%), heavily doped p++ porous silicon layer is preferable for these embodiments.

FIG. 9 illustrates one method for generating thermal stresses and fracturing porous silicon, thereby realizing step 18 of FIG. 1. Temperature controlled chuck 124 secures wafer 110. Temperature controlled chuck 124 is preferably made by metal and maintains a pre-set temperature in the range of −50° C. to 350° C. Electrostatic or vacuum chucking could be used for securing wafer 110 to temperature controlled chuck 124's surface. The contacting time could be from tens of seconds to a few minutes. The epitaxial silicon side could be either facing up or facing down as needed. After unloading the wafer from the plate, the wafer is allowed to return to room temperature preferably in a few minutes. This process could be repeated for a multiple controlled cycles as necessary.

FIG. 10 shows another embodiment using two temperature controlled wafer chucks. Chuck 124, maintained at a pre-set temperature in the range of 50° C. to 350° C., secures wafer 110. After an initial contacting time from tens of seconds to a few minutes, chuck 122 contacts wafer 110's exposed surface. Chuck 122 is set at a different temperature than chuck 124's. Chuck 122 may be set at a temperature in the range of −50° C. to 0° C. The TFSS substrate may contact either chuck. After a thermal treatment time from tens of seconds to a few minutes, chuck 122 is removed followed by the removal of wafer 110 from chuck 124's. The method of FIG. 10 could be repeated for as many cycles as necessary. Sandwiching wafer 110 between chucks 122 and 124, set at sufficiently differing temperatures, creates stronger temperature gradients than the method of FIG. 9. Although the chucks are preferably set in the range of −50° to 0° C. and 50° to 350° C., any temperature difference sufficient to fracture the porous silicon layer is acceptable.

FIG. 11 shows yet another embodiment of FIG. 9. Wafer 110 is alternately placed on chucks 124 with different temperature settings. One chuck is heated and the other chuck is cooled and they are maintained at pre-set temperatures in the range of −50° C. to 350° C. Chucks 124 are preferably made from metal. However, other materials which are reasonable efficient at conducting heat could be used. Electrostatic or vacuum chucking could be used for securing wafer 110 to chucks 124's surfaces. The contacting time could be from tens of seconds to a few minutes. The TFSS substrate layer could be either facing up or facing down as needed. The hot and cold contact duty cycles are controlled. The controls are preferably programmable so that the process could be repeated for multiple cycles as necessary. Any temperature difference between the two chucks suitable to fracture the porous silicon layer is suitable.

Figure 12:
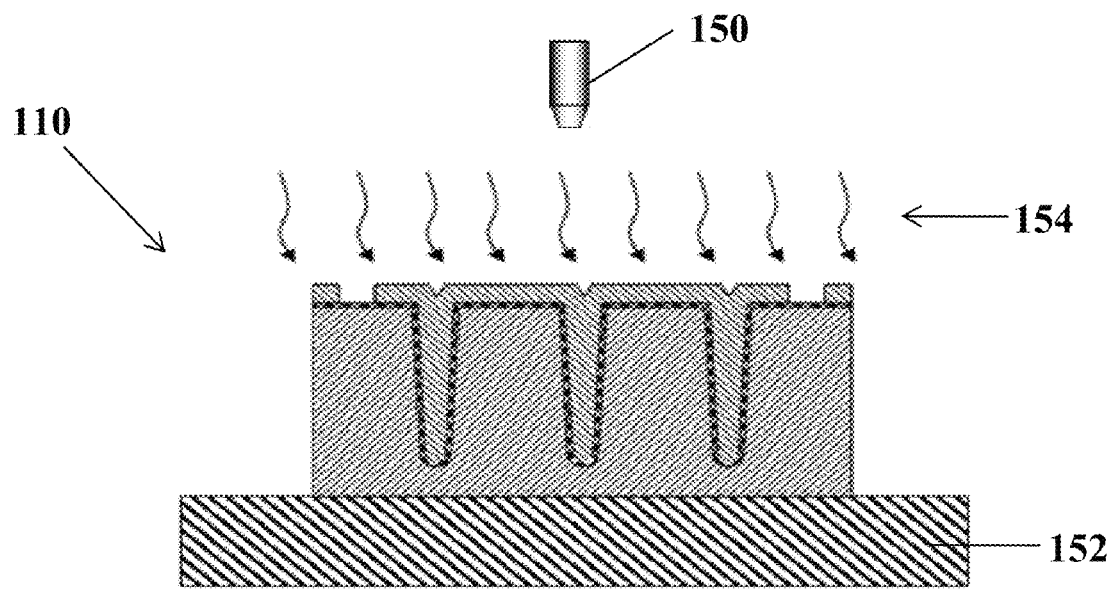
FIG. 12 illustrates an embodiment for separating a 3-D TFSS substrate from a crystalline template by thermally fracturing a porous silicon layer through the use of a rapid thermal processor.

FIG. 12 illustrates another embodiment of the present disclosure which fractures the buried porous silicon layer by generating thermal stresses. FIG. 12 corresponds to step 18 of FIG. 1. Chuck 152 is made of a heat insulating material, such as ceramic, and secures wafer 110. Lamp-heated rapid thermal processor (RTP) system 150 applies radiated heat 154 to wafer 110's surface. Wafer 110 could reach temperatures up to 800° C. In one embodiment of FIG. 12, lamp-heated RTP system 150 heats wafer 110 between cycles of edge-hot/center-cold and edge-cold/center-hot. The lateral temperature gradient fractures porous silicon microstructures efficiently. The TFSS substrate side could be facing up or facing down as needed. This process could be repeated for multiple controlled cycles as necessary.

Figure 13:
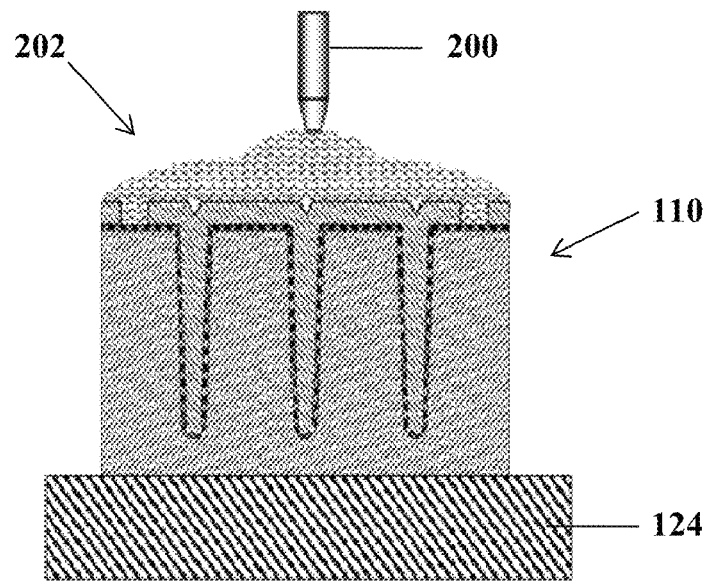
FIG. 13 illustrates an embodiment for separating a 3-D TFSS substrate from a crystalline template by thermally fracturing a porous silicon layer through the use of a dispensing system.

In another embodiment of step 18 of FIG. 1, FIG. 13 illustrates a dispensing method for generating thermal stresses. Chuck 124 secures wafer 110 to its surface. Dispense system 200 discharges heating or cooling source 202 on wafer 110's top surface. Dispense time ranges from a few seconds to a few minutes. If cooling source 202 is discharged, chuck 124 maintains a pre-set temperature in the range of 20° C. to 350° C. Dispensed cooling sources 202 could include, but are not limited to, liquid nitrogen, other liquids of inert gases, cold air, or $CO_2$ snow. If heating source 202 is discharged, chuck 124 maintains a pre-set temperature in the range of −50° C. to 20° C. Dispensed heating sources 202 could include, but are not limited to, hot de-ionized (DI) water, hot steam, or hot air. Any temperature of chuck 124 that is sufficient to the fracture porous silicon layer while dispensing heating or cooling source 202 is acceptable.

In one embodiment of FIG. 13, chuck 124 rotates in the range of 10 rpm to 500 rpm. Heating or cooling source 202 dispense rate, dispense amount, dwell time, and wafer 110 re-cooling or re-heating time are controlled in order to repeat this process for multiple controlled cycles as necessary. TFSS substrate could be facing up or down as needed. Dispensing system 200 comprises a nozzle with one or more holes. A dispense nozzle comprising multiple holes, such as a dispensing shower-head, discharges heating or cooling source 202 more uniformly on wafer 110's surface.

Figure 14:
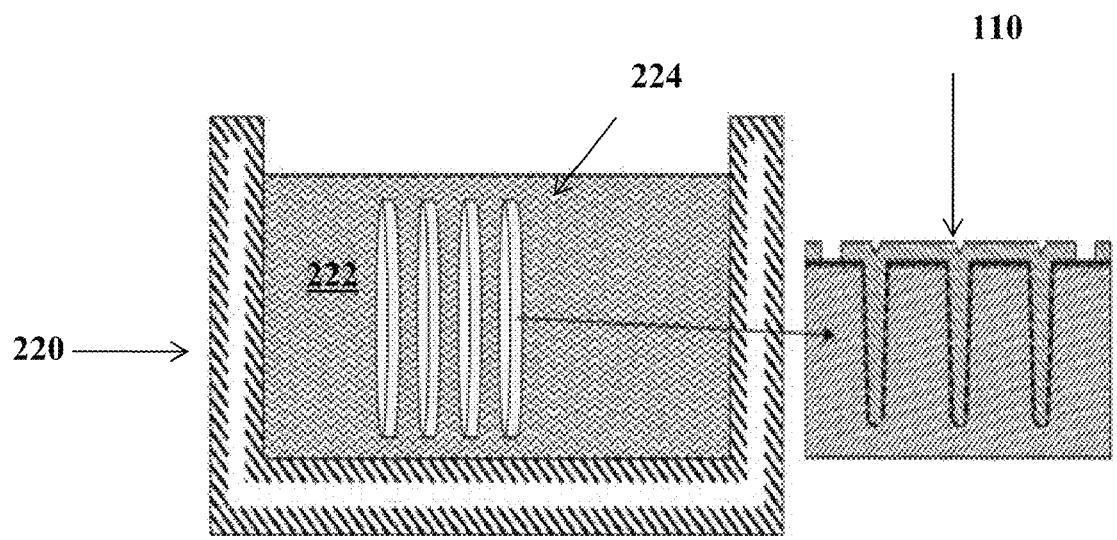
FIG. 14 illustrates an embodiment for separating a 3-D TFSS substrate from a crystalline template by thermally fracturing a porous silicon layer through the use of an immersion or convection process.

FIG. 14, corresponding to release step 18 of FIG. 1, shows another embodiment of the present disclosure wherein thermal stresses are used to fracture the porous silicon layer. Wafer 110 or a batch of wafers 224 are immersed in heating or cooling source 222 contained in tank 220. Cooling source 222 could comprise a liquid or gas, preferably liquid nitrogen. Loading speed, loading time, and immersion time should be controlled. The controls are preferably programmable so that the process could be repeated for multiple cycles as necessary. In another embodiment, tank 220 may comprise a temperature controlled oven. Wafers 110 may be loaded into tank 220 and convection may be used as the thermal stress generation process.

Figure 15:
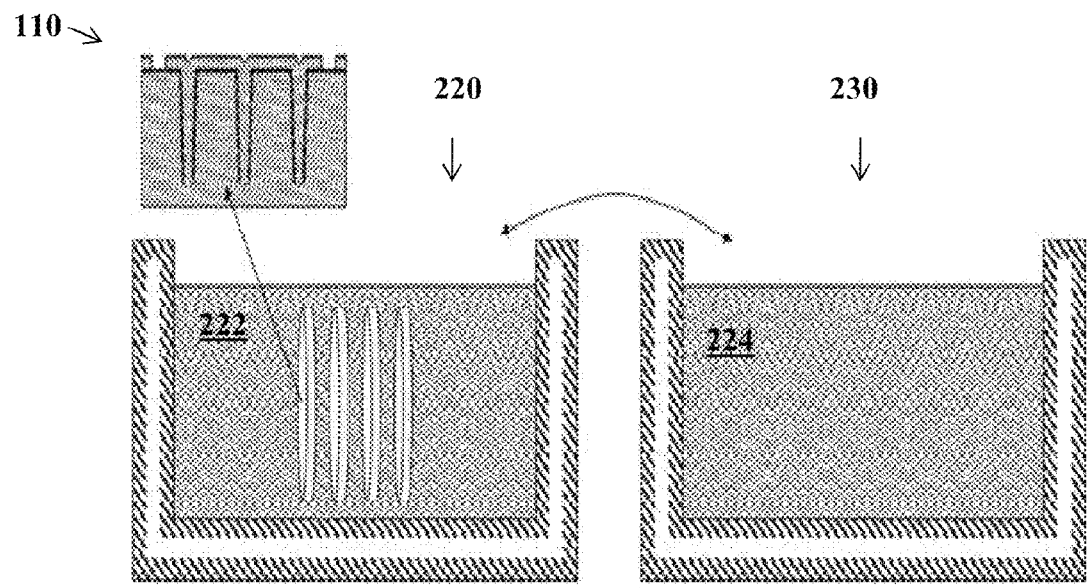
FIG. 15 illustrates an embodiment for separating a 3-D TFSS substrate from a crystalline template by thermally fracturing a porous silicon layer through the use of an immersion or convection processes.

FIG. 15 illustrates another embodiment of FIG. 14. A single or batch immersion process immerses wafer 110 in tank 220 containing cooling or heating source 222. Then wafers 110 are transferred to heating or cooling tank 230. One tank contains a heating source and the other a cooling source. The motion of loading wafers 110 from tank 220 to tank 230 is preferably controlled in terms of loading speeds and time. Multiple wafers could be loaded at one time. Further, Programmable controls monitor and manipulate immersion duty cycles associated with tanks 220 and 230.

Figure 16:
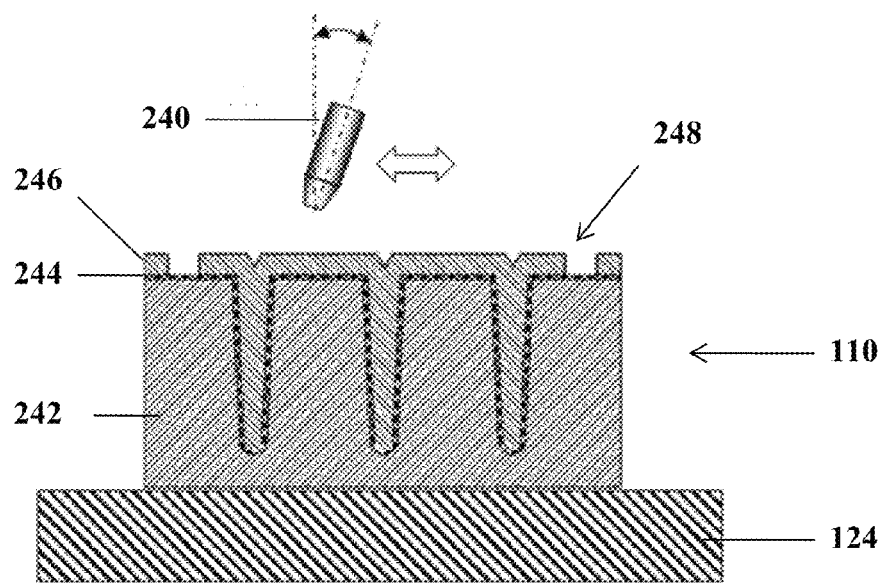
FIG. 16 illustrates an embodiment for separating a 3-D TFSS substrate from a crystalline template by thermally fracturing a porous silicon layer through the use of selective IR radiation absorption.

In another embodiment of the present disclosure, IR laser irradiation releases a 3-D TFSS substrate from a reusable crystalline silicon template. FIG. 16 illustrates the embodiment and corresponds to step 18 of FIG. 1. Chuck 124 secures wafer 110 to its surface, and laser 240 irradiates wafer 110's surface. Wafer comprises TFSS substrate layer 246, porous silicon layer 244, template layer 242, and release trenches 248. The embodiment of FIG. 16 employs selective absorption of IR radiation to generate thermal stresses in porous silicon layer 244. TFSS substrate 246 and template 242 absorb IR radiation (wavelength>1.1 μm) poorly, but porous silicon layer 244 absorbs IR radiation much more efficiently. This is true especially when the porous silicon layer is preferably heavily doped with boron and becomes a p++ porous silicon layer.

The embodiment of FIG. 16 may be further enhanced by a pre-treatment, prior to TFSS substrate formation, of porous silicon layer 244. A suitable material (preferably $H_2O$ from anodic etching) absorbed in the pores and pore surfaces enhances IR absorption. Further, IR-laser induced etching/vaporization of the silicon pores could be realized. When IR laser 240 wavelength and other parameters are properly selected, the laser energy is selectively absorbed in porous silicon layer 244 and converted into thermal energy, which generates a series of local effects such as thermal expansion, melting, vaporization and local shock waves within porous silicon layer 244 and along its interfaces to the non-porous silicon layers 242 and 246. While IR laser 240 heats porous silicon layer 244, non-porous silicon layers 242 and 246 are only slightly heated or not at all. As a result of these selective effects, porous silicon layer 244 is fractured or destroyed.

Carbon dioxide ($CO_2$), continuous-wave or pulsed-wave, lasers have a wavelength of 10.6 μm and are suitable for this application. Pulsed wave lasers generate pulsed thermal shocks to the porous silicon layer, while minimizing heating of non-porous silicon layers, more efficiently than continuous-wave lasers; thus, pulsed wave lasers are more suited to applications of the present disclosure. As an example, a pulsed transversely excited atmospheric (TEA) $CO_2$ laser is an effective $CO_2$ laser that can generate short intense pulses with pulse energies ranging from the millijoule region to 500 Joules at pulse repetition rates from about 300 Hz down to single shot. Other suitable lasers may also be used.

Referring to FIG. 16, chuck 124 secures wafer 110 on its surface, and laser 240 scans across wafer 110's surface. Controlled motions of an x-y stage or a mirror could realize laser beam scanning. However, other scanning apparatuses could also be employed. The laser beam could be focused to the porous silicon layer or unfocused in order to gain a larger spot size. The incidence angle of the laser beam with respect to wafer 110's surface may be 0°-45° for processing porous silicon 242 on the lateral surfaces as well as other angles for effectively processing porous silicon 242 on sidewall surfaces.

Figure 17:
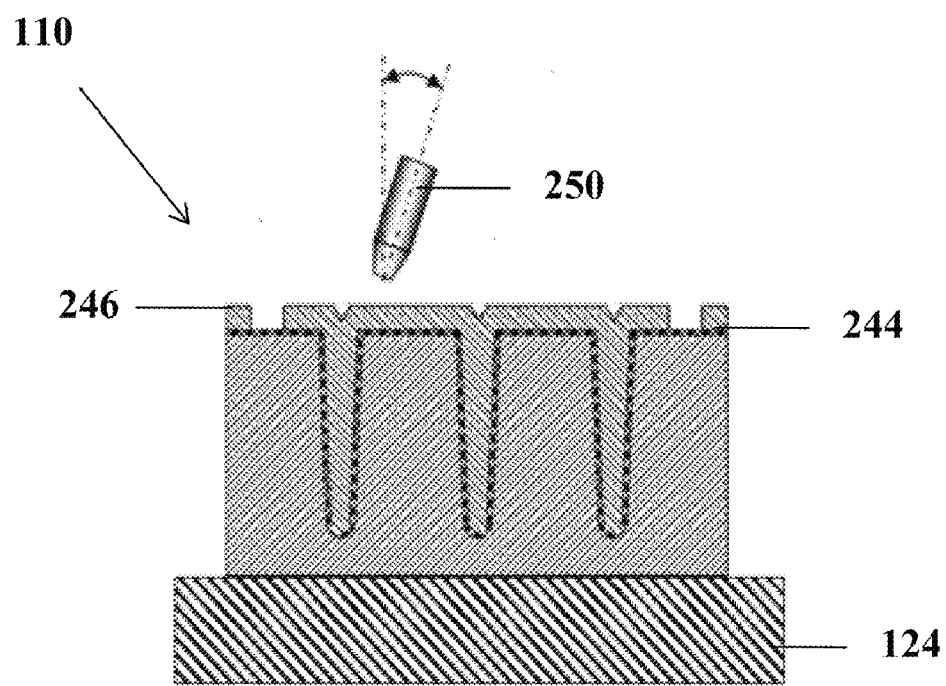
FIG. 17 presents a method for separating a 3-D TFSS substrate from a crystalline template by mechanically fracturing a mechanically weak layer using ultrasonic or megasonic energy.

The IR laser irradiation method of FIG. 17 is not limited to $CO_2$ lasers. Other IR lasers, such as YAG (1.06 um) laser could also be used. In addition, the laser irradiation process performed in air with various pressures and assisting gases, or through a liquid medium such as DI water better radiates heat away from non-porous silicon layer surfaces. The previously mentioned YAG laser penetrates through water with little attenuation, making it an ideal laser for these enhancements.

Figure 18:
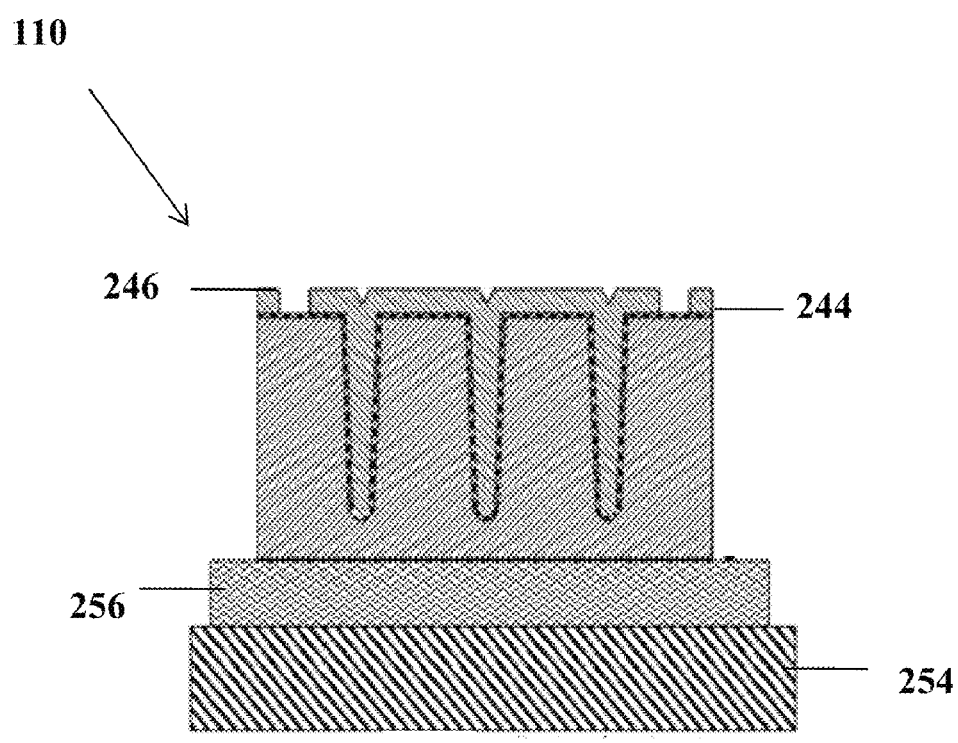
FIG. 18 presents a method for separating a 3-D TFSS substrate from a crystalline template by mechanically fracturing a mechanically weak layer using ultrasonic or megasonic energy.

FIGS. 17 and 18 show two embodiments of an ultrasonic fracturing step which corresponds to step 18 of FIG. 1. FIG. 17 shows ultrasonic probe 250 applying ultrasonic energy to wafer 110, thereby fracturing porous silicon layer 244. Wafer 110 is secured on chuck 124. Ultrasonic probe 250 scans across wafer 110's surface with controlled distance, speed, and motion. TFSS substrate layer 246 may be faced up or down as needed. FIG. 18 illustrates a different embodiment of the same ultrasonic fracturing principle illustrated in FIG. 17. An ultrasonic actuator 256, integrated with chuck 254, transmits ultrasonic energy to wafer 110, thereby fracturing porous silicon layer 244. In both cases, controlled ultrasonic waves ensure that only porous silicon layer 244 is fractured while non-porous layers 246 and 242 remain intact. Ultrasonic actuator 256, although preferably integrated with chuck 254, may be associated with the apparatus in any form that allows for efficient fracturing of porous silicon layer 244.

Figure 19:
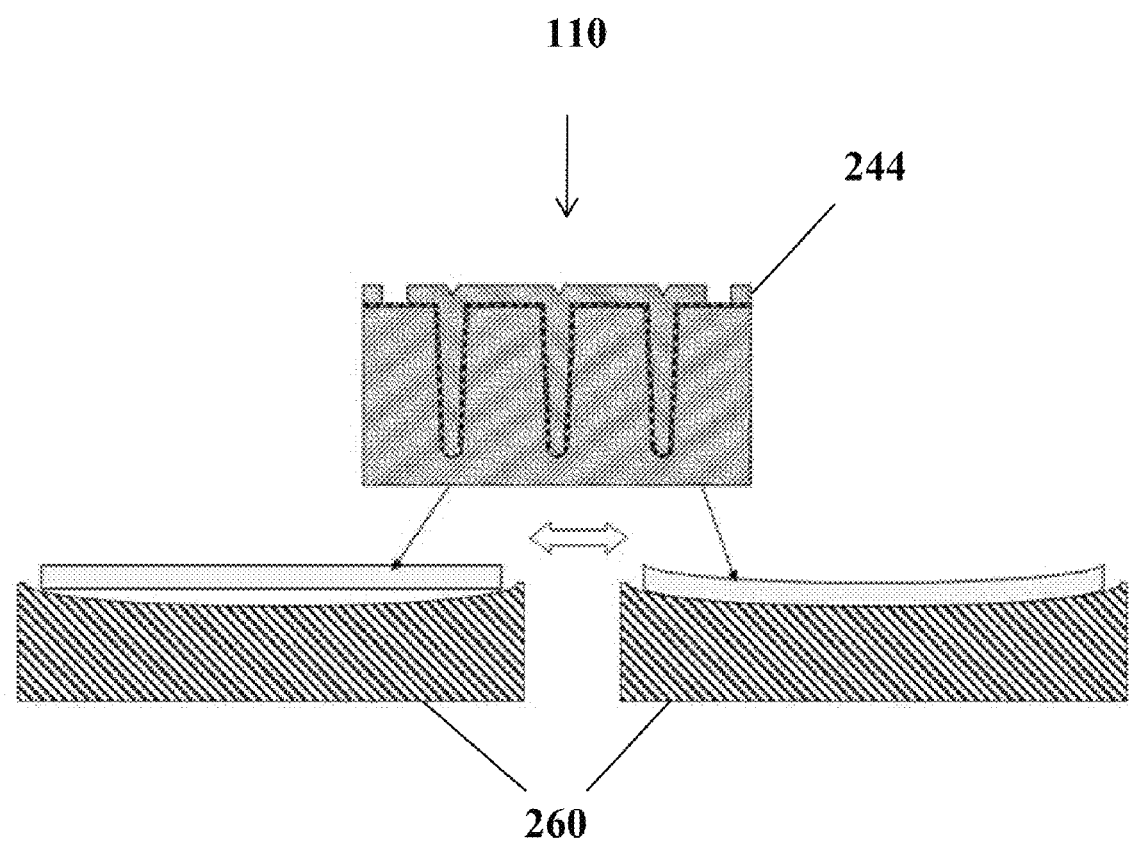
FIG. 19 presents a method for separating a 3-D TFSS substrate from a crystalline template by mechanically fracturing a mechanically weak layer through the use of a concave or convex wafer chuck.

Another embodiment of the present disclosure presents a method for mechanically fracturing the middle porous silicon layer of a wafer. This method, shown in FIG. 19, corresponds to step 18 of FIG. 1. Wafer 110 is placed on convex chuck 260. However, a wafer chuck having a concave surface is also suitable for the present applications. Chuck 260 is originally in the off position. However, once turned on chucking action of chuck 260 mechanically bends wafer 110 from center to edge. Shear, tensile, or compressive stresses induced by controlled bending of wafer 110 fracture porous silicon layer 244. The curvature of chuck 260's surface could be concave or convex, and the maximum out of plane distance from chuck 260 center to edge is in the range of 10 μm to 100 μm.

Electrostatic or vacuum chucking that has one or multiple actuation zones can be used for actuation of wafer 110 bending and actuation can be cycled in a controlled manner. In addition, wafer 110 may be heated during the bending cycling. The wafer heating source could come from an external IR heater or a heating element integrated with chuck 260. Alternatively, the wafer may be maintained at a reduced temperature during bending by dispensing a cryogenic medium, such as liquid nitrogen to the wafer 110's top surface.

Figure 20:
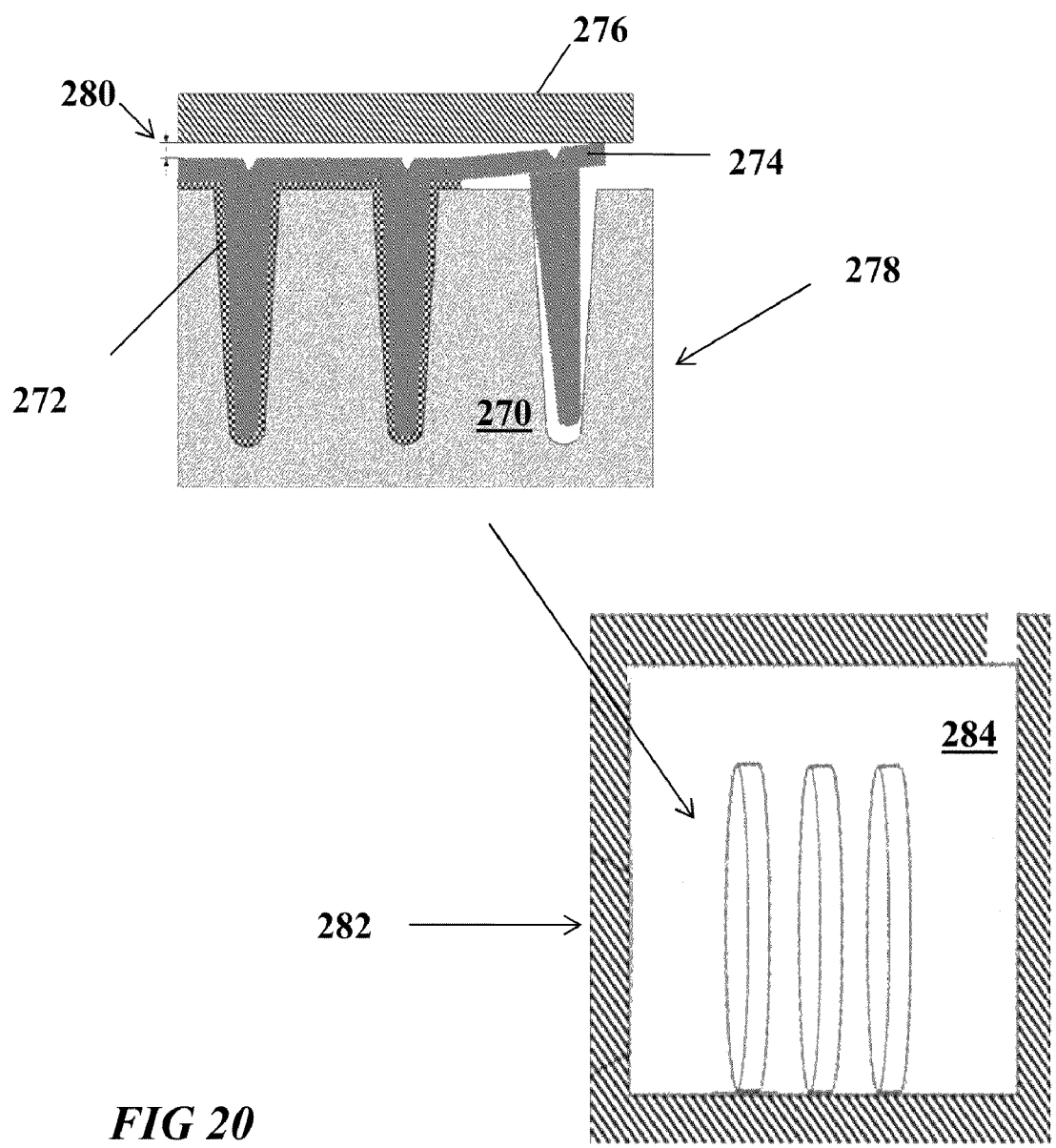
FIG. 20 presents a method for separating a 3-D TFSS substrate from a crystalline template through the use of a pressurized etching process.

Another embodiment of step 18 of FIG. 1 is illustrated in FIG. 20. Wafer 278 comprises 3-D reusable crystalline silicon template 270, porous silicon layer 272, and 3-D TFSS substrate 274. Deflection plate 276 reduces maximum out of plane deflection 280 of the wafer in the range of 5 μm to 25 μm. Wafers 278 are housed in pressure chamber 282 filled with medium 284. Etching gas 284, preferably HCl or $Cl_2$, is dispensed in pressure chamber 282.

The method of FIG. 20 employs mechanical fracturing or chemical etch of porous silicon layer 272 from wafer 278 edge to center. Since porous silicon layer 272 removal proceeds from edge to center, rather than uniformly as in the previous methods of the present disclosure, out of plane curving or displacement 280 of TFSS substrate layer 274 must be limited by deflection plate 276. Rigid deflection plane 276 placed in parallel proximity to TFSS substrate layer 274 limits out of plane deflection 280. Out of plane deflection 280 is in the range of 5 μm to 25 μm.

In the beginning of this embodiment, suitable silicon etching gas 284, such as HCl or $Cl_2$, is introduced into pressure chamber 282 that contains wafers 278. Etching gas 284 fills pores in porous silicon layer 272 from the exposed edge areas. Porous silicon layer 272 etch proceeds from wafer 278 edge to center as the temperature of pressure chamber 282 is rapidly increased. After a short time of etching, the pressure in pressure chamber 282 is quickly decreased. The rapid expansion of gases inside porous silicon layer 272 fractures thin pore walls. Repetition of this etching cycle is necessary to fully etch off and/or fracture the porous silicon layer.

Figure 21:
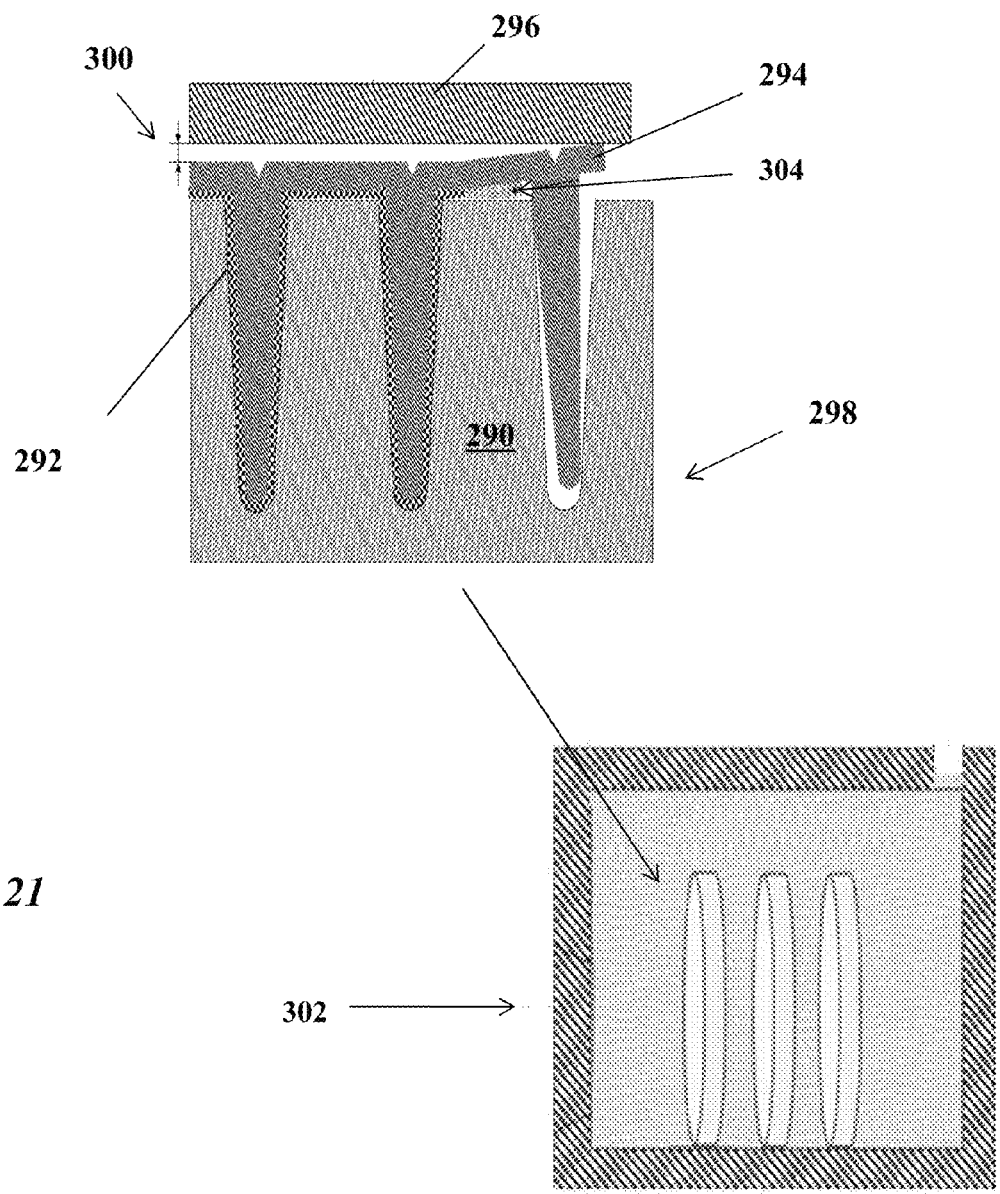
FIG. 21 presents an embodiment for separating a 3-D TFSS substrate from a crystalline template through the use of a double-phase transformation process.

FIG. 21 illustrates another embodiment of step 18 of FIG. 1. Wafer 298 comprises 3-D reusable crystalline silicon template 290, porous silicon layer 292, and 3-D TFSS substrate 294. Deflection plate 296 reduces maximum out of plane deflection 300 of wafer 298 in the range of 5 μm to 25 μm.

In the method of FIG. 21, wafer 298 is first soaked in a liquid medium, such as DI water, where the capillary forces pull water into the pores of porous silicon layer 292. Wafer 298 is transported to pressure chamber 302. Pressure chamber 302 is preferably small to facilitate rapid vacuum pumping. In one embodiment, pressure chamber 302 is connected in series with a large pre-pumped vacuum chamber (not shown). Opening a door connecting the two chambers rapidly reduces the pressure in smaller pressure chamber 302. A vacuum pump connected to the large chamber could further decrease pump down time. As a result of rapid pressure decrease, two effects occur either sequentially or simultaneously. In the first effect, water contained in porous silicon layer 292 expands by a sudden phase transformation and forms water vapor. In the second effect, the sudden water evaporation and vapor expansion cause a sudden local temperature drop, freezing the remaining water trapped in deeper pores of porous silicon layer 292. The second effect causes local volume expansion on a micro scale. As a result, formed ice 304 fractures porous silicon layer 292. Heating wafer 298 to melt ice trapped in deep pores completes one cycle of the double-phase transformation method of FIG. 21. The method may be repeated as necessary to fully fracture porous silicon layer 292. Although the preferred embodiment utilizes a connected pre-pumped vacuum chamber, any method or procedure that can facilitate rapid depressurization could be used.

The methods and apparatuses described previously effectively fracture the middle porous silicon layer. Further, they are adequate in fully releasing the TFSS substrate from the template. However, the methods to be described provide greater efficiency in separating a TFSS substrate connected to a template by a fractured porous silicon layer. The following methods relate to the final lift-off or cleaning of the TFSS substrate and template described by step 20 of FIG. 1.

Figure 22:
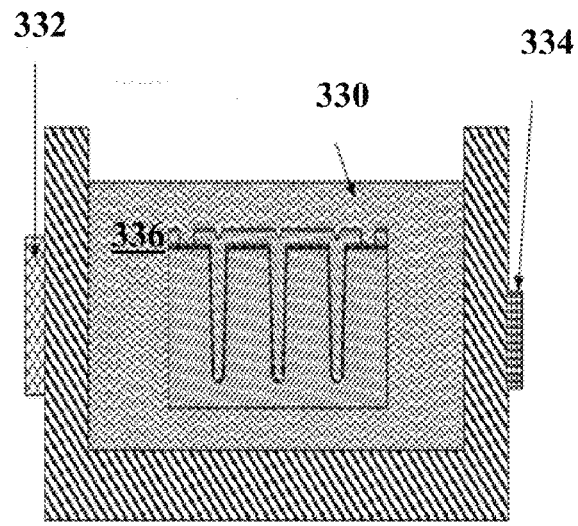
FIG. 22 presents an embodiment for separating and cleaning a 3-D TFSS substrate from a crystalline template by irradiating an immersed wafer with megasonic or ultrasonic energy.

FIG. 22 illustrates one embodiment of step 20 (FIG. 1). Ultrasonic or megasonic actuator 332 agitates liquid medium 336, irradiating wafer 330 with ultrasonic or megasonic energy. Sonic sensor 334 detects porous silicon layer collapse.

As shown in FIG. 22, wafer 330 comprising a fully or partially fractured porous silicon layer is immersed in liquid medium 336, such as DI water or IPA. Ultrasonic or megasonic actuator 332 irradiates an ultrasonic or megasonic wave in liquid medium 336. The wave energy effectively fractures the remaining porous silicon that connects or sticks to the 3-D TFSS and the template. In addition, with the agitation from the wave energy, liquid medium 336 is effectively transported into the broken porous silicon space, reducing surface forces and serving as a lubricant to reduce surface friction. Alternatively, a diluted porous silicon etchant, such as KOH or HF+H2O2 may also be used as liquid medium 336. The silicon etchant etches porous silicon along the transportation path, from edge to center, efficiently lifting-off remaining porous silicon.

Figure 23:
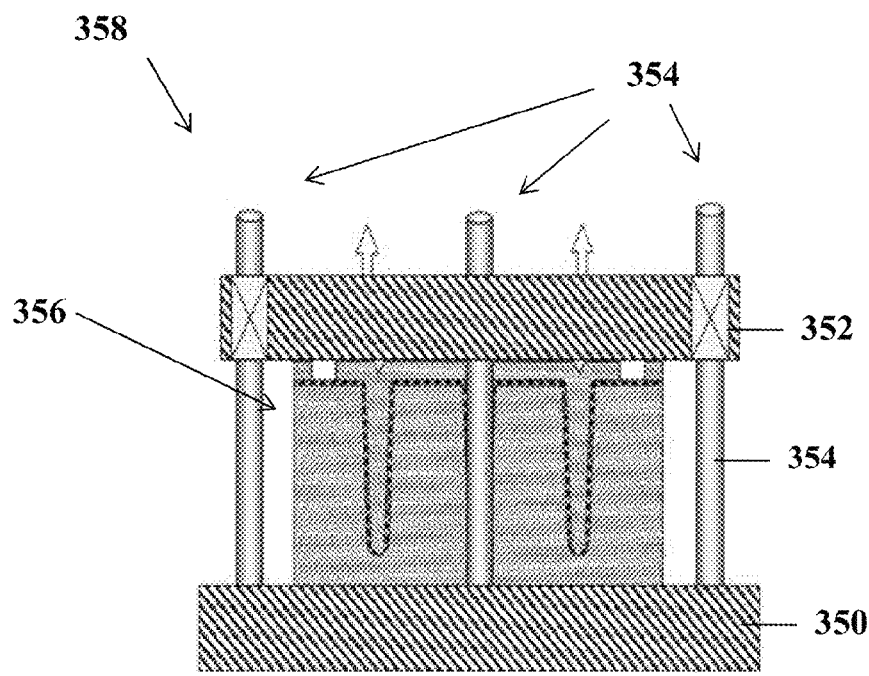
FIG. 23 presents an embodiment for separating or more fully fracturing a 3-D TFSS substrate from a crystalline template through the use of a precision mechanical pulling system.

FIG. 23 illustrates another method for effective porous silicon lift-off. FIG. 23 relates to step 20 of FIG. 1. The embodiment of FIG. 23 releases a 3-D TFSS from a reusable crystalline silicon template by precision mechanical pulling. The porous silicon layer may be fully or partially fractured by embodiments previously disclosed. Mechanical assembly 358 comprises bottom chuck 350, top chuck 352, three slider rails 354, and a large force pulling mechanism such as a motor, solenoid, or other actuators (not shown). Slider rails 354 restrict motion and keep parallelism of chucks 350 and 352 during pulling. Precision bearings (not shown) may be mounted to guide travel along the rails. Chucks 350 and 352 may use either electrostatic or vacuum chucking to secure wafer 356. Top chuck 352 preferably comprises a porous vacuum chuck to reduce alignment needs. Further, porous chucks effectively secure non-smooth surfaces. The wafer is first placed on bottom wafer chuck 350 with TFSS substrate facing upwards. After bottom chuck 350 secures the template side of wafer 356, top wafer chuck 352 is gently lowered and secures TFSS substrate side of wafer 356. The activated pulling mechanism lifts top chuck 352 upwards, and the movement is guided evenly by slider rails 354.

The methods and apparatuses described heretofore may be combined or performed separately to ensure effective fracture of the porous silicon layer, while minimizing damage to non-porous silicon layers.

The present disclosure has particular application in the fabrication of thin-film solar cells. Accordingly the following FIGS. 24 through 38B present an illustrative method and apparatus of a thin-film solar cell suitable for the disclosed methods and devices for separation. For a more detailed description of the subject matter to which the following FIGS. 24 through 38B pertain, reference is now made to co-pending U.S. patent application Ser. No. 11/868,489, entitled "METHODS FOR MANUFACTURING THREE-DIMENSIONAL THIN-FILM SOLAR CELLS," (the "'489 application") having common inventors with the present disclosure and which is here expressly incorporated by reference. Note that the following illustrative drawings and explanations derive from the '489 application and, accordingly, not all referenced items in the following figures are explained in complete detail. In the event that explanations for such reference items is desired, reference may be readily made to the '489 application.

Figure 24:
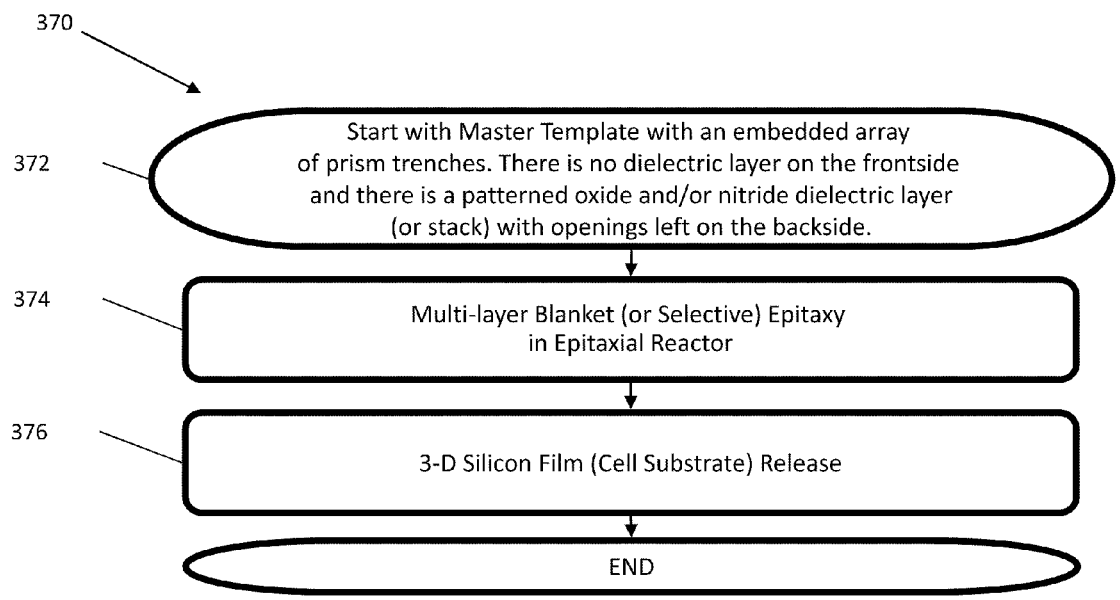
FIGS. 24 and 25 show alternative embodiments of a process flows for fabrication of self-supporting hexagonal prism 3-D TFSS substrates including rear base layers (single-aperture TFSS substrates with single-aperture unit cells)
Figure 25:
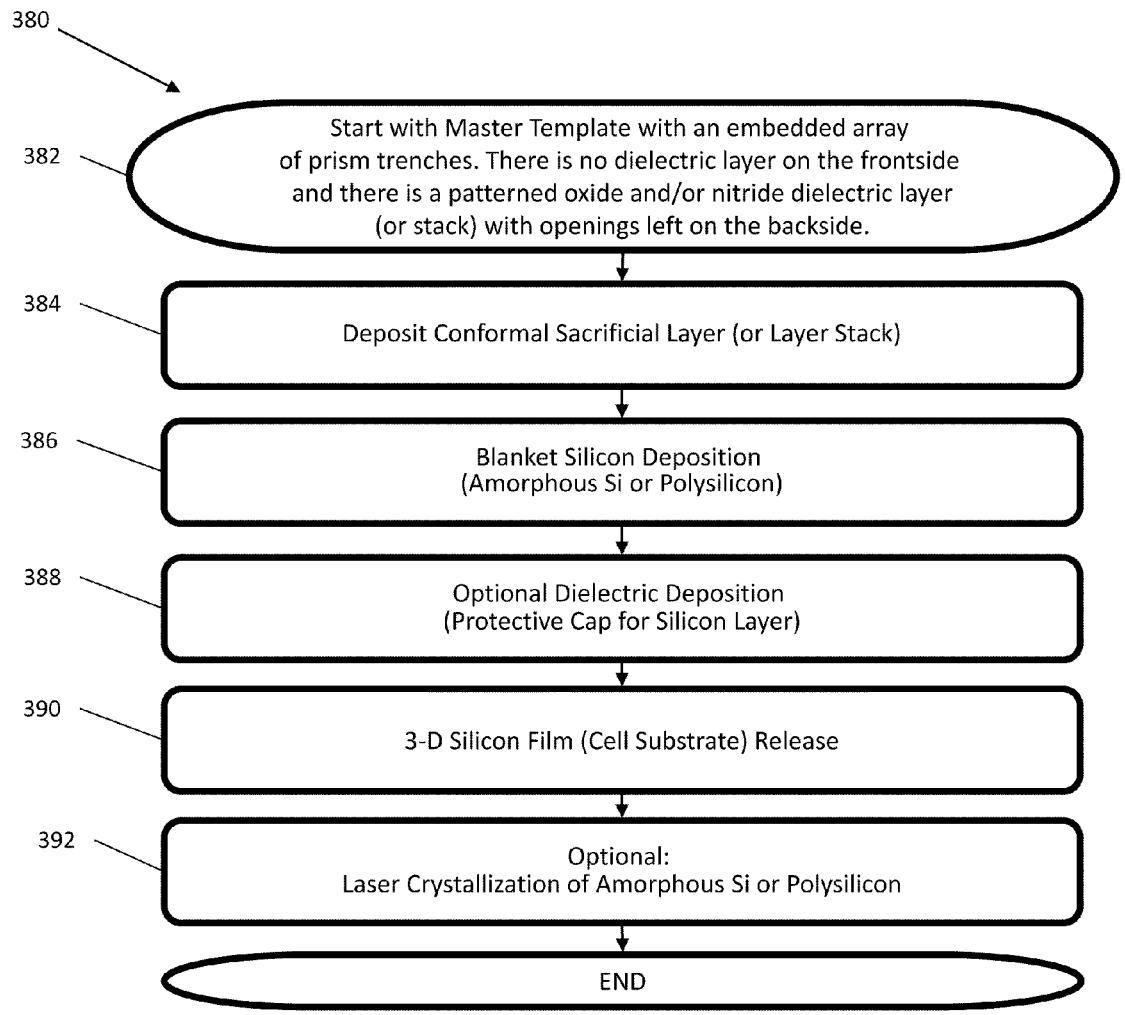

FIGS. 24 and 25 show two different process flow embodiments for fabricating hexagonal-prism dual-aperture 3-D TFSS substrates with rear base layers using a suitable template. FIG. 24 depicts an embodiment of a process flow 370 using layer release processing. This flow is based on the use of $Ge_xSi_{1-x}$ sacrificial layer deposition and blanket or selective in-situ-doped epitaxial silicon deposition. The resulting hexagonal-prism unit cells have open apertures on prism top and are terminated at the rear with a rear base layer (in one embodiment, a relatively flat thin silicon layer). Again, the process flow of this embodiment may be easily adjusted in order to use polysilicon, amorphous silicon, or a non-silicon crystalline or polycrystalline/amorphous silicon material. In step 372, a patterned honeycomb-prism template is provided. This template has already been processed to form an embedded array of trenches along with shallower/wider trenches (or trench shoulders) stacked on top of narrower/deeper trenches. There is no dielectric layer on the template frontside, and there is a patterned oxide and/or nitride dielectric layer (or stack) with openings left on the template backside. In step 374, a multi-layer blanket epitaxy is performed in an epitaxial reactor, including the following in-situ process steps. First, $H_2$ bake or $GeH_4/H_2$ bake is used for in-situ surface cleaning. Next, a thin $Ge_xSi_{1-x}$ epitaxial layer is deposited (in one embodiment, on the top only). In one embodiment, this layer is between 10 and 1000 nanometers. Next, a doped silicon epitaxial layer is deposited on the top only. In one embodiment, this layer is p-type, boron-doped and between 1 and 30 microns thick. The in-situ doping (boron doping) profile may be flat or graded. In case of grading, boron doping concentration is gradually increased during the deposition of the silicon epitaxial layer, with a lower concentration at the beginning and a higher concentration towards the end of the epitaxial growth process. This graded base doping may provide a field-assisted drift component for efficient collection of photo-generated carriers, substantially reducing the impact of recombination losses. It also reduces base sheet resistance and ohmic losses. The silicon epitaxial layer thickness is set such that the deep trenches are fully filled with silicon while the shallow (wider) trenches (top trench shoulders) receive epitaxy on their sidewalls and their central regions are left with self-aligned shallow hexagonal troughs. In step 376, the 3-D TFSS substrate is released. A highly selective isotropic wet or dry etch of $Ge_xSi_{1-x}$ is performed, with very high selectivity with respect to silicon. In one embodiment, a mixture of hydrofluoric acid, nitric acid and acetic acid (HNA) is used to selectively etch the $Ge_xSi_{1-x}$ layer. Alternatively, a mixture of ammonia, peroxide, and water ($NH_4OH+H_2O_2+H_2O$) may be used. The wet etchant selectively removes the sacrificial $Ge_xSi_{1-x}$ layer by reaching the sacrificial layer through the template backside dielectric openings. This process releases the hexagonal prism 3-D TFSS substrate, which may then be used for subsequent 3-D TFSS fabrication. In another embodiment, the 3-D TFSS substrate may be released by the methods of the present disclosure.

Note that the template backside openings may be formed directly in silicon backside without a need for the backside dielectric. Alternatively, the sacrificial $Ge_xSi_{1-x}$ layer may be replaced by forming porous $Ge_xSi_{1-x}$ layer or porous silicon layer.

FIG. 25 depicts an embodiment of a process flow 380 for fabrication of self-supporting hexagonal-prism single-aperture 3-D thin-film polysilicon or amorphous silicon TFSS substrates with rear base layers made of polysilicon or amorphous silicon using layer release processing, without the use of epitaxial silicon processing. The amorphous silicon or polysilicon layer may be optionally crystallized using laser crystallization as part of the flow. This process flow uses a dielectric sacrificial layer such as $SiO_2$ (deposited using LPCVD or thermally grown) in conjunction with conformal amorphous silicon or polysilicon deposition for the silicon absorber layer. Step 382 (providing a substrate) corresponds to step 372 in FIG. 24. Step 384 involves depositing a conformal sacrificial layer (or a layer stack). First, a thin layer of a sacrificial material is deposited by conformal layer formation (LPCVD or thermal oxidation). In one embodiment, the sacrificial material is $SiO_2$, with a thickness of between 50 and 2000 nanometers. This sacrificial oxide layer conformally covers the hexagonal-prism trench walls and the template frontside. If subsequent laser crystallization is used, step 384 also includes depositing a thin nitride layer by LPCVD. In one embodiment, this nitride layer is $Si_3N_4$, with a thickness between 100 and 1000 nanometers. The sacrificial layer may be made of porous silicon instead of oxide and/or nitride. Step 386 involves deposition of a blanket silicon layer using conformal deposition. In one embodiment, this blanket silicon layer may be amorphous silicon or polysilicon, p-type in-situ doped with boron, having a thickness between 1 and 30 microns. Note that the silicon thickness is set such that the deep trenches are fully filled with silicon while the shallow (wider) near-surface trenches receive silicon on sidewalls, and their central regions are left with self-aligned relatively shallow hexagonal troughs or trenches. Step 388 involves depositing an optional thin silicon nitride dielectric layer on top by LPCVD or PECVD to serve as a protective cap for silicon layer. In one embodiment, this layer is between 100 and 1000 nanometers. Step 390 involves 3-D TFSS substrate release. In one embodiment and when using a silicon dioxide sacrificial layer, hydrofluoric acid (HF) is used to etch the oxide sacrificial layer. In another embodiment and when using a porous silicon sacrificial layer, a mixture of ammonia, peroxide, and water ($NH_4OH+H_2O_2+H_2O$) or a mixture of hydrogen peroxide and hydrofluoric acid ($H_2O_2+HF$) or a suitable composition of tri-methyl-ammonium-hydroxide (TMAH) may be used. The etch composition and temperature may be adjusted to achieve maximum etch selectivity for porous silicon with respect to silicon. This process releases the hexagonal-prism 3-D TFSS substrate. Note that the wet etchant selectively removes the sacrificial $Ge_xSi_{1-x}$ layer (or porous silicon sacrificial layer) by reaching the sacrificial layer through the template backside dielectric openings (note that backside openings may be formed directly in the template substrate backside without using any dielectric on the template backside). In another embodiment, the 3-D TFSS substrate may be released by the methods of the present disclosure. This process releases the hexagonal-prism 3-D TFSS substrate from the template. An optional step 392 involves laser crystallization of the released 3-D thin-film amorphous silicon or polysilicon substrate to form a large-grain polysilicon microstructure. The silicon nitride layer surrounding silicon serves as protective cap. The nitride layer is then selectively stripped. The hexagonal-prism 3-D TFSS substrate may then be used for subsequent 3-D TFSS fabrication.

Figure 26:
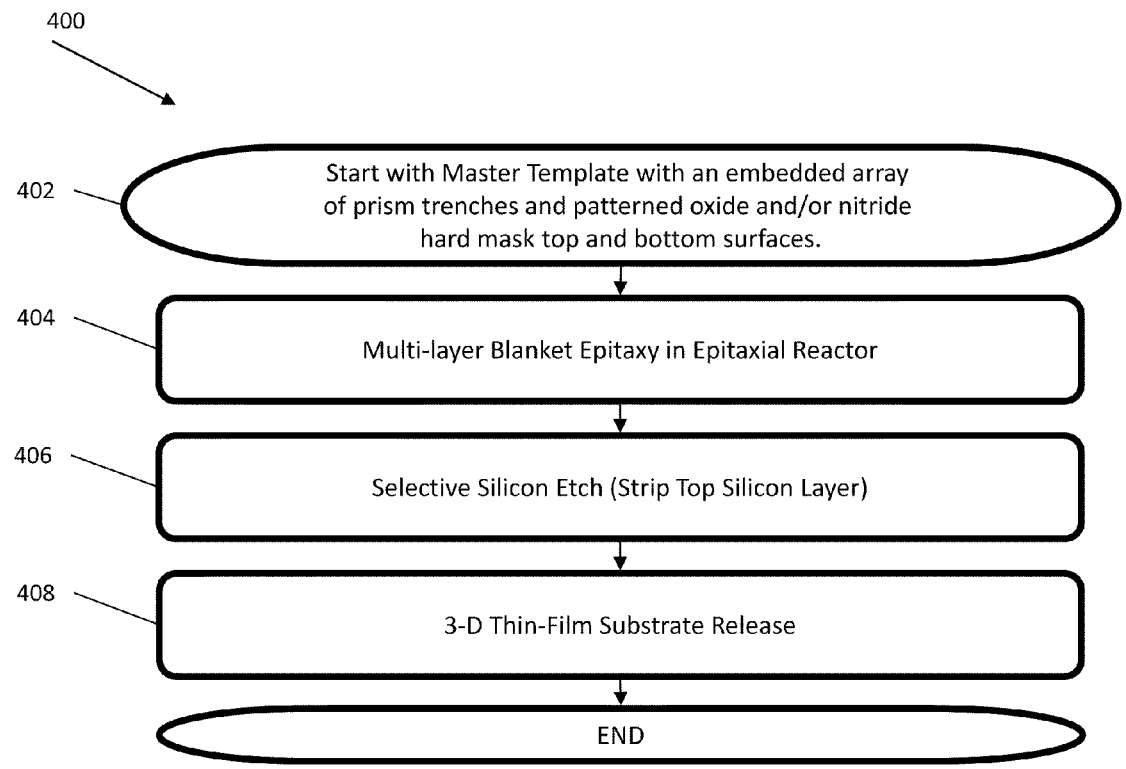
FIG. 26 shows an embodiment of a process flow for fabrication of self-supporting hexagonal prism 3-D TFSS substrates using layer release processing.

FIG. 26 shows an embodiment of a process flow 400 for fabrication of self-supporting (free standing) hexagonal-prism 3-D TFSS substrates using layer release processing. This process flow results in dual-aperture hexagonal-prism 3-D TFSS substrates with hexagonal prisms with open apertures formed on both the top and rear (there is no rear base layer). In step 402, a patterned hexagonal-prism (or another prism array) template is provided. This template has already been processed to form an embedded array of deep hexagonal-prism trenches. There is a patterned dielectric (oxide and/or nitride) hard mask on the template top and rear surfaces. Step 404 involves a multi-layer blanket epitaxial semiconductor deposition in an epitaxial growth reactor. Step 404 first involves an $H_2$ or $GeH_4/H_2$ in-situ bake cleaning, which is performed after a standard pre-epitaxial wet clean (the latter if necessary). Next, a thin sacrificial epitaxial layer is deposited on the frontside only. In one embodiment, $Ge_xSi_{1-x}$ is used for the sacrificial epitaxial layer and is between 10 and 2000 nanometers (in another embodiment a layer of porous silicon is directly deposited for the sacrificial layer). Next, a doped monocrystalline silicon epitaxial layer is deposited (in one embodiment, on the frontside only). In one embodiment, the layer is p-type, boron-doped and has a thickness between 1 and microns. Step 406 involves selective silicon etch to selectively strip the top silicon layer, stopping on the sacrificial layer. First, the top silicon layer is removed using a selective (wet or dry) silicon etch process until the top $Ge_2Si_{1-x}$ epitaxial layer (or porous silicon) or oxide/nitride hard mask is exposed. When using a plasma (dry) etch process, one embodiment uses optical end-point detection to ensure complete removal of the top silicon layer and exposure of the top sacrificial ($Ge_xSi_{1-x}$ or porous silicon) layer. Step 1908 involves 3-D TFSS substrate release using a selective etchant to etch the sacrificial layer. A highly selective isotropic (in one embodiment, wet) etch of $Ge_2Si_{1-x}$ is performed, with very high selectivity with respect to silicon (in one embodiment, with etch selectivity much better than 100:1). In one embodiment, a mixture of hydrofluoric acid, nitric acid and acetic acid (HNA) is used to etch the sacrificial $Ge_xSi_{1-x}$ layer (etchants such as $H_2O_2+H_2O$ or TMAH may be used to selectively etch porous silicon). Alternatively, a mixture of ammonia, peroxide, and water ($NH_4OH+H_2O_2+H_2O$) may be used. In another embodiment, the 3-D TFSS substrate may be released by the methods of the present disclosure. This process releases the crystalline silicon layer as a hexagonal-prism 3-D TFSS substrate, which may then be used for subsequent 3-D TFSS fabrication.

Figure 27:
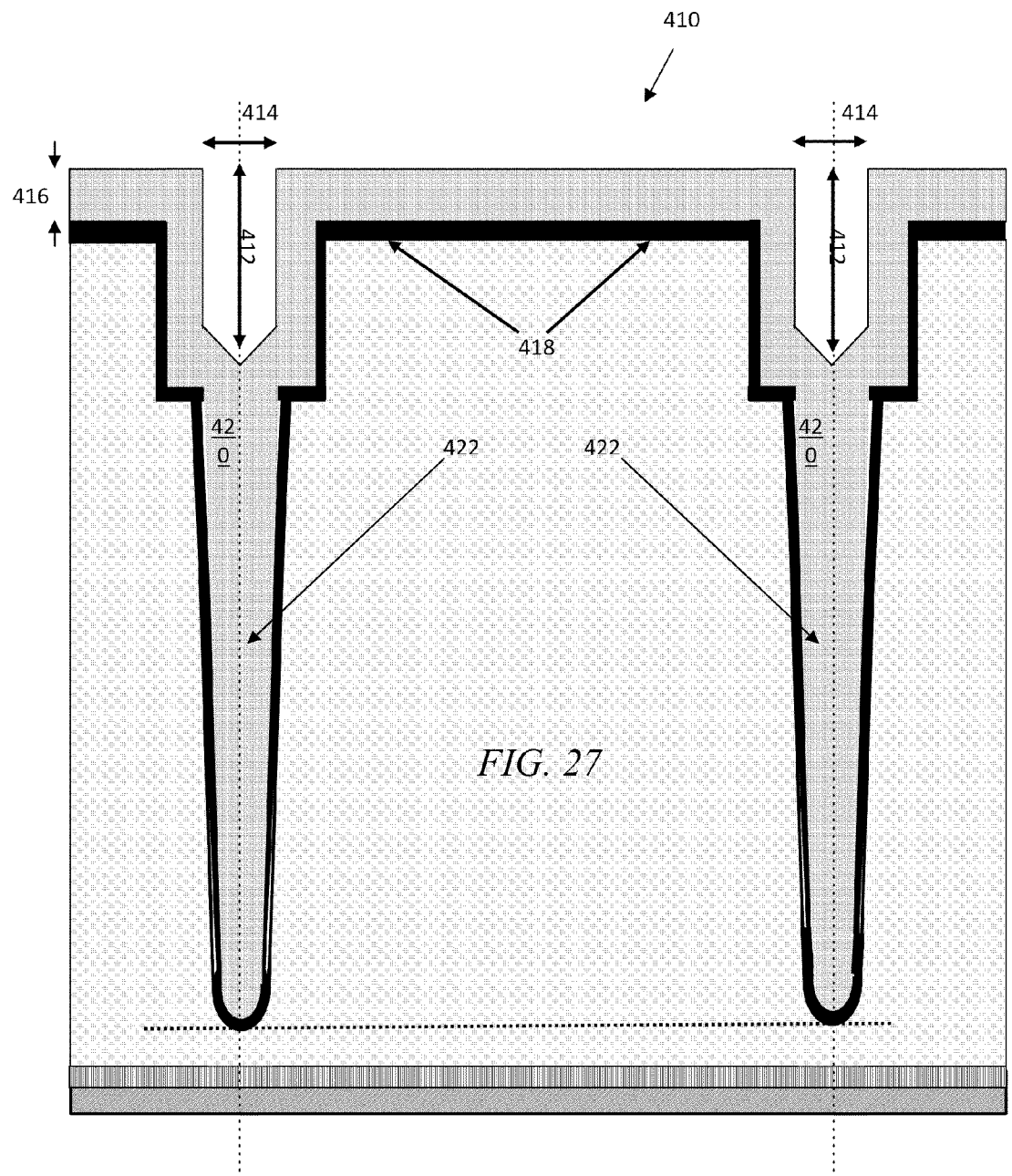
FIGS. 27 through 31 illustrate Y-Y cross-sectional views of a template with in-wafer trenches and no dielectrics on the template frontside, as it goes through the key process steps to fabricate a hexagonal prism 3-D TFSS substrate (single-aperture TFSS substrate) with a rear base layer.

FIG. 27 shows a view 410 after deposition of the thin (e.g., 200 to 2000 nanometers thick) sacrificial layer 418 (epitaxial $Ge_xSi_{1-x}$ or porous silicon or another suitable material) and the in-situ-doped (boron-doped for p-type base) epitaxial silicon layer 420. The epitaxial silicon deposition process fills the trenches (void-free trench fill) while leaving relatively shallow troughs (trenches 422) near the top. This may be done by stopping the epitaxial deposition process after the deeper/narrower trenches are fully filled with epitaxial silicon and before filling of the wider/shallower trenches on the template frontside (thus, forming the shallower troughs with height (L) 412 and width ($W_m$) 414 in conjunction with the top epitaxial silicon layer of thickness ($W_f$) 416.

Figure 28:
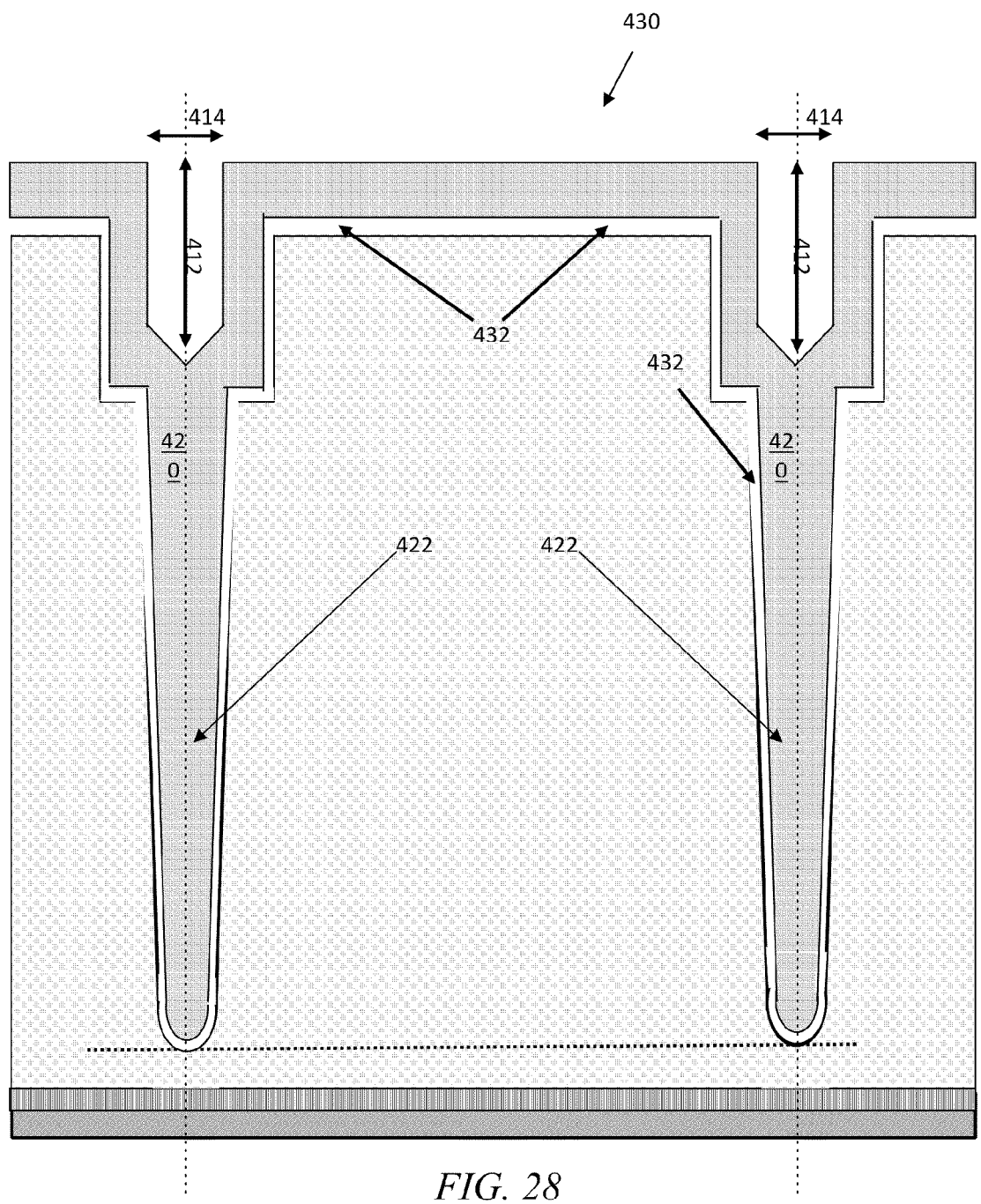
Figure 29:
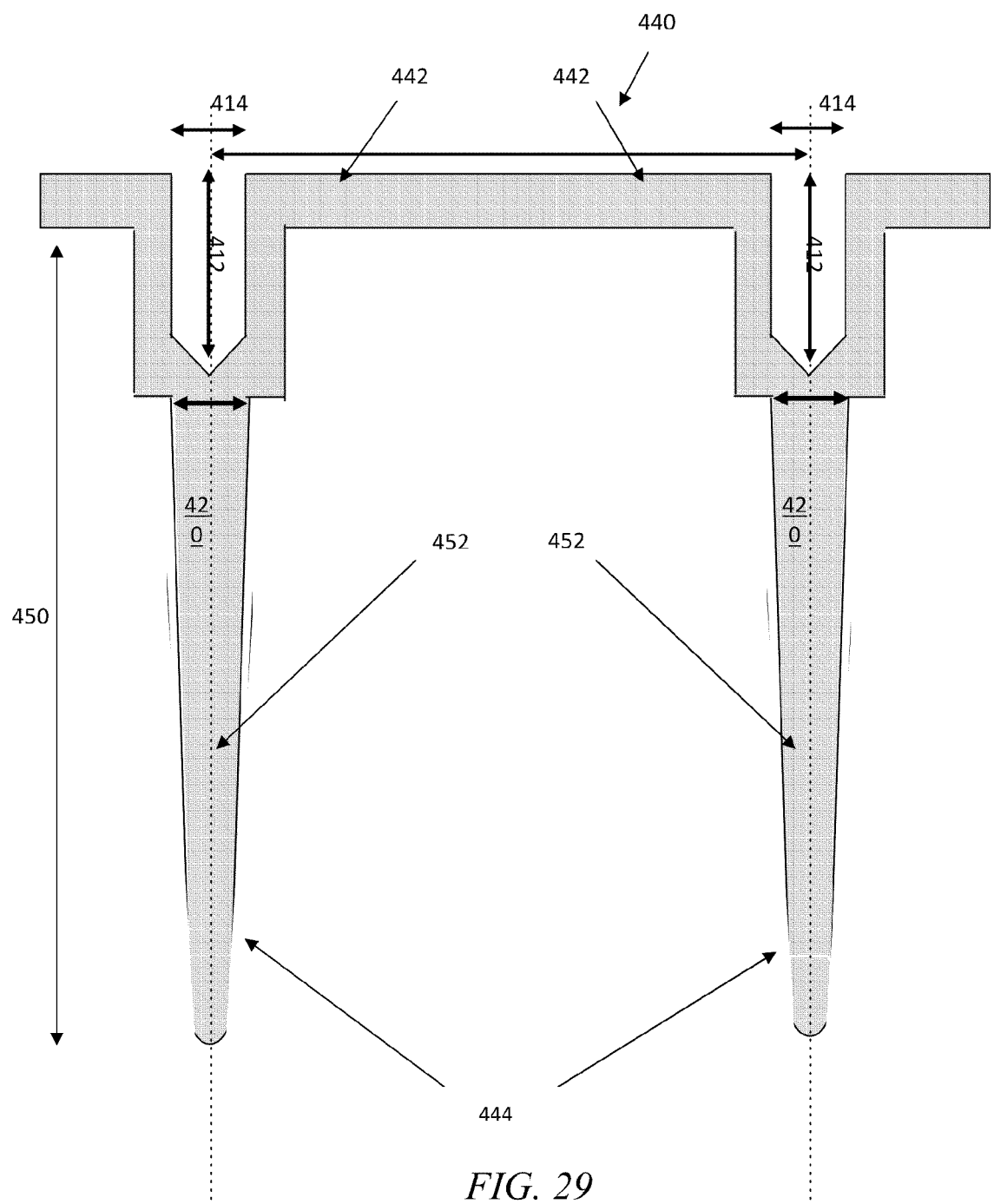
Figure 30:
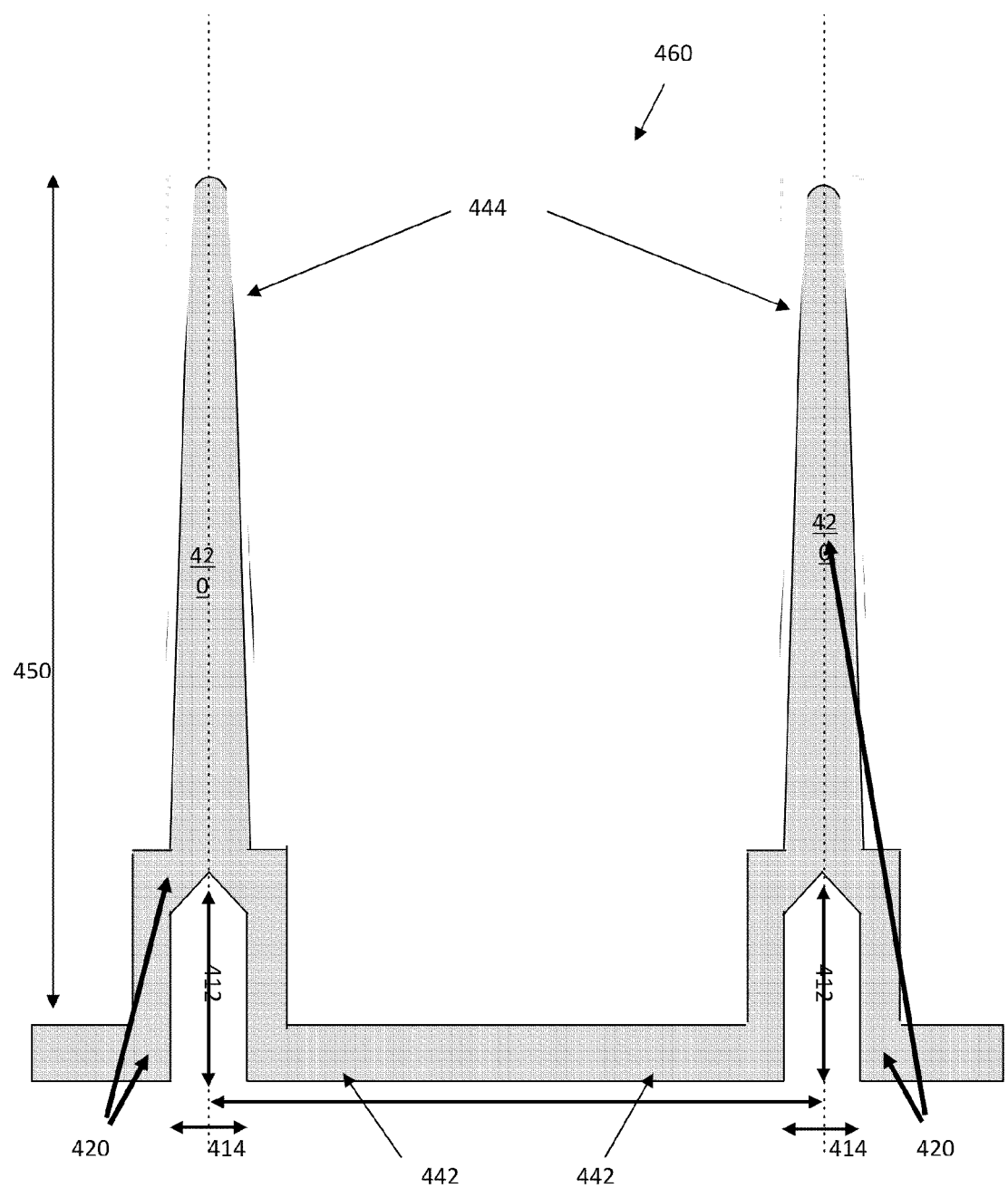
Figure 31:
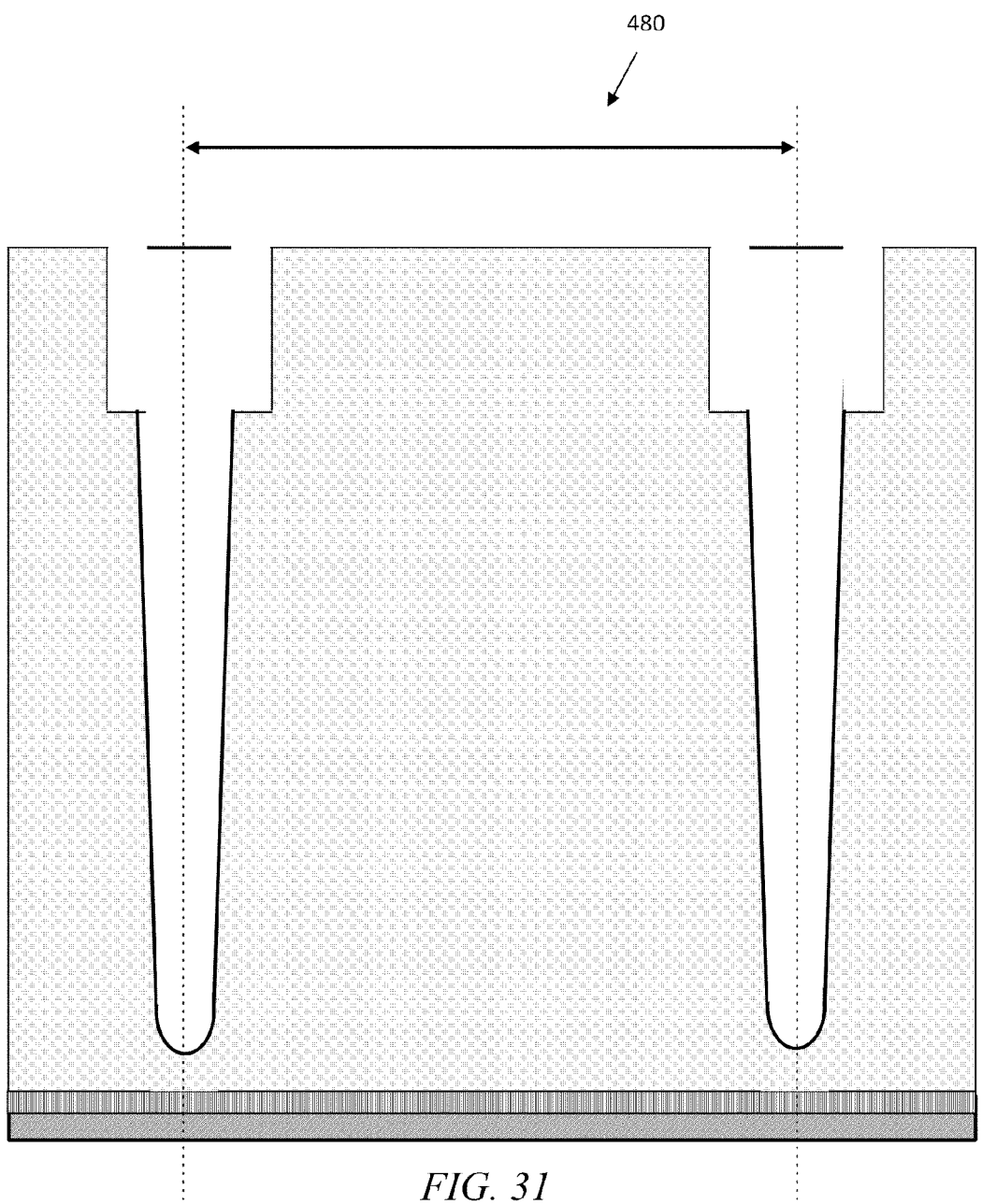

FIG. 28 shows a view 430 of the template in FIG. 27 after highly selective etching of the sacrificial layer 418, thus allowing for release and removal of the 3-D TFSS substrate 420 from the template. The porous silicon layer may also be broken using the methods of the present disclosure. FIGS. 29 and 31 illustrate Y-Y cross-sectional views 440 and 480 of the released substrate 420 from FIG. 28. The released substrate 420 has a base side 442, an emitter side 444. The substrate 420 has dimensions of $T_{st}$ (silicon sidewall thickness near the base side of the hexagonal-prism vertical sidewalls), $T_{sb}$ (silicon sidewall thickness near the emitter side of the hexagonal-prism vertical sidewalls), hexagonal-prism height 450, and tapered hexagonal-prism TFSS substrate sidewalls 452. Referring to the view 460 in FIG. 29, the base side 442 is shown on the top and the emitter side 444 is shown on the bottom (TFSS substrate as released from the template). In the view 460 in FIG. 30, the base side 442 is shown on the bottom and the emitter side 444 is shown on the top. FIG. 31 shows a Y-Y cross-sectional view 480 of the template shown in FIG. 28 after releasing and separating/removing the embedded hexagonal-prism single-aperture 3-D TFSS substrate with a rear base layer. Template 480 is ready for multiple reuse cycles.

Figures 32A, 32B:
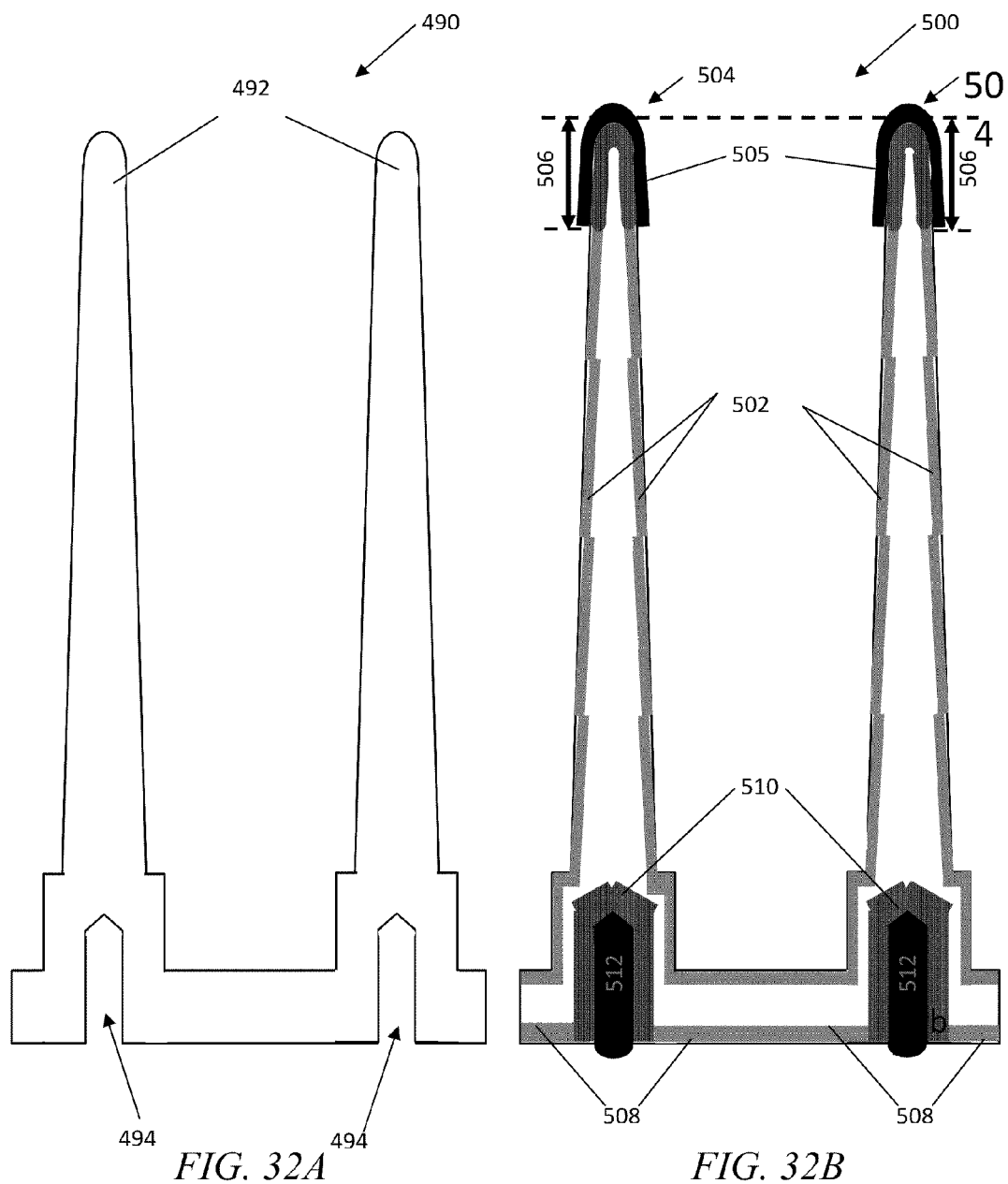

FIG. 32A shows a Y-Y cross-sectional view 510 of a unit cell within a single-aperture hexagonal-prism 3-D TFSS substrate with a rear base layer (released and removed from its template) before cell fabrication. For subsequent $n^+p$ selective emitter formation, the hexagonal-prism sidewalls are in-situ-doped with boron to form the base region at the time of 3-D TFSS substrate fabrication. The sidewalls are doped with boron (in one embodiment, at the time of silicon deposition into the template), either uniformly or in a graded profile, more lightly doped at the prism sidewall surface and more heavily doped towards the sidewall vertical center axis. Similarly, the hexagonal-prism rear base layer is in-situ-doped at the time of 3-D TFSS substrate fabrication. The base layer is doped with boron, either uniformly or in a graded profile, more lightly doped at the rear base layer top surface and more heavily doped towards the rear base layer rear surface, creating a built-in back-surface-field effect in the rear base layer, improving the cell performance. The prism top (emitter side) ridges 512 are used for emitter contact diffusion and metal contact formation and the hexagonal troughs 494 for base contact diffusion and buried metal contact formation.

FIG. 32B shows a Y-Y cross-sectional view 520 of a unit cell within the hexagonal prism 3-D TFSS of this disclosure (using the hexagonal prism 3-D TFSS substrate with a rear base layer as shown in FIG. 32A) after self-aligned formation of: selective emitter regions 502 (e.g., less heavily-doped with phosphorus, $n^+$ selective emitter on the hexagonal prism sidewall surfaces as shown); heavily-doped emitter contact regions 504 with coverage height $L_e$ 506 (e.g., more heavily-doped with phosphorus, $n^{++}$ doped emitter contact regions on the hexagonal prism top hexagonal ridges as shown); selective base regions 508 on the rear surface of the rear base layer (e.g., less heavily-doped with boron, $p^+$ selective base on the rear base layer rear surface as shown); and heavily-doped (boron-doped $p^{++}$) base contact diffusion regions 510 in the rear base layer trenches/troughs (e.g., more heavily-doped with boron, $p^{++}$ doped base contact regions). The cured solid dopant source layers for emitter 505 and base regions 512 are shown as dark segments on the top hexagonal-prism ridges and within the rear base rear filled trenches (troughs), respectively.

Figures 33A, 33B:
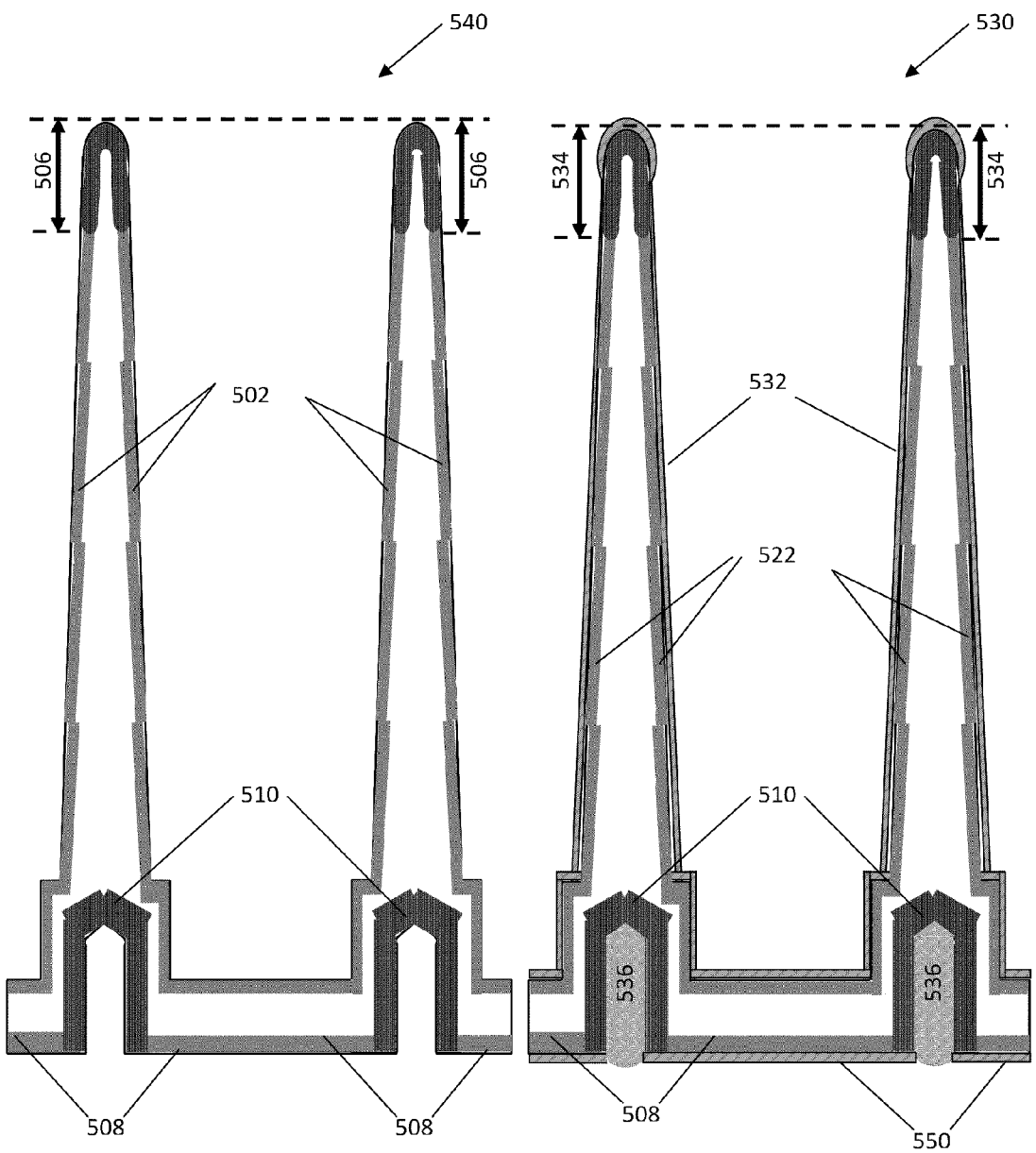

FIG. 33A shows a Y-Y cross-sectional view 520 after the cured n-type and p-type dopant layers have been removed and before the thermal diffusion process. FIG. 33B shows a Y-Y cross-sectional view 530 after formation of surface passivation and anti-reflection coating (thermal $SiO_2$ and/or PVD or PECVD $SiN_x$ or $AlN_2$ ARC) dielectric layers 532. Note $L_e$ 534 and cured boron doped glass 536. FIG. 34A shows a Y-Y cross-sectional view 540 after formation of emitter 542 and base 544 contact metals (silver, aluminum, copper, etc.) by fire-through and/or selective plating. FIG. 34B shows a Y-Y cross-sectional view 550 after the addition of a detached highly reflective rear specular or diffuse mirror 552 (e.g., silver or aluminum coating on a base interconnect plane on a PCB in the solar module assembly; the mirror may contact the rear base contacts as shown).

Figure 35:
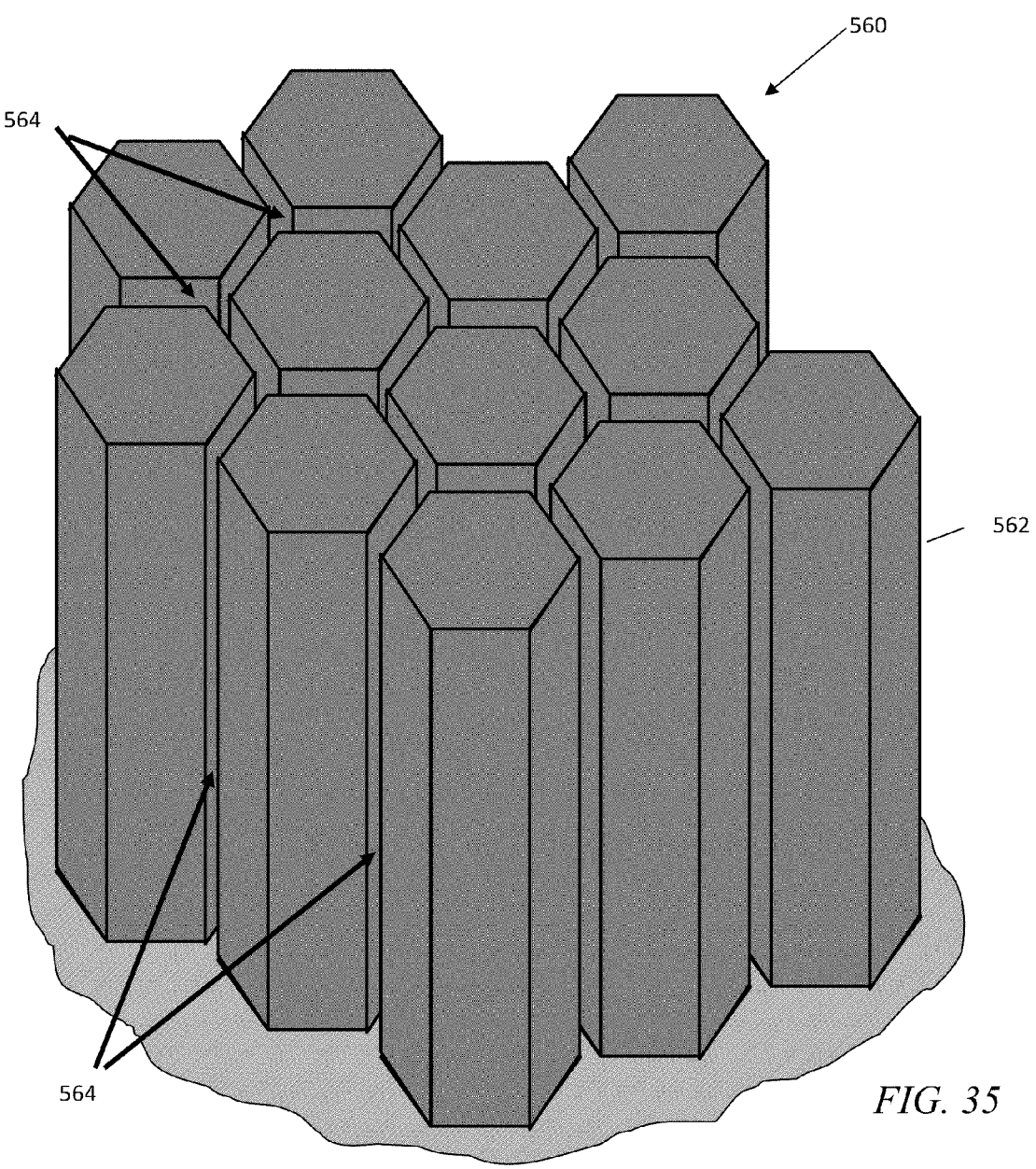
FIG. 35 shows a view of an embodiment of a template including hexagonal prism posts.

FIG. 35 shows a view 560 of a template with hexagonal-prism posts (pillars) 562. A hexagonal-prism 3-D TFSS substrate (not shown) is fabricated by first forming a suitable relatively conformal thin sacrificial layer (in one embodiment, porous silicon) on the template, then filling in the relatively deep trenches 564 between hexagonal-prism posts 562, and subsequently releasing the hexagonal prism 3-D TFSS substrate by selectively etching or fracturing the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

Figure 36:
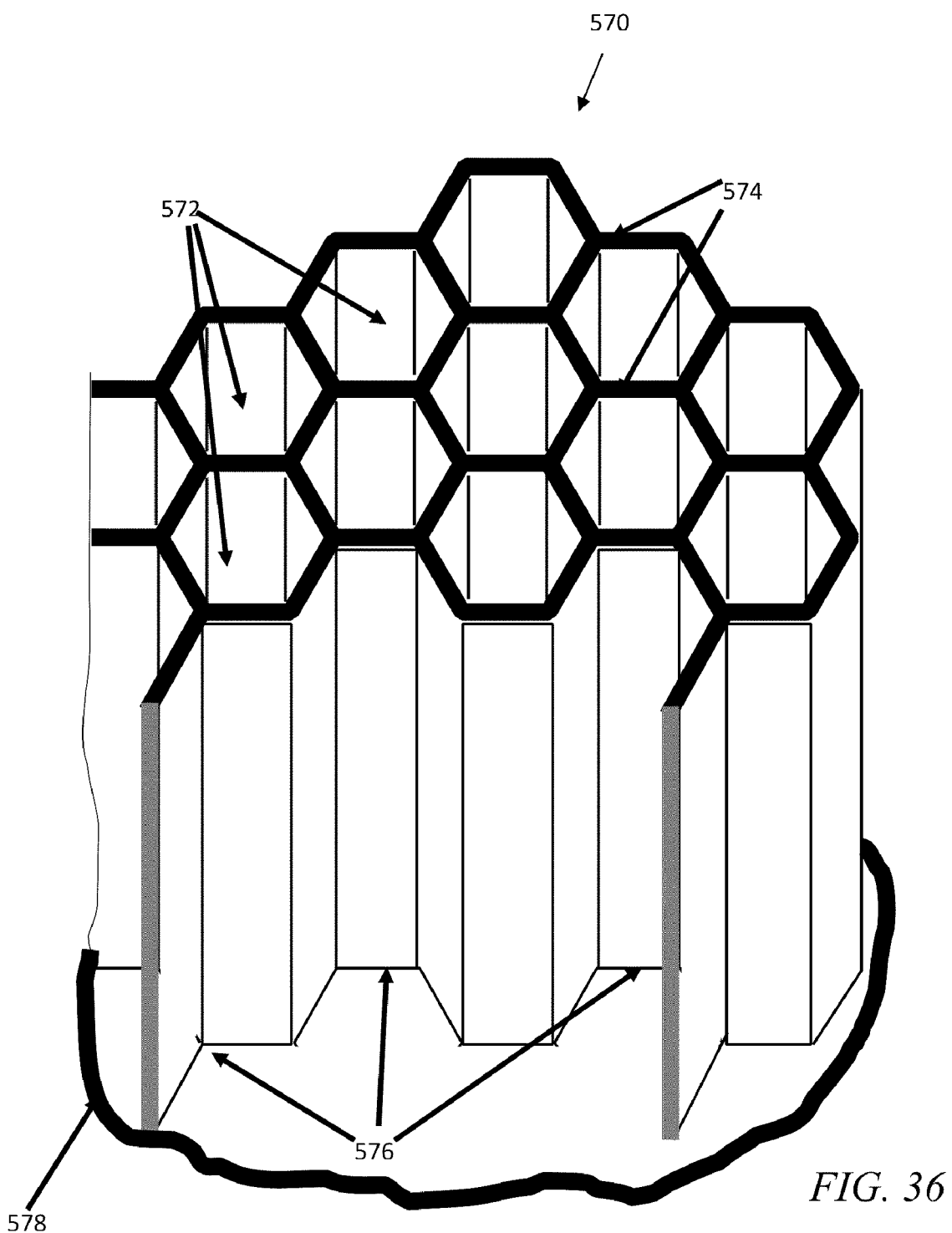
FIG. 36 shows a 3-D cross-sectional view of an embodiment of a single-aperture hexagonal-prism 3-D TFSS substrate (i.e., TFSS substrate with an integral base layer), including the substrate rear monolithically (integrally) connected to a substantially flat planar thin semiconductor film.

FIG. 36 shows a view 570 of a template with hexagonal-prism posts (pillars) 572. A hexagonal-prism 3-D TFSS substrate (not shown) is fabricated by first forming a suitable relatively conformal thin sacrificial layer (in one embodiment, porous silicon) on the template, then filling in the relatively deep trenches 574 between hexagonal-prism posts 572, and subsequently releasing the hexagonal prism 3-D TFSS substrate by selectively etching or fracturing the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

Figure 37:
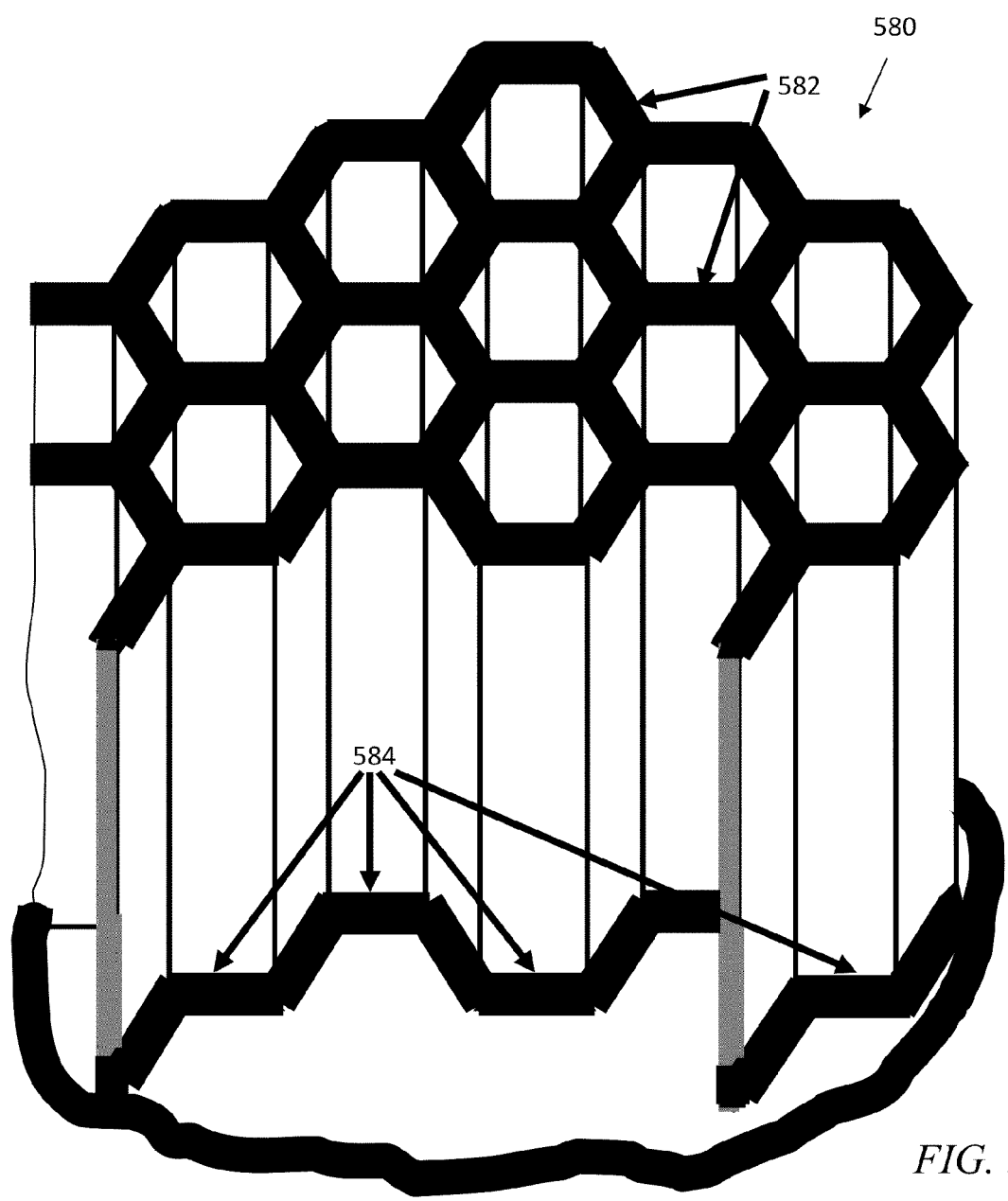
FIG. 37 shows multiple adjacent hexagonal-prism unit cells, after completion of the TFSS fabrication process and after mounting the cell rear base side onto a rear mirror.

FIG. 37 shows a 3-D view 580 of multiple adjacent prism unit cells from a regular hexagonal prism TFSS of this disclosure, after cell fabrication, including self-aligned base and emitter contact metallization. The dark region on the top 582 of the unit cell is the self-aligned emitter contact metal; the rear 584 of the unit cell is the self-aligned base contact metal. The prism sidewall surfaces are doped to form the selective emitter junctions (e.g., shallow $n^+p$ junctions with a junction depth of 0.2 to 0.5 micron in boron-doped silicon base).

Figure 38A:
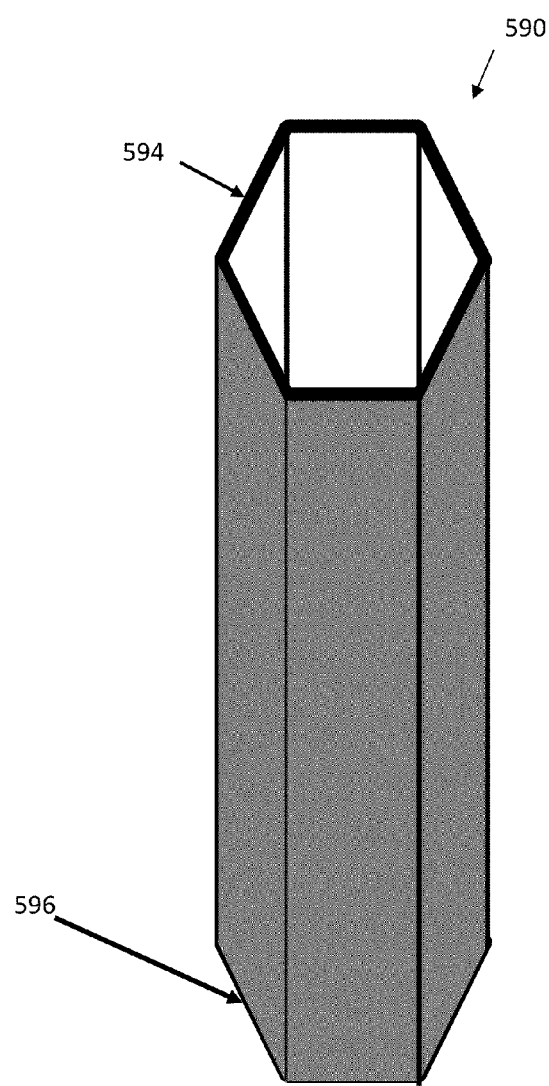
FIGS. 38A and 38B show 3-D views of a single unit cell in a dual-aperture hexagonal-prism 3-D TFSS substrate, before and after self-aligned base and emitter contact metallization, respectively.

FIG. 38A shows a quasi 3-D view 590 of a single unit cell from a regular dual-aperture hexagonal-prism TFSS of this disclosure (shown for the cell without a rear base layer), before self-aligned base and emitter contact metallization. The prism sidewall surfaces are doped to form the selective emitter junctions (e.g., $n^+p$ junctions in boron-doped silicon base). FIG. 38A shows top hexagonal opening 594, which may form the frontside self-aligned emitter metallization contacts 592; and rear (bottom) hexagonal opening 596, which may form the rear selective base self-aligned contacts 594.

Figure 38B:
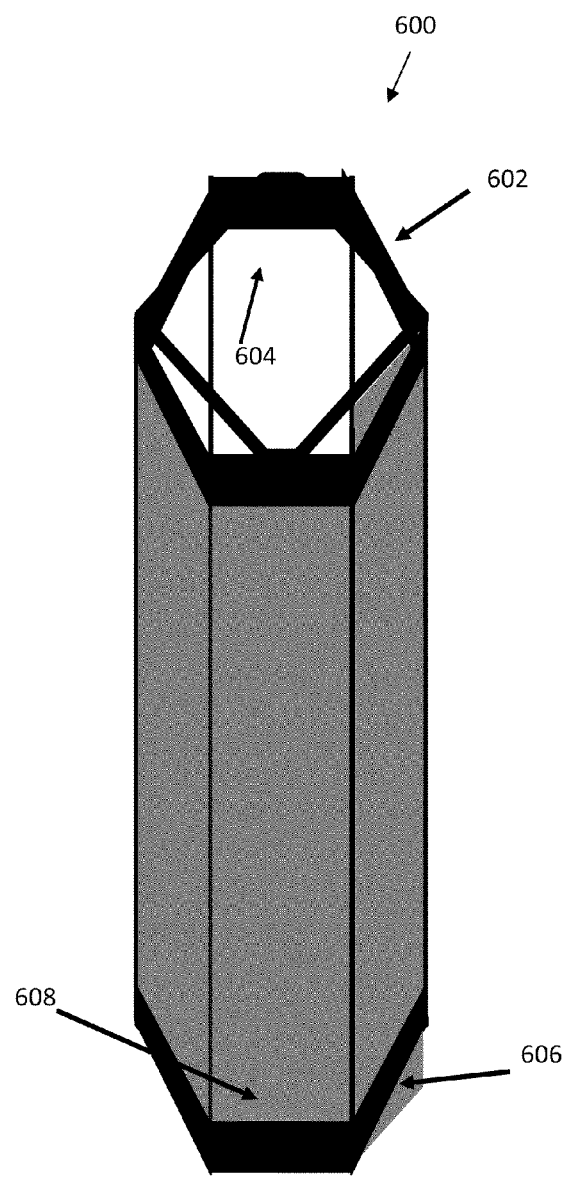

FIG. 38B shows a quasi 3-D view 600 of a single unit cell from a regular hexagonal prism TFSS of this disclosure, after cell fabrication, including self-aligned base and emitter contact metallization. The dark region on the top of the unit cell is the self-aligned emitter contact metal 602; the rear of the unit cell is the self-aligned base contact metal 606. The prism sidewall surfaces are doped to form the selective emitter junctions (e.g., shallow $n^+p$ junctions with a junction depth of 0.2 to 0.5 micron in boron-doped silicon base). One embodiment of the present disclosure utilizes a screen printing material having mesh openings less than 10 um in diameter. The mesh openings must be smaller than the openings of the micro cavities on the 3-D substrate or capillary forces generated by the micro cavities on the 3-D substrate will pull the liquid coating material in. Alternatively, a continuous flexible thin sheet that has a rough surface may be used as a screen printing material.

FIGS. 39A through 50 are not found in U.S. Pat. No. 7,745,313 of which the present disclosure is continuation-in-part application. The disclosed subject matter takes full advantage of the characteristics of the buried mechanically-weak layer (also described herein as the porous layer and porous silicon layer), provides the design requirements for the method and apparatus for releasing a thin film substrate from a template. The provided requirements result in, among others, the following advantageous features: (1) It is desirable to limit/constrain the maximum deflection of the released portions of the thin substrate to a maximum value until the substrate is fully released. In other words, the maximum bending angles between a released portion and a unreleased portion of the thin substrate have to be limited/constrained to prevent cracking; (2) It is desirable to apply and maintain smallest possible pulling forces that are capable to release substrate portions at beginning and during releasing process; (3) It is desirable to locate, initiate and continue the substrate releasing process from its weakest micro-structural regions within the mechanically-weak interface layer and apply the pulling forces directly to the weakest regions at any releasing moment. In other words, it is desirable to propagate the breaking of the mechanically-weak micro-structures, or the releasing of substrate, from weakest to the strongest portions and directions until the thin substrate is fully released/separated from its re-usable template; (4) It is desirable to initiate and continue the substrate releasing from all the relatively weaker or weakest regions simultaneously; (5) It is desirable to perform the thin substrate releasing in a self-alignment process. In other words, the weakest micro-structural regions before releasing and at any moment of the releasing are automatically located and released without a separate location identification and alignment process. In addition, the releasing method and apparatus is performed to accommodate variations of the weakest micro-structural regions between wafer to wafers and batch to batch in a self-aligned releasing process.

According to the present disclosure, controlled air flows that are mainly in the plane above and parallel to the substrate or template surface are applied to the substrate or template surface. The air flows are controlled in continuous or cycling modes and their flow directions may also be changed during substrate releasing in a controlled manner. The lifting forces generated from the high-speed air flows are used to initiate and extend the thin substrate releasing from its weakest interface portions to strongest interface portions in a self-aligned releasing process. The self-aligned process is achieved by the mechanism that given a certain air flow on the substrate surfaces, the weakest portion of the mechanically-weak layer responses to the lifting forces more than the relatively stronger attached portions in any given moment of the releasing process. And the releasing front is automatically extended/propagated from the weakest portions to its surrounding regions until the thin substrate is fully released. Therefore, this releasing method starts and continues from the weakest portions in the mechanically-weak layer in a self-aligned process. During releasing, the deflection of the partially released substrate or template is constrained so that cracking of the released portion is avoided.

According to the present disclosure, a wafer comprising an attached substrate and template is placed and chucked on a bottom plate by vacuum or electrostatic chucking forces. The substrate side of the wafer may face up or face down. A top plate is placed on top of the wafer surface while keeping a small gap between the bottom surface of the top plate and the top surface of the wafer. The dimension of the gap may be actively adjusted during the releasing process in a controlled manner for constraining the maximum deflection of the released substrate portions and for adjusting the air flows. The motion of the active gap adjustment may be achieved by hydraulic or motor driving. There may also be shallow grooves that are machined on the bottom surface of the top plate. And these shallow grooves are connected to a vacuum source so that the released substrate or template may be separated from its counterpart and vacuum chucked to the top plate. There is also single or plurality of through holes made into the top plate and these through holes are air inlets or outlets that are connected to vacuum or high pressure sources through flow controlling and regulating valves.

In one embodiment, the top plate and the bottom plate forms an enclosed high pressure chamber. There are also air inlets or outlets made on the bottom plate. In this case, air flows in the gap will be generated when a compressed air pressure differential is made between the top plate and bottom plate air connections. Air flows can enter from the ports on the bottom plate, flow into the gap from wafer edge and exit from the ports on the top plate. Alternatively, air flows can enter from the ports on the top plate, flow out the gap at the wafer edge and exit from the ports on the bottom plate. Alternatively, the flow direction change may be applied during the releasing process. The purpose for the air flow control is to generate proper lifting force necessary to separate the substrate and template. In yet another embodiment of the present disclosure, the sidewalls between the top and bottom plate are mainly open except for the pillars to support the top plate and motion control units for the active gap control. In this case, the bottom plate is mainly serves as a supporting plate and the wafer chucking plate. There are inlets or outlets holes made on the top plate and the top plate can be connected to vacuum sources, high air pressure sources, or both. In this open-system case, air flow may also be generated in the gap between the top plate and the wafer top surface for controlled releasing. And the released substrate and template will be vacuum chucked on the top and bottom plate separately.

The term substrate in this disclosure refers to a thin plate, most likely made of semiconductor materials, which has lateral dimensions (diameter, length, width) much larger than its thickness. The term template in this disclosure refers to a structure that the substrate is originally attached to and is separated/released from. Usually the template is thicker and more rigid than the substrate. The attachment between the substrate and the template is through a thin mechanically-weak layer that is made of same or different materials as the substrate and the template as disclosed in the present application. As an example, a mono-crystalline silicon substrate with a diameter in the range of 200 mm and a thickness in the range of 10 um to 100 um is attached to a mono-crystalline silicon template with a diameter in the range of 200 mm and a thickness of 1 mm through a porous silicon layer with a thickness of about 5 um that is buried between the substrate and the template interface. The template and substrate interface surface may be substantially planar and/or consist of micro-machined three-dimensional microstructures in random or regular array patterns. Additionally, the terms porous layer and mechanically-weak-thin layer are used interchangeably in the present disclosure.

Figure 39A:
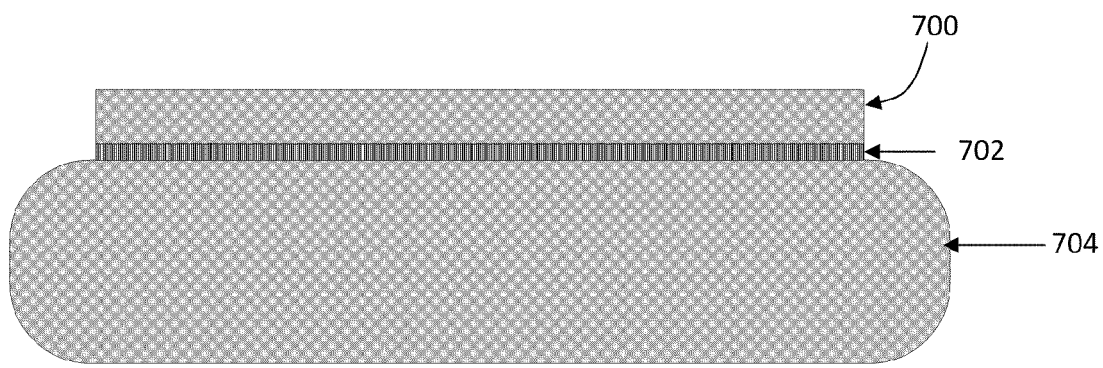

FIG. 39A is a cross-sectional schematic drawing of a silicon wafer that consists of substantially planar thin film silicon substrate (TFSS) 700 attached to reusable silicon template 704 through thin porous silicon layer 702. The silicon wafer may be in a circular shape with diameter of 100 mm to 300 mm or a square shape with rounded corners. Common dimensions for a solar cell application are 125 mm×125 mm or 156 mm×156 mm. The thickness of the reusable template may be in the 200 um to a few millimeters, while the thickness of the TFSS may be in the range of a few microns to a few hundreds of microns. The porous silicon layer may consist of a bi-layer structure with a high porosity (60%~80%) sub-layer on the template side and a low porosity (10%~30%) sub-layer on the TFSS side. The low porosity layer serves as the seed layer to facilitate the mono-crystalline epitaxial silicon growth and the high porosity layer is used facilitate the separation of the TFSS and template. Structural and process details are found in U.S. Patent Publication No. 2008/0264477 and U.S. Patent Publication No. 2009/0107545 by common inventor Mehrdad Moslehi and hereby incorporated by reference.

Figure 39B:
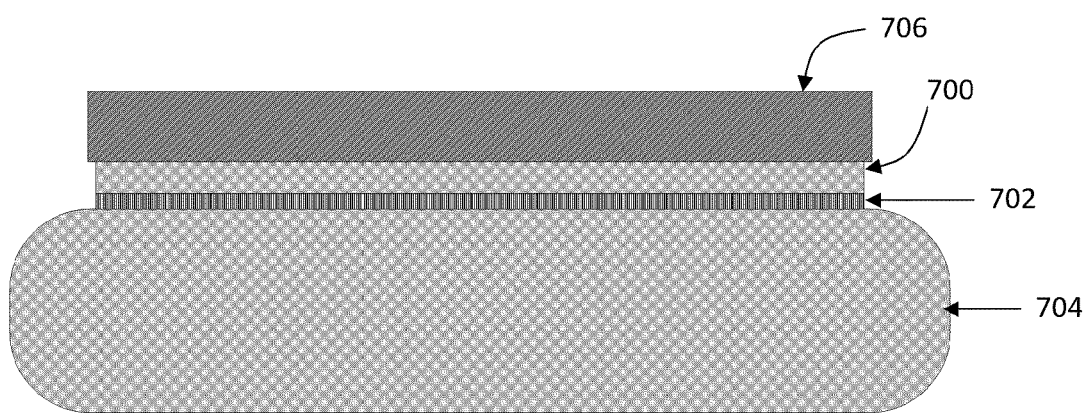

FIG. 39B illustrates a cross-sectional schematic drawing of the silicon wafer of FIG. 39A but with an optional reinforcement plate bonded to the TFSS. The silicon wafer shown in FIG. 39B comprises substantially planar thin film silicon substrate (TFSS) 700 attached to reusable silicon template 704 through thin porous silicon layer 702 and reinforcement plate 706. As shown in FIG. 39B, reinforcement plate 706 has been bonded on top of TFSS 700 prior to its release. In this case, the TFSS may be much thinner, such as in the range of a few microns to 100 microns. The reinforcement plate may be made of the same materials as the TFSS and the template materials, or another type of material such as polymer, glass, ceramic, metals or composites of them. The bonding of the reinforcement plate to the substrate top surface may be realized by applying a thin layer of adhesive materials or simple laminated in a vacuum environment.

Figure 40A:
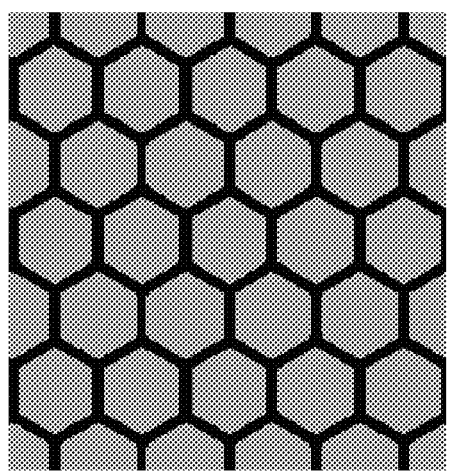
FIGS. 40A and 40B and 41A and 41B are schematic drawings of a silicon wafer comprised of three-dimensional thin film silicon substrate.
Figure 40B:
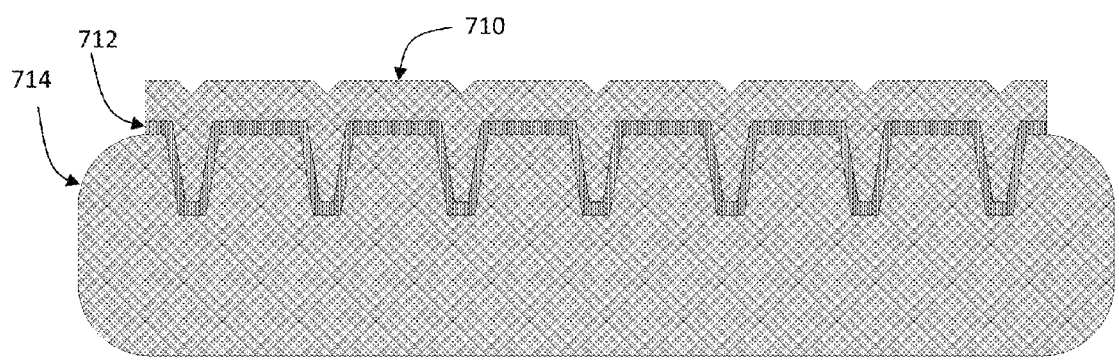

FIGS. 40A and 40B are schematic drawings of a top view (FIG. 40A) and side view (FIG. 40B) of a silicon wafer comprised of three-dimensional thin film silicon substrate (3-D TFSS) 710 attached to reusable silicon template 714 by thin porous silicon layer 712. As shown in FIG. 40A, the 3-D structure is an array of hexagonal honeycomb trenches micromachined from the template top surface and the reversed structural profile is transferred to the 3-D TFSS. 3-D structural designs and fabrication methods are disclosed in U.S. Patent Publication Nos. 2008/0264477 and U.S. Pub. No. 2009/0107545 both having common inventor Mehrdad Moslehi and which are hereby incorporated by reference.

Figure 41A:
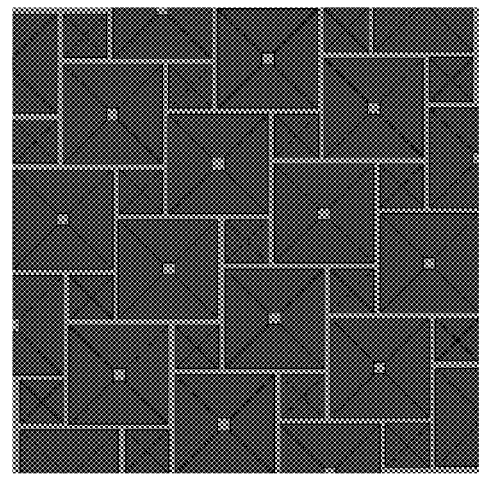
Figure 41B:
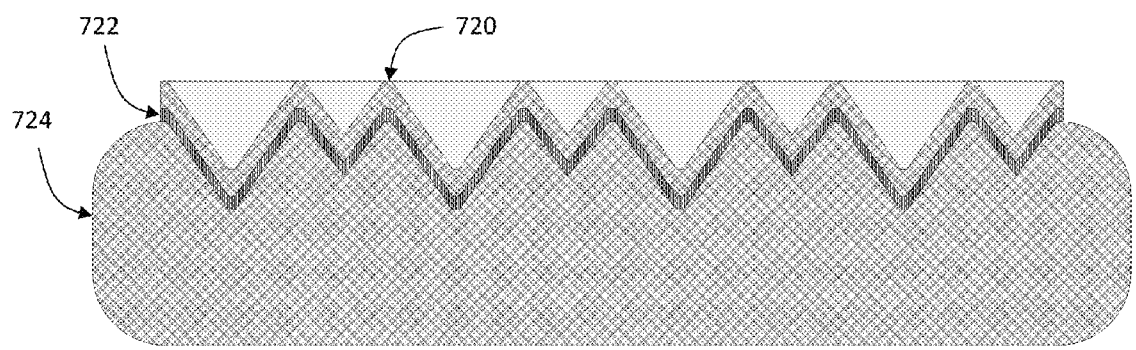

FIGS. 41A and 41B are schematic drawings of a top view (FIG. 41A) and side view (FIG. 41B) of a silicon wafer comprised of three-dimensional thin film silicon substrate (3-D TFSS) 720 attached to reusable silicon template 724 by thin porous silicon layer 722. As shown in FIG. 41A, the 3-D structure is an array of pyramidal cavities micro-machined from the template top surface and the reversed structural profile is transferred to the 3-D TFSS. The 3-D structural designs and fabrication methods are disclosed in U.S. Patent Publication Nos. 2008/0264477 and U.S. Pub. No. 2009/0107545 both having common inventor Mehrdad Moslehi and which are hereby incorporated by reference.

Figure 42A:
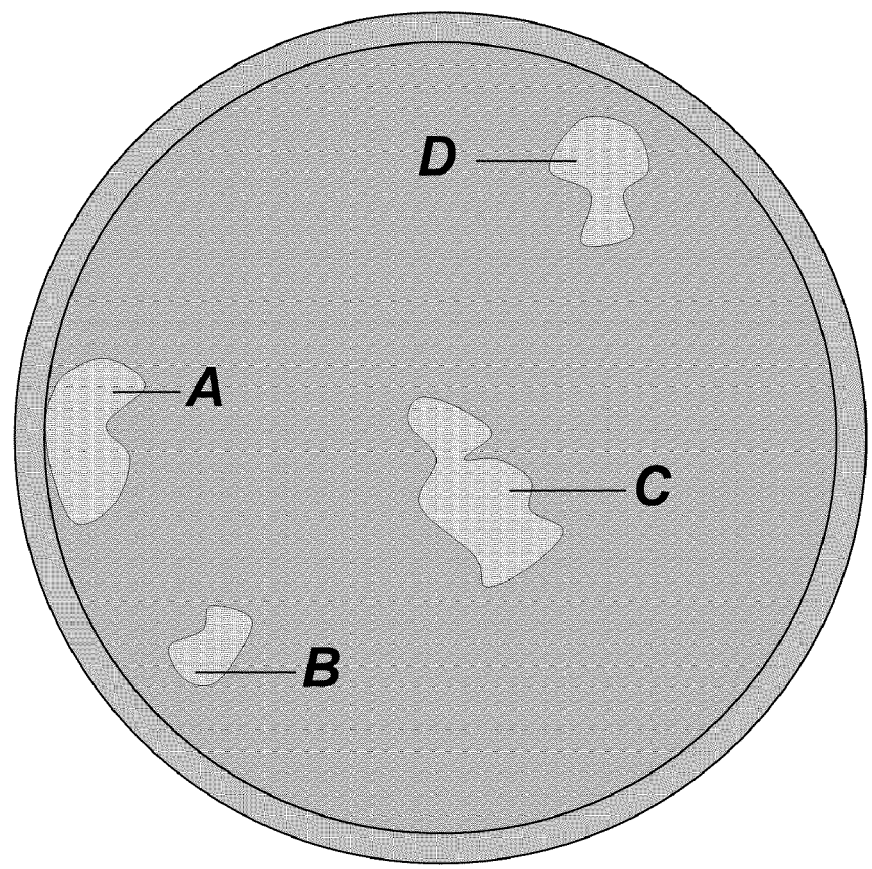
Figure 42B:
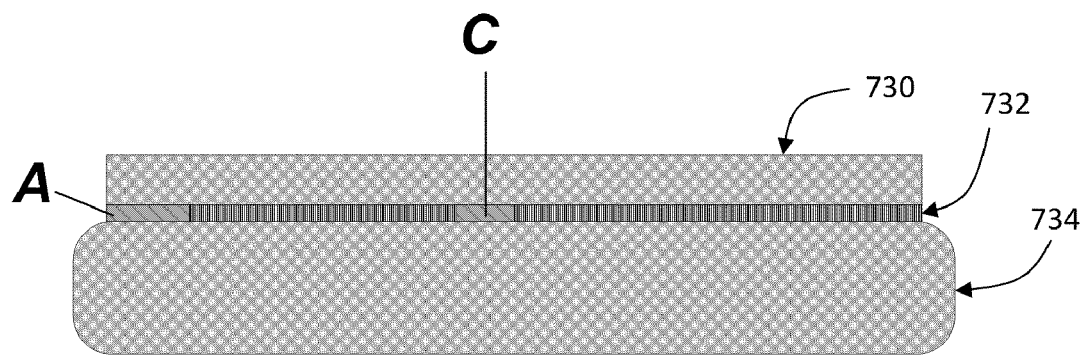

FIGS. 42A and 42B illustrate a top schematic view (FIG. 42A) and a cross-sectional schematic view (FIG. 42B) of buried mechanically-weak layer 732 under epitaxial silicon substrate layer 730 on template 734. The relatively weaker or weakest regions within the mechanically-weak layer, i.e., the porous silicon layer, are shown as regions A, B, C, and D in FIGS. 42A and 42B.

The porous silicon layer usually consists of a low porosity (10% to 30%) sub-layer on top of a high porosity (60% to 80%) sub-layer. The porosity distribution in the lateral plane may not be uniform as the porous silicon layer is formed. This non-uniform porosity distribution may be caused by electrical current density variations and chemical etching flow variations, especially at edges of a large wafer. In addition, the epitaxial silicon growth is conducted at an elevated temperature that is preferably in the range of 900° C. to 1200° C. At high temperatures, even lower than 900° C., porous silicon micro structures are changed and coalesced. The amount of micro-structural modifications and coalescences at different regions vary depending on the temperature distribution, gas flow density, epitaxial silicon thickness, stress concentration variations and other factors during the epitaxial silicon growth process. As a result, after epitaxial growth, certain coalesced porous silicon regions, such as A, B, C, and D (shown as examples), have weaker mechanical strength than the rest regions. The locations and sizes of the weaker regions may appear to be random or somewhat consistent from wafer to wafer and batch to batch. In the extreme cases, small regions of the epitaxial silicon layer may already be dislodged locally right after the epitaxial silicon growth. However, the existence, location, and size of the buried weaker regions are difficult to indentify from the top of the epitaxial silicon substrate surface. The present disclosure provides releasing methods that starts the thin substrate releasing from the relatively weaker and weakest regions within the mechanically-weaker layer in a self-aligned releasing process.

Figure 43A:
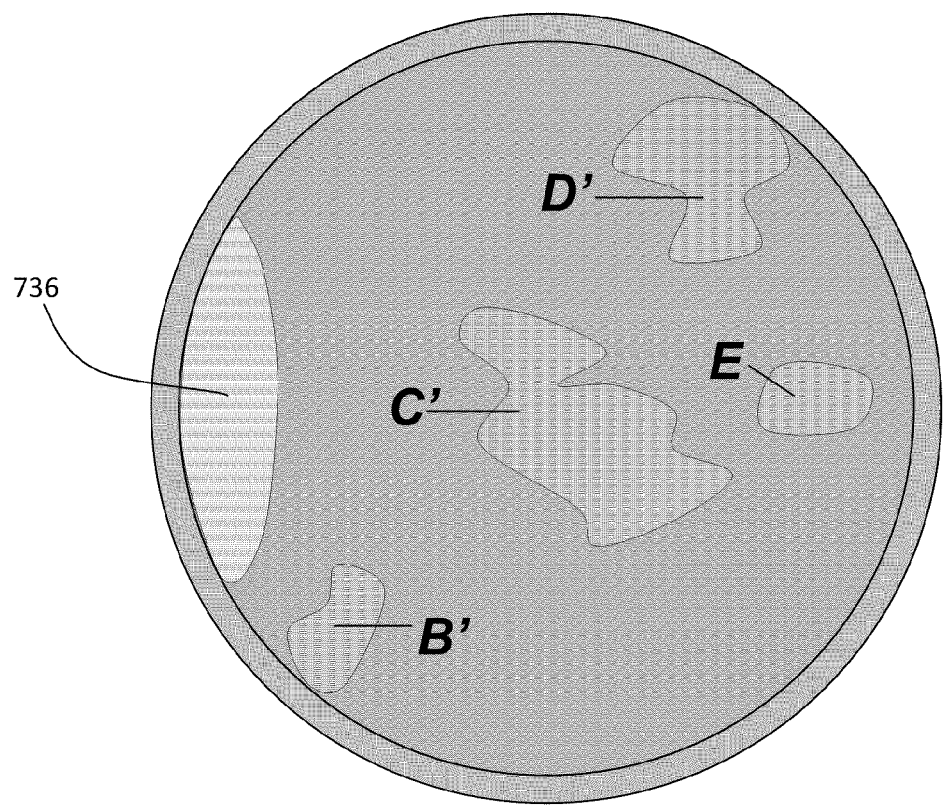
Figure 43B:
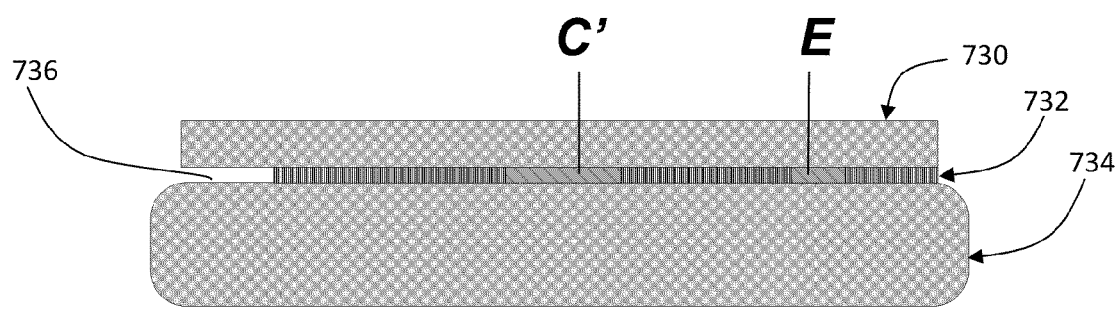

FIGS. 43A and 43B illustrate a top schematic view (FIG. 43A) and a cross-sectional schematic view (FIG. 43B) during the partial release of the wafer described in FIGS. 42A and 42B (comprised of buried mechanically-weak layer 732 under epitaxial silicon substrate layer 730 on template 734).

FIGS. 43A and 43B illustrate the dynamic changes of the mechanically-weak layer during a thin silicon substrate release. The expansion of the existing relatively weaker or weakest regions and generation of new weaker and weakest region within the mechanically-weak layer, i.e., the porous silicon layer, may occur during the substrate releasing process. The release of the TFSS starts from region A in FIG. 42A and propagates from the wafer edge at left to the wafer center. During the releasing process, physical forces are applied to the mechanically-weak layer. Due to the mechanical strength non-uniformity of mechanically-weak layer and external force changes and non-uniformity, new mechanically-weaker portions may be generated and existing weaker portions may be enlarged or further weakened by the direct releasing forces and indirect energy waves from the releasing process. In other words, the weakest mechanical strength portions at any given moment of the releasing process are generated and varied dynamically.

FIGS. 43A and 43B illustrate the top and cross-sectional schematic views, respectively, of the various mechanical strength regions corresponding to FIGS. 42A and 42B, with new and dynamically generated weaker portions in the mechanically-weak layer during the releasing process. Region E in FIG. 43A illustrates a newly generated mechanically-weaker region. Regions B', C' and D' have larger sizes in FIGS. 43A and 43B than the original pre 3D-TFSS release sizes shown in FIGS. 42A and 42B. And partially released region 736 corresponds to pre 3-D TFSS region A shown in FIGS. 42A and 42B.

The present disclosure provides releasing methods that applies the releasing forces and energies, at any moment of the releasing process, directly to the dynamically-changed relatively weaker and weakest regions within the mechanically-weaker layer in a self-aligned releasing process.

Figure 44:
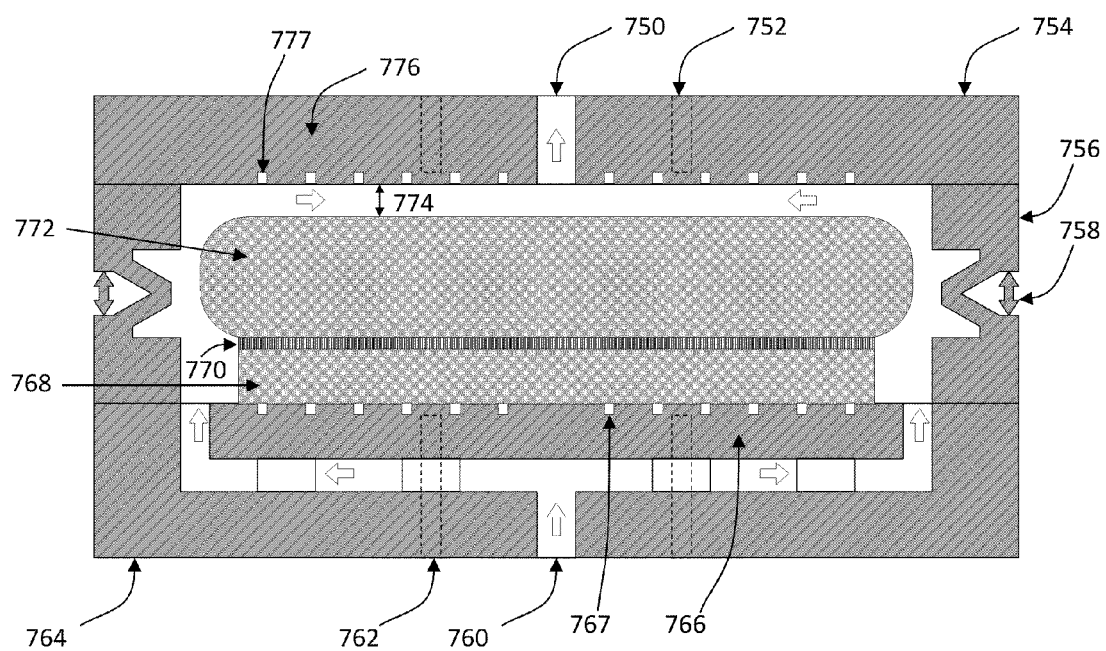
Figure 47:
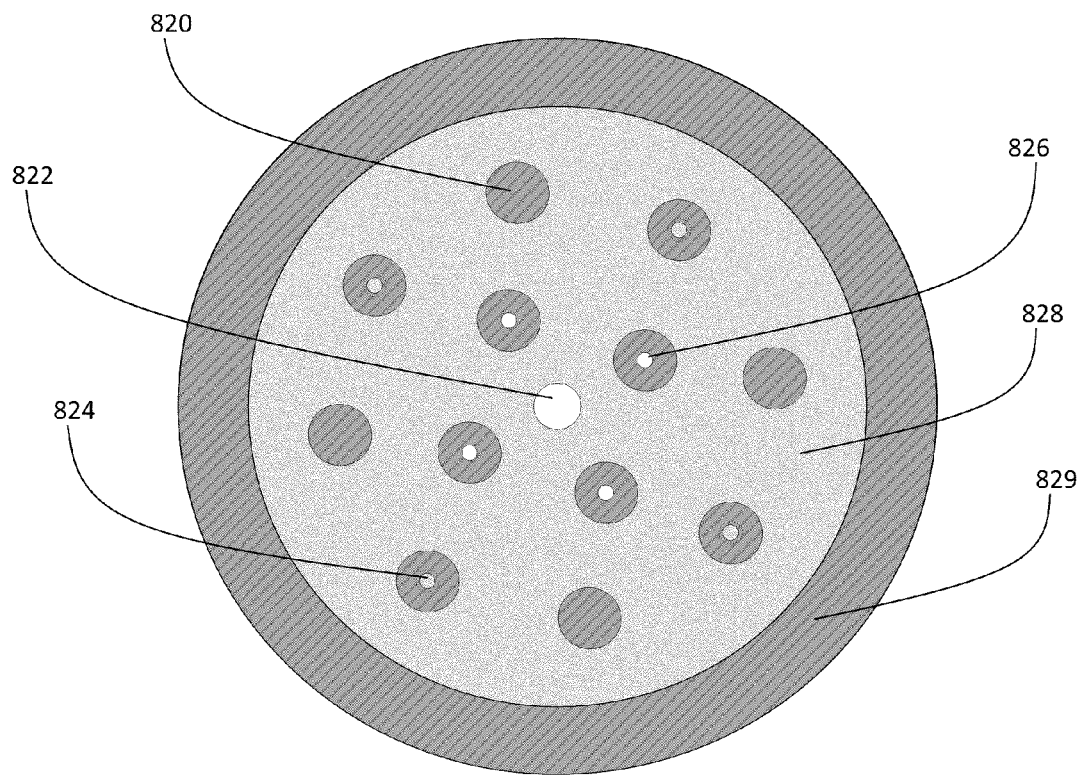
Figure 48:
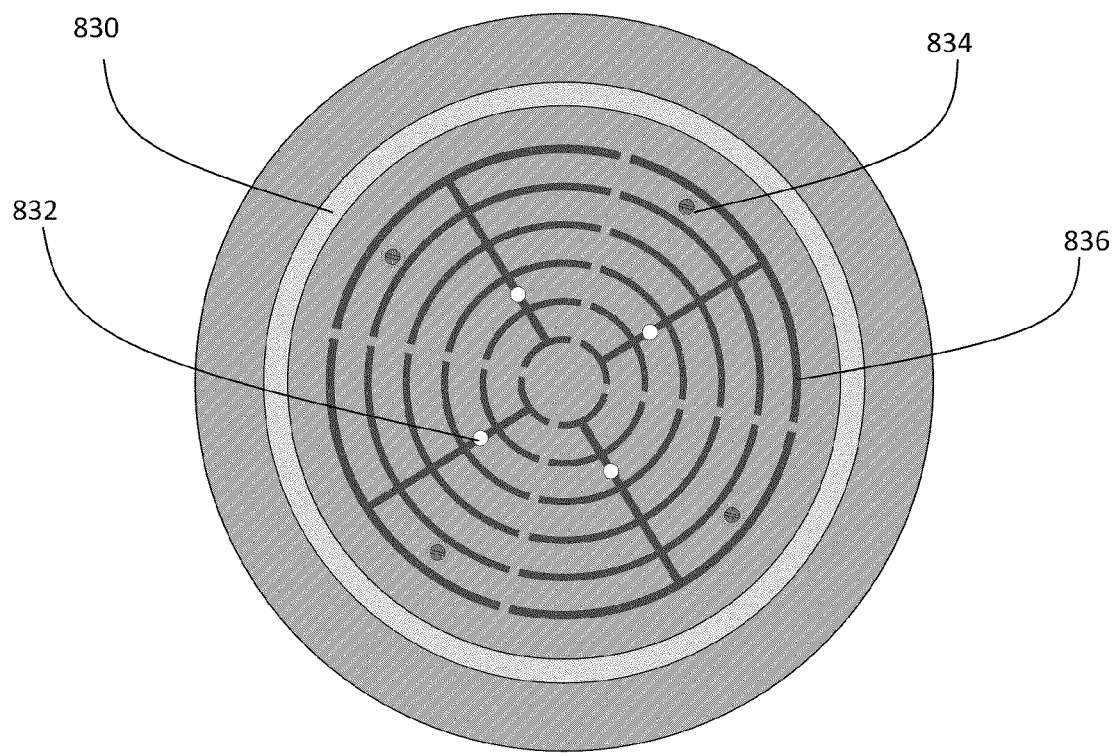
Figure 49:
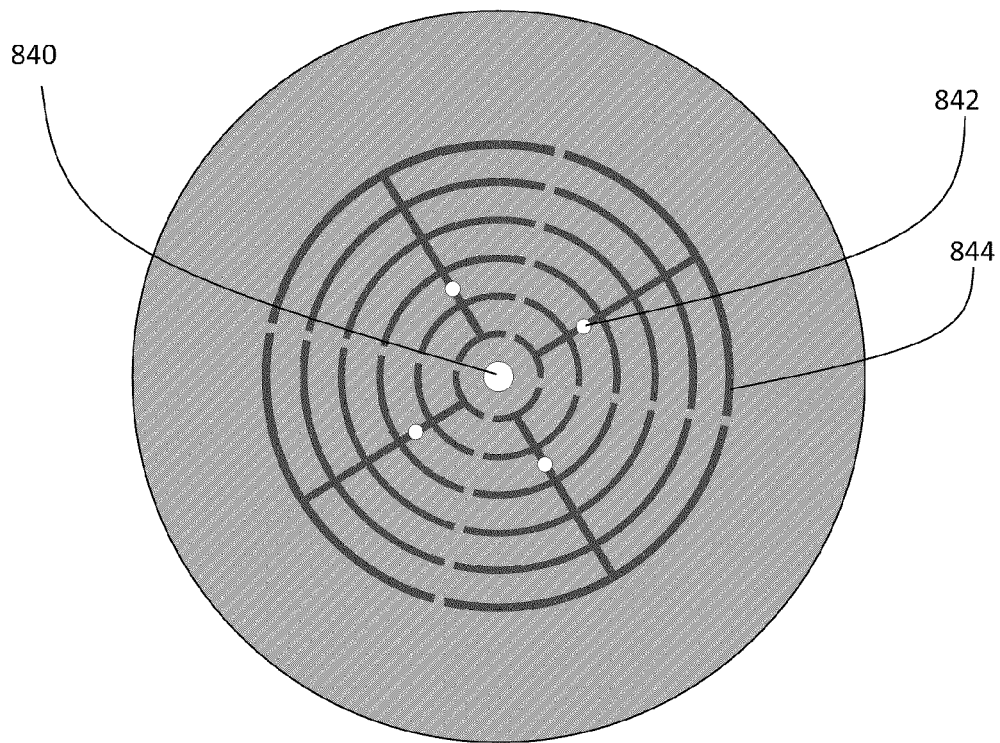

FIG. 44 illustrates the schematic cross-sectional view of one of a thin-substrate releasing apparatus of the present disclosure. As shown in FIG. 44, the wafer in the apparatus comprises substrate 768, template 772, and mechanically-weak layer 770. The wafer is placed and chucked on bottom vacuum chuck 766 having shallow vacuum grooves 767 that connect to vacuum chucking ports 762, which is mounted on bottom plate 764. Top schematic views of a bottom vacuum chuck and a bottom plate are illustrated in FIGS. 47 and 48, respectively. Sidewall support 756 serves as the chamber sidewall. Top plate 754 is mounted on sidewall support 756 and it comprises top vacuum chuck 776 having shallow vacuum grooves 777 that connect to vacuum chucking ports 752. FIG. 49 illustrates the bottom schematic view of a top plate. The compressed air that flows in the gap between the top plate 754 and the wafer top surface—shown as gap 774 and referred to in this specification as the gap—is responsible for generating lifting forces to release the thin substrate. Gap 774 may be adjusted actively by the position and motion control mechanism, shown as actuator 758, on sidewall support 756. There are compressed air inlets or outlets on bottom plate 764 and top plate 754 are described in the following sections.

As shown in FIG. 44, the wafer is vacuum chucked on top of bottom vacuum chuck 766. As shown, the substrate 768 is chucked to bottom vacuum chuck 766. However, the thin substrate side of the wafer may face down or face up. When the thin substrate side is facing down, it surface makes the contact to with bottom vacuum chuck 766. There is a protective (not shown), such as a thin Teflon coating, on the top surface of bottom vacuum chuck 766 to prevent the substrate surface from scratching damage. Bottom vacuum chuck 766 is mounted on top of bottom plate 764. Side support 756 that supports the top plate 754 is also mounted on bottom plate 764. Thus, bottom plate 764, top plate 754, and the side supports such as side support 756 (the side supports also serves as the chamber sidewall) form an enclosed pressure chamber with air inlets and outlets 750 and 760 machined on top plate 754 and bottom plate 764 respectively. The pressure in the chamber may be lower, higher or equivalent to the ambient pressure.

The compressed air may flow into the chamber from the ports on bottom plate 764 (such as through port 760) and flow out of the chamber from the ports on top plate 754 (such as through port 750), or vice versa. As shown in FIG. 44, the compressed air enters from the inlet port 760 on bottom plate 764, is evenly distributed to the space around the wafer edge, flows through the gap 774 between the top plate 754 and the wafer top surface, and then exits from outlet port 750 on top plate 754. The compressive air flows in gap 774 generate lifting forces that are responsible for the substrate release. Gap 774 is preferably less than a few millimeters and preferably in the range of 20 microns to 200 microns. The dimensions of gap 774 may be actively adjusted during the 3-D TFSS releasing process in a controlled manner for constraining the maximum deflection of the released substrate portions and for adjusting the air flows. The active gap adjustment may be achieved by hydraulic or motor driving through the extendable chamber sidewalls. The motion of the gap adjustment may be continuous, cycling or in a pulsing mode. There also may be position, distance or displacement sensors that actively detect the gap dimension and feedback to a close-loop gap control and air flow control during the release process.

Further, the air inlets and outlets on the bottom plate and top plate may be single or multiple. In the case that multiple inlets or outlets are used, they may be connected to a common pressure or vacuum source or multiple independent pressure or vacuum sources. The locations of the inlets or outlets may be placed anywhere from the plate center to edge and the use of the inlets or outlets may be programmed in a sequence to tailor the air flow in the gap. The opening sizes of the inlets and outlets are preferably much larger than the dimension of the gap, so that the flow resistances at the inlets and outlets are minimized compared to the flow resistance in the gap. There are shallow grooves on the bottom side of the top plate which are connected to independent vacuum sources so that the released substrate or template may be separated from its counterpart and vacuum chucked to the top plate. During the releasing process, the air flows in the gap are controlled in continuous or cycling modes and their flow directions may also be changed during substrate releasing in a controlled manner. The lifting forces generated from the high-speed air flows are used to initiate and extend the thin substrate releasing from its weakest interface portions to strongest interface portions in a self-aligned releasing process. The self-aligned process is achieved because given a certain air flow on the substrate surfaces, the weakest portion of the mechanically-weak layer responds to the lifting forces more than the relatively stronger attached portions in any given moment of the releasing process. And the releasing front automatically extends/propagates from the weakest portions to its surrounding regions until the thin substrate is fully released. Therefore, the releasing method of the present disclosure starts and continues from the weakest portions in the mechanically-weak layer and is thus self-aligned. During releasing, the deflection of the partially released substrate or template is constrained by the top plate so that cracking of the released portion is avoided.

Figure 45A:
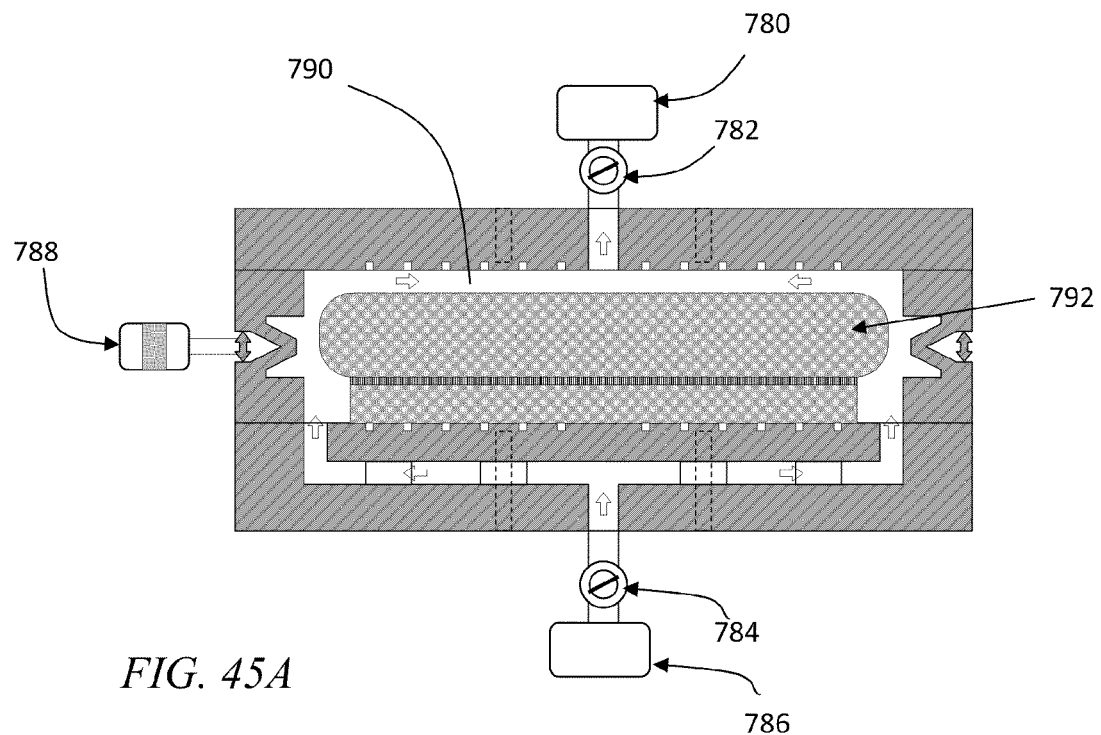
FIGS. 45A and 45B illustrate the schematic cross-sectional views of a thin film semiconductor substrate releasing apparatus.
Figure 45B:
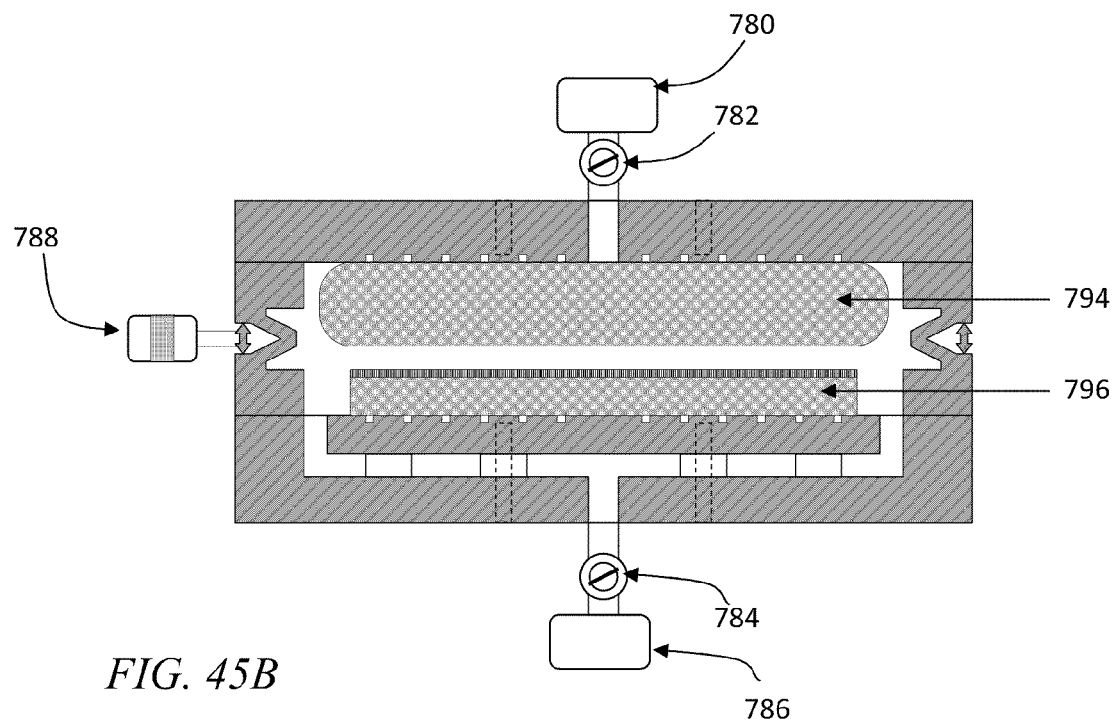

FIGS. 45A and 45B illustrate the schematic cross-sectional views of the thin film semiconductor substrate releasing apparatus shown in FIG. 44 with additional air flow and gap control units. FIG. 45A shows wafer 792 before the thin substrate has been released and FIG. 45B shows the wafer after the thin substrate has been released. As described above, there may be multiple vacuum and/or compressed air connections and control units that connected to both the top plate and the bottom plate. As an example, FIGS. 45A and 45B illustrate a single air control unit for the top plate and the bottom plate. Shown, air outlet/vacuum source 780 and control unit 782 are connected to the top plate of the releasing apparatus and air outlet/vacuum source 786 and control unit 784 are connected to the bottom plate of the releasing apparatus. In addition, there may be independent vacuum sources and control unites for the vacuum chucking control on both sides of the wafer that are not shown in FIGS. 45A and 45B. Also shown in FIGS. 45A and 45B is the gap control unit 788. The air flow control units consist of pressure sensors/gauges, vacuum sensors/gauges, on/off valves, pressure regulators, flow regulators, pressure reservoirs, vacuum reservoirs, and a program logical controller (PLC) or a computer. The air inlets/outlets may be directly connected to control valves that consist of on/off valves and flow adjustment values, such as needle valves. The valves may be manually, electrically, or pneumatically controlled. The control valves are then connected to vacuum or pressure sources with optional vacuum or pressure reservoirs. As shown in FIG. 45A, in the case that the air inlet on the bottom plate is connected to a compressed air source, the outlet on the top plate may be connected to ambient and works as a vent. In the case the air outlet on the top plate is connected to a vacuum source, the air inlet on the bottom plate is connected to ambient. And vice versa, if the top plate may be connected to an air inlet the bottom plate is then connected to an air outlet. Also, multiple air inlets and outlets may be used with common or independent vacuum or pressure sources. The vacuum connections and controls for the vacuum chucking are not shown in FIGS. 45A and 45B. The gap control may control the dimensions of gap 790 by manual distance setting by using screw setting or using motorized or pressurized actuators with close-loop gap dimension control that is synchronized with the air flow controls. Shown in FIG. 45A, the thin substrate side of wafer 792 makes contact to the bottom vacuum chuck and the reusable template side faces up.

FIG. 45B illustrates the cross-sectional schematic view of the thin-substrate releasing apparatus shown in FIG. 44 with thin-substrate 796 and template 794 separated. During the release process, the thin substrate side is fully secured on the bottom vacuum chuck of the thin-substrate releasing apparatus. With the lifting forces generated from the air flow, the fully separated template may be immediately vacuum-chucked to the bottom of the top plate. Alternatively, the released template may sit back on top of the thin substrate and be removed at a later process stage.

Figure 46A:
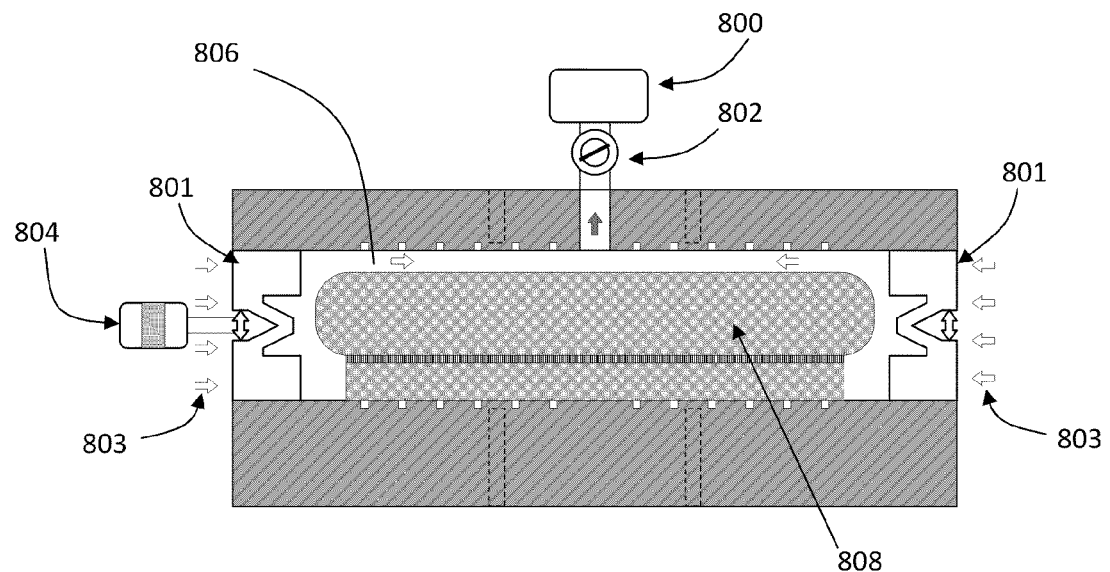
FIGS. 46A and 46B illustrate the schematic cross-sectional views of alternate thin film semiconductor substrate releasing apparatus.
Figure 46B:
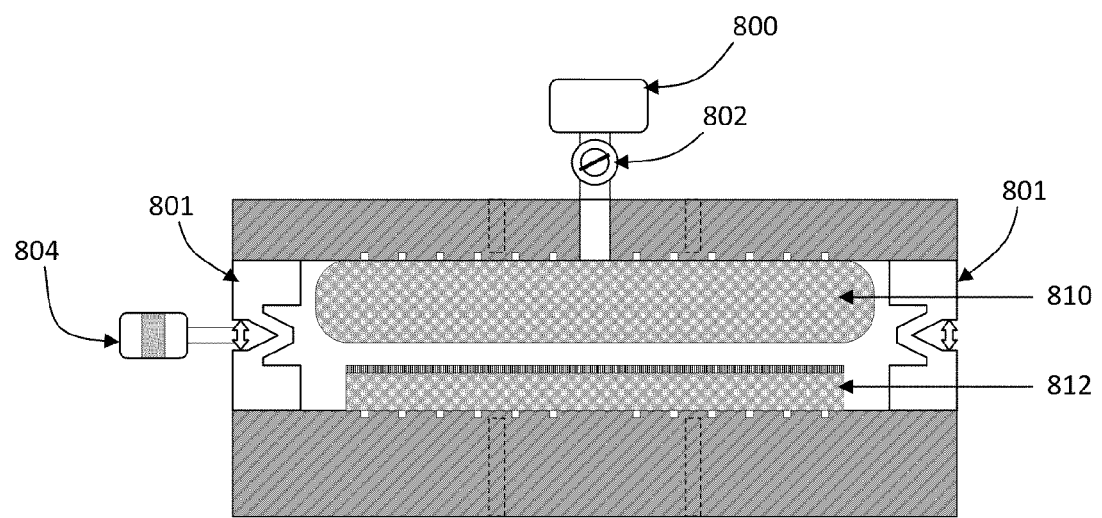

FIGS. 46A and 46B illustrate the schematic cross-sectional views of alternate thin film semiconductor substrate releasing apparatus shown in FIG. 44 with additional air flow and gap control units. FIG. 46A shows wafer 808 before the thin substrate has been released and FIG. 46B shows the wafer after the thin substrate has been released. In this embodiment, the sidewall between the top plate and bottom plate is mainly open to allow the air flows entering or exiting from the side.

As illustrated in FIG. 46A, there are side support pillar structures 801 with gap adjustment actuation mechanism 804 under the top plate instead of fully enclosed chamber sidewalls to adjust the dimensions of gap 806. Shown, air outlet/vacuum source 800 and control unit 802 are connected to the top plate of the releasing apparatus.

In FIG. 46A, the thin substrate side of wafer 808 makes contact to the bottom vacuum chuck, which is positioned on the bottom plate, and the reusable template side faces up. When the top plate is connected to a vacuum source through flow control valves, the air flow 803 enters the releasing apparatus from the side. Alternatively, a compressed air pressure source may be connected to the top plate through flow control valves, in which case the compressed air exits from the side of the apparatus. In either case, the air flows in gap 806 generate the lifting forces for the thin substrate release. The vacuum chuck connections are not illustrated in FIG. 46A. The gap control may be performed by manual distance setting by using screw setting or using motorized or pressurized actuators with close-loop gap dimension control that is synchronized with the air flow controls.

FIG. 46B illustrates the cross-sectional schematic view of the thin-substrate releasing apparatus shown in FIG. 44 with thin-substrate 812 and template 810 separated. During the release process, the thin substrate side is fully secured on the bottom vacuum chuck. With the lifting forces generated from the air flow, the fully separated template may be immediately vacuum-chucked to the bottom of the top plate. Alternatively, the released template may sit back on top of the thin substrate and removed at a later process stage.

FIG. 47 is a top schematic view of an embodiment of the bottom plate shown in the releasing apparatus of FIG. 44. The bottom plate comprises circular recessed region 828 that is enclosed by an outer rim 829 to support the chamber sidewall of the releasing apparatus. Pillar structures such as bottom vacuum chuck supporting columns 820 are machined on the recessed region. Because the pillars are used for supporting and connecting the bottom vacuum chuck, some of the pillars have screw holes for the chuck mounting, shown as screw holes 824, and some of the pillars have through hole for vacuum connections to the vacuum chuck, shown as vacuum chucking ports 826. There is one or multiple through holes machined on the Bottom Plate for serving as air inlets or outlets for the compressed air flow. As shown in FIG. 47, there is one center through hole 822. In this case, the compressed air may flow in from center through hole 822 and then spread to the outer region from the space between the bottom plate and the bottom vacuum chuck, which is defined by the heights of the pillar structures. Inside the enclosed pressure chamber, the compressed air flows out evenly from the circular ring-shape opening defined by the bottom plate and edge of the bottom vacuum chuck. In other words, a stream of uniform air flow could be evenly conducted to the wafer edge from the air inlet of the Bottom Plate. To reduce the flow resistances, center through hole 822 and the pillar heights have dimensions that are much larger than the gap between the wafer and the top plate. Further, the bottom plate may be made of metals, such as Al with anodized surfaces.

FIG. 48 is a top schematic view of an embodiment of the bottom vacuum chuck shown in the releasing apparatus of FIG. 44. The bottom vacuum chuck is mounted on the pillars on the bottom plate by screws 834. Vacuum ports 832 are through holes machined through some of the pillars on the bottom plate for providing the vacuum source. The vacuum chucking may be realized by single or multiple vacuum zones. The multiple vacuum zones are connected to independent vacuum sources. For example, FIG. 48 illustrates a four-zone vacuum chucking layout. Each vacuum zone/quadrant consists of shallow grooves, shown as reference numeral 836, that are connected to the vacuum port of the particular vacuum zone. The vacuum grooves may have a depth in the range of 0.1 to 2 mm, width in the range of 0.1 mm to 2 mm, and pitch in the range of 0.5 mm to 10 mm. The diameter of the vacuum chuck is comparable to the wafer diameter. The outer edge of the bottom vacuum chuck and the inner rim of the bottom plate form ring-shape opening 830 for conducting compressed air flow from the air inlets on the bottom plate to the wafer edge or vice versa. The ring-shape opening may have a width that is larger than 5 mm to minimize the local flow resistance. Further, the bottom vacuum chuck may be made of metals, such as aluminum with anodized surfaces. And there may be an optional surface coating, such as a thin Teflon layer, on the vacuum chuck surface to prevent the surface damage to the wafer surface.

FIG. 49 illustrates the bottom schematic view of the top plate shown in the releasing apparatus of FIG. 44. The top plate is mounted on the side supports or chamber sidewalls using mounting screws (not shown). The top plate comprises center through hole 840, shallow vacuum grooves 844, and vacuum chucking ports 842. Through hole 840 is used for compressed air inlets/outlets. Vacuum chucking ports 842 connects the shallow vacuum grooves 844 to external vacuum sources. The bottom surface of the top plate and the wafer top surface from the critical gap for generating the lifting force with the compressing air flow. It is preferred that the bottom surface of the top plate to be relatively smooth for minimizing the flow resistance and generation of small turbulence. However, shallow grooves are optionally made on the bottom side for vacuum chucking the partially or fully released thin substrate or the template. There may be an optional thin surface coating, such as a thin layer of Teflon, for prevent damage to the wafer surface. The vacuum chucking is preferred to have multiple vacuum zones with independent vacuum sources connected. As an example, FIG. 49 illustrates a four-zone vacuum chuck with each quadrant connects to its own vacuum chucking port, such as vacuum chucking port 842, and shallow vacuum grooves. A center through hole 840 for compressed air inlet or outlet is shown in FIG. 49. Alternatively, there may be multiple through holes on the top plate and each through hole connects to an independent vacuum or compressed air control so that the compressed air flow in the gap may be actively adjusted and controlled. Further, the top plate may be made of metals, such as aluminum with anodized surfaces.

Figure 50:
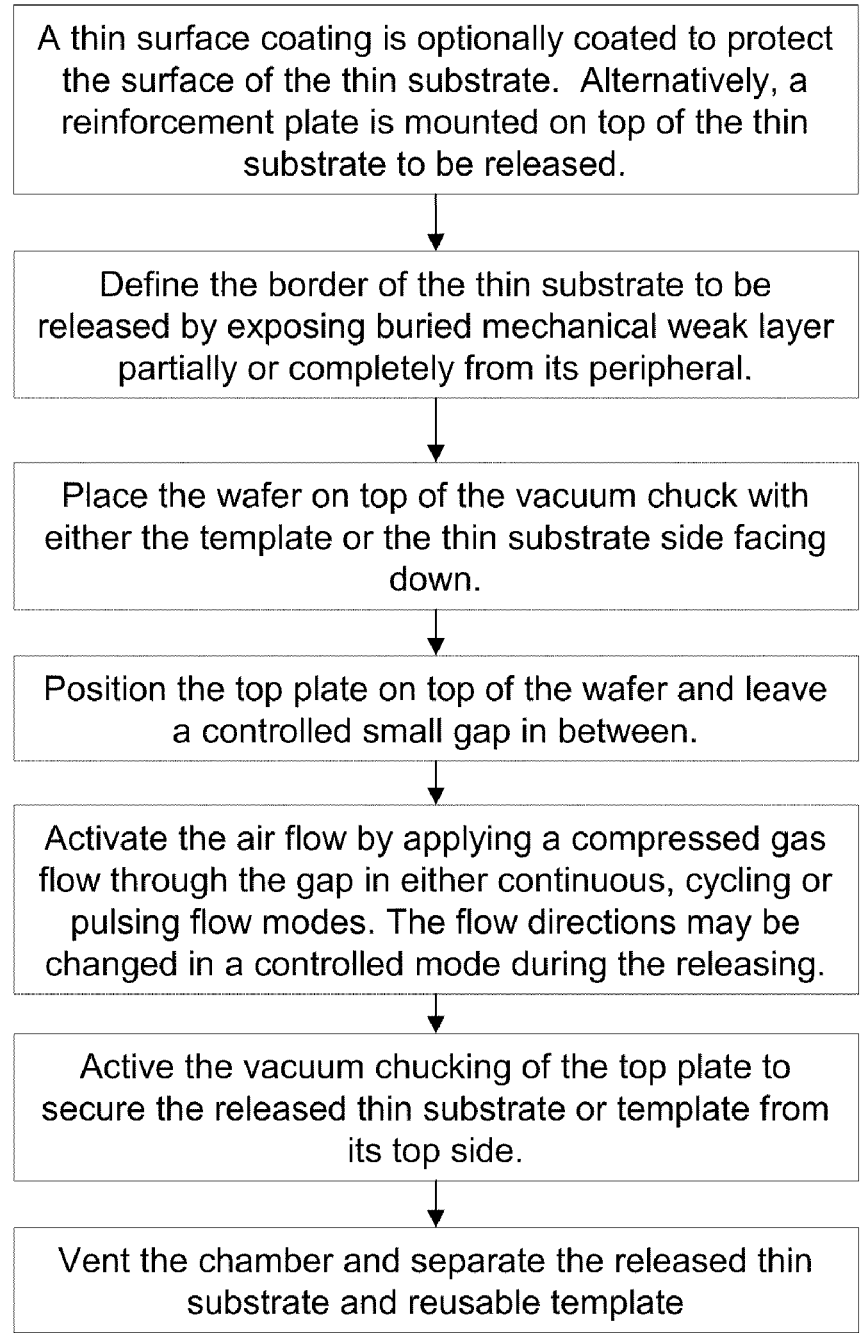

FIG. 50 is a block diagram illustrating the major steps of releasing a thin substrate from a reusable template by using the methods and apparatus of the present disclosure. The starting wafer consists of a thin substrate and a reusable template that are physically connected by a buried mechanically weak layer in between. An optional thin layer may be coated onto the surface of the thin substrate side to prevent surface damage prior to the releasing. In another optional step, a reinforcement plate or layer may be bonded, laminated or coated on the thin substrate side to prevent the cracking of the thin substrate post the releasing. The border of the thin substrate to be released is preferably defined prior to its release. Examples of border definition process include but not limited to laser trenching and wafer bevel grinding. After this step, the buried mechanical weak layer may be partially or fully exposed from its peripheral border. Then the wafer is placed and vacuum chuck to the bottom plate of the releasing apparatus. The thin substrate side may face up or down. In the case the thin substrate is thinner than 100 um or has local defects, it is preferable that the thin substrate faces down so that it may be fully secured by the bottom vacuum chuck during the releasing process. After loading the wafer, the top plate is set on top with at preset gap distance. Then the air flow is activated in the gap by applying either pressurized air or vacuum to the inlets or outlets. The air flow in the gap may be performed in continuous, cycling, or pulsing modes by active flow and time controls. In addition, the air flow direction may also be changed dynamically in a control process. Once the microstructures of the mechanically weak layer are fully cleaved, the vacuum chucking on the top plate is activated. As a result, the template and the thin substrate are completely separated and secured on the vacuum chucks. The vacuum chucking on the top plate may also be used as the release end detection. If the template is fully released, it may be immediately vacuum chucked to the top plate and which results in no or very minimum of vacuum leaking from the top plate vacuum chuck. In other words, periodically activating the top plate vacuum chuck and monitoring its vacuum leakage may be used to detect the releasing status and feedback to the release process control including the gap control and air flow controls. After the thin substrate releasing, the top plate and the bottom plate are separated and the released template and thin substrate are unloaded and moved to the downstream processing steps.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for forming a thin semiconductor substrate by releasing it from a semiconductor template through the use of a mechanically weak layer, comprising the steps of:
    forming a mechanically weak layer on a semiconductor template, said mechanically weak layer formed substantially conformal to said semiconductor template;
    forming a thin semiconductor substrate on said mechanically weak layer, said thin semiconductor substrate conformal to said mechanically weak layer, said mechanically weak layer and said template forming a wafer, said thin-film semiconductor substrate having surface features in contact with said mechanically weak layer;
    defining the border of said thin-film semiconductor substrate to be released by exposing the peripheral of said mechanically weak layer; and
    releasing said thin-film semiconductor substrate by applying a controlled air flow parallel to said mechanically weak layer wherein said controlled air flow separates said thin semiconductor substrate and said template according to lifting forces.

2. The method of claim 1, wherein said thin semiconductor substrate is a thin silicon substrate.

3. The method of claim 1, wherein said thin semiconductor substrate has a substantially planar surface.

4. The method of claim 1, wherein said thin semiconductor substrate has three dimensional surface features.

5. The method of claim 1, wherein said controlled air flow is set to flow in a continuous mode.

6. The method of claim 1, wherein said controlled air flow is set to flow in a cycling mode with periodically changing flow directions and flow rates.

7. The method of claim 1, wherein said controlled air flow is set to flow in a pulsing mode.

* * * * *